US011112598B2

(12) United States Patent
Kito et al.

(10) Patent No.: US 11,112,598 B2
(45) Date of Patent: Sep. 7, 2021

(54) PATTERN DRAWING DEVICE, PATTERN DRAWING METHOD, AND METHOD FOR MANUFACTURING DEVICE

(71) Applicant: NIKON CORPORATION, Tokyo (JP)

(72) Inventors: Yoshiaki Kito, Kamakura (JP); Masakazu Hori, Tokyo (JP); Yosuke Hayashida, Kawasaki (JP); Masaki Kato, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 273 days.

(21) Appl. No.: 16/090,545

(22) PCT Filed: Mar. 28, 2017

(86) PCT No.: PCT/JP2017/012584
§ 371 (c)(1),
(2) Date: Oct. 1, 2018

(87) PCT Pub. No.: WO2017/170514
PCT Pub. Date: Oct. 5, 2017

(65) Prior Publication Data
US 2019/0113741 A1   Apr. 18, 2019

(30) Foreign Application Priority Data
Mar. 30, 2016 (JP) .............................. JP2016-067452

(51) Int. Cl.
*G02B 26/08* (2006.01)
*G02B 26/12* (2006.01)
(Continued)

(52) U.S. Cl.
CPC .......... *G02B 26/121* (2013.01); *G02B 26/10* (2013.01); *G03F 7/20* (2013.01); *G03F 7/70791* (2013.01);
(Continued)

(58) Field of Classification Search
CPC ......... G02B 26/121; G02B 26/10; G03F 7/20; G03F 7/70791; G03F 9/7084;
(Continued)

(56) References Cited

U.S. PATENT DOCUMENTS

2007/0285635 A1\* 12/2007 Yonekawa ............. G03B 27/52
355/30
2009/0170014 A1\*  7/2009 Shibazaki ............... G03F 7/201
430/5
2015/0241778 A1\*  8/2015 Kato .................... G03F 7/70641
355/67

FOREIGN PATENT DOCUMENTS

JP        S61-263222 A      11/1986
JP        H05-208523 A      8/1993
(Continued)

OTHER PUBLICATIONS

Jan. 7, 2020 Extended Search Report issued in European Patent Application No. 17775051.0.
(Continued)

*Primary Examiner* — Euncha P Cherry
(74) *Attorney, Agent, or Firm* — Oliff PLC

(57) ABSTRACT

An exposure device that draws a pattern on a substrate by shining a beam from a light source device on substrate and scanning the beam in a main scanning direction while varying the intensity of beam according to pattern information, including: a scanning unit having a beam scanning unit that includes a polygonal mirror whereby the beam is oriented to scan the beam, and light detector for photoelectric detection of reflected light generated when beam is shined on substrate; an electro-optical element for controlling the beam's intensity modulation according to pattern information such that at least part of second pattern to be newly drawn is drawn on top of at least part of first pattern formed on substrate; and a measurement unit measuring
(Continued)

relative positional relationship between the first and second pattern on the basis of a detection signal output by the detector while second pattern is drawn on substrate.

28 Claims, 32 Drawing Sheets

(51) Int. Cl.
  *G03F 7/20* (2006.01)
  *G02B 26/10* (2006.01)
  *H05K 3/00* (2006.01)
  *G03F 9/00* (2006.01)
  *G03G 15/043* (2006.01)

(52) U.S. Cl.
  CPC ......... *G03F 9/7084* (2013.01); *G03G 15/043* (2013.01); *H05K 3/00* (2013.01)

(58) Field of Classification Search
  CPC .............. G03F 7/2004; G03F 7/70275; G03F 7/70566; G03F 7/70575; G03F 7/70775; G03F 9/7003; H05K 3/00; G03G 15/043
  USPC ...................................................... 359/196.1
  See application file for complete search history.

(56) References Cited

FOREIGN PATENT DOCUMENTS

| | | |
|---|---|---|
| JP | H09-306814 A | 11/1997 |
| JP | 2006-98727 A | 4/2006 |
| JP | 2010-91990 A | 4/2010 |
| JP | 2014-081452 A | 5/2014 |
| WO | 2006/036018 A1 | 4/2006 |
| WO | 2013/146184 A1 | 10/2013 |
| WO | 2014/034161 A1 | 3/2014 |
| WO | 2015/152217 A1 | 10/2015 |
| WO | 2015/152218 A1 | 10/2015 |
| WO | 2015/166910 A1 | 11/2015 |

OTHER PUBLICATIONS

Dec. 23, 2019 International Search Report issued in Chinese Patent Application No. 201780022186.2.
Dec. 23, 2019 Office Action and Search Report issued in Chinese Patent Application No. 201780022186.2.
Jun. 20, 2017 Written Opinion issued in International Patent Application PCT/JP2017/012584.
Jun. 20, 2017 International Search Report issued in International Patent Application PCT/JP2017/012584.
Oct. 2, 2018 International Preliminary Report on Patentability issued in International Patent Application PCT/JP2017/012584.
Dec. 1, 2020 Office Action issued in Chinese Application No. 201910096369.X.
Dec. 30, 2020 Office Action issued in Taiwanese Patent Application No. 106110235.
May 6, 2021 Office Action issued in Korean Patent Application No. 10-2018-7031358.
Jun. 1, 2021 Office Action issued in Japanese Patent Application No. 2020-126959.

* cited by examiner

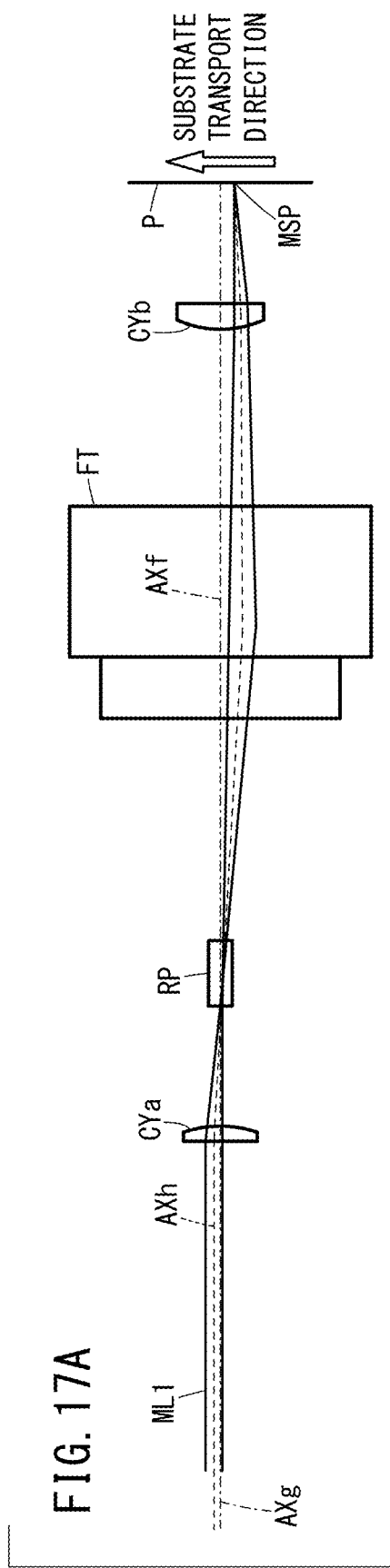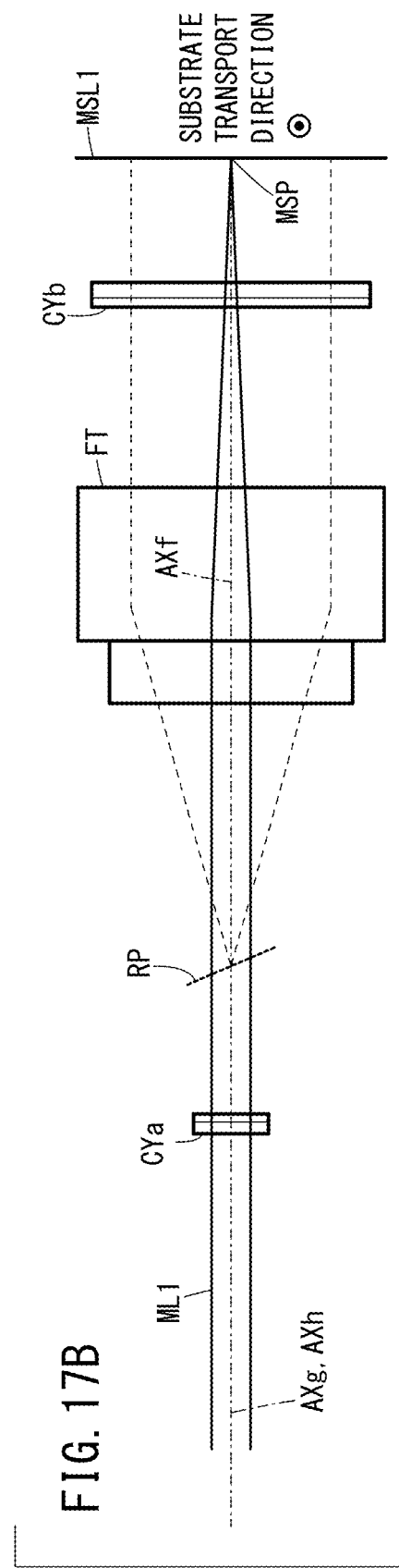

PATTERN DRAWING DEVICE, PATTERN DRAWING METHOD, AND METHOD FOR MANUFACTURING DEVICE

TECHNICAL FIELD

The present invention relates to a pattern drawing apparatus and a pattern drawing method for drawing a pattern on a substrate, as well as to a device manufacturing method for manufacturing an electronic device using this pattern drawing method.

BACKGROUND ART

In a conventional manufacturing process for manufacturing a semiconductor device, a display device, a wiring substrate, a sensor element, or the like, a mask exposure apparatus, pattern generator apparatus (a maskless exposure apparatus such as a drawing apparatus), or the like serving as a photolithography apparatus is used to form a fine pattern. These exposure apparatus that is used must have higher resolution, higher alignment accuracy, and higher overlap accuracy as the fineness of the apparatus or the fineness of the wiring increases. On the other hand, in recent years, attempts have been made to improve the implementation density of components within the final product and to make the final product thinner, lighter weight, and less expensive, by forming various electronic elements and wires on a flexible substrate. Therefore, in an apparatus for exposing a pattern such as wiring or electrode pads with high accuracy on a flexible substrate made of a resin material or the like such as plastic, it is necessary to restrict the positioning error (overlap error) caused by significant expansion/contraction and deformation (distortion) of the flexible substrate to be within an allowable range. As such an exposure apparatus, Japanese Laid-Open Patent Publication No. 2006-098727 discloses a maskless exposure apparatus (drawing apparatus) including an exposure head unit that spatially modulates a multibeam emitted from a light source, based on a modulation signal generated from image data, and radiates this multibeam onto a long belt-shaped recording medium (flexible print wiring substrate).

In the exposure apparatus of Japanese Laid-Open Patent Publication No. 2006-098727, in a state where a predetermined tension is applied to the flexible print wiring substrate, the positions of marks formed on the flexible print wiring substrate (e.g. marks formed at each of four locations around a unit exposure region) are detected by a camera or the like of a detection unit while the flexible print wiring substrate is being transported at a predetermined transportation speed in the longitudinal direction. Then, the expansion/contraction state (expansion/contraction coefficient) of the flexible print wiring substrate (unit exposure region) is measured based on the detected positions of the marks, and based on this, data processing is performed to deform the drawing pattern designated by the image data, and the pattern is then drawn and exposed using the exposure head unit.

An exposure apparatus such as shown in Japanese Laid-Open Patent Publication No. 2006-098727 can deform the pattern to be drawn itself with a high degree of freedom, in accordance with the deformation caused by expansion/contraction and the like of the flexible print substrate, and can therefore realize high alignment accuracy and overlap accuracy. However, when one apparatus (exposure unit region) to be exposed on the flexible print wiring substrate has a large surface area and the dimensions (line width and the like) of the pattern to be drawn are fine, there are cases where it is difficult to estimate the state of deformation occurring inside the exposure unit region with high accuracy just by detecting the positions of the marks formed around the exposure unit region, and the alignment accuracy and overlay accuracy are locally worsened within the exposure unit region.

SUMMARY OF INVENTION

A first aspect of the present invention is a pattern drawing apparatus that draws a pattern on a substrate, by projecting a beam from a light source apparatus onto the substrate and scanning in a main scanning direction while performing intensity modulation of the beam according to pattern information, the pattern drawing apparatus comprising a drawing unit including a beam scanning section that has a deflecting member that deflects the beam from the light source apparatus to scan with the beam in the main scanning direction, and a reflected light detecting section that photoelectrically detects, via the deflecting member of the beam scanning section, reflected light emitted when the beam is projected onto the substrate; a beam intensity modulating section configured to control the intensity modulation of the beam according to the pattern information, such that at least a portion of a second pattern to be newly drawn is drawn overlapping with at least a portion of a first pattern formed in advance of a specified material on the substrate; and a measuring section that, while the second pattern is being drawn on the substrate, measures a relative positional relationship between the first pattern and the second pattern, based on a detection signal output from the reflected light detecting section.

A second aspect of the present invention is a pattern drawing method for drawing a pattern on a substrate, by projecting a beam from a light source apparatus onto the substrate and scanning in a main scanning direction while performing intensity modulation of the beam according to pattern information, the pattern drawing method comprising the steps of: deflecting the beam from the light source apparatus to scan with the beam in the main scanning direction; projecting the deflected beam onto the substrate in a telecentric state; intensity-modulating the beam according to the pattern information, such that at least a portion of a second pattern to be newly drawn is drawn overlapping with at least a portion of a first pattern formed in advance of a specified material on the substrate; photoelectrically detecting reflected light of the beam projected onto the substrate; and while the second pattern is being drawn on the substrate, measuring a relative positional relationship between the first pattern and the second pattern, based on a photoelectrically detected detection signal.

A third aspect of the present invention is a device manufacturing method for manufacturing an electronic device by drawing a pattern on a substrate, by projecting a beam from a light source apparatus onto the substrate and scanning in a main scanning direction while performing intensity modulation of the beam according to pattern information, the device manufacturing method comprising deflecting the beam from the light source apparatus to scan with the beam in the main scanning direction; projecting the deflected beam onto the substrate in a telecentric state; intensity-modulating the beam according to the pattern information, such that at least a portion of a second pattern to be newly drawn is drawn overlapping with at least a portion of a first pattern formed in advance of a specified material on the substrate; and while the second pattern is being drawn on the substrate, measuring at least one of position information of the first pattern, shape information, and information of a relative positional relationship between the first pattern and the second pattern, based on a detection signal obtained by photoelectrically detecting reflected light of the beam projected onto the substrate.

A fourth aspect of the present invention is a pattern drawing apparatus that draws a pattern on a substrate, by projecting a beam from a first light source apparatus onto the substrate and performing relative scanning while performing intensity modulation of the beam according to pattern information, the pattern drawing apparatus comprising a second light source apparatus that emits measurement light having a wavelength differing from that of the beam from the first light source apparatus; a drawing unit including a beam scanning section that has a deflecting member that deflects the beam and the measurement light to scan the substrate with the beam and the measurement light, and a reflected light detecting section that photoelectrically detects, via the deflecting member of the beam scanning section, reflected light emitted when the measurement light is projected onto the substrate; and a measuring section that measures information relating to at least one of a position and a shape on the substrate of a first pattern formed in advance of a specified material on the substrate, based on a detection signal output from the reflected light detecting section.

A fifth aspect of the present invention is a pattern drawing method for drawing a pattern on a substrate, by projecting a beam from a first light source apparatus onto the substrate and performing relative scanning while performing intensity modulation of the beam according to pattern information, the pattern drawing method comprising the steps of: deflecting the beam and measurement light having a wavelength differing from that of the beam, to relatively scan the substrate with the beam and the measurement light; projecting the deflected beam and measurement light onto the substrate in a telecentric state; photoelectrically detecting reflected light of the measurement light projected onto the substrate; and measuring at least one of a position and a shape on the substrate of a first pattern formed in advance of a specified material on the substrate, based on a photoelectrically detected detection signal.

A sixth aspect of the present invention is a pattern drawing apparatus that draws a new pattern on a substrate by projecting onto the substrate a drawing beam intensity-modulated according to pattern information, the pattern drawing apparatus comprising a beam scanning section configured to scan the substrate with the drawing beam, using a deflecting member configured to deflect the drawing beam; a first light detecting section configured to photoelectrically detect reflected light emitted when the beam is projected in at least a portion of the first pattern formed in advance of a specified material on the substrate; a measurement beam transmission system that guides a measurement beam having a wavelength differing from that of the drawing beam to the deflecting section, such that the substrate is scanned with the measurement beam via the beam scanning section; a second light detecting section configured to photoelectrically detect reflected light emitted when the measurement beam is projected in at least a portion of the first pattern on the substrate; and a control section that controls a position of the new pattern to be drawn on the substrate by the drawing beam, based on a signal output from at least one of the first light detecting section and the second light detecting section.

BRIEF DESCRIPTION OF DRAWINGS

FIG. 17A is a schematic diagram of the measurement light from the cylindrical lens provided in front of the polygonal mirror to being projected onto the substrate P, as seen from the −Yt direction side parallel to the deflection direction (scanning direction) of the measurement light, in a case where the optical axis of the measurement light reflected by the dichroic mirror shown in FIG. 14 is made eccentric in parallel relative to the optical axis of the beam transparently passed by the dichroic mirror; and FIG. 17B is a schematic diagram of the measurement light from the cylindrical lens provided at the effort of the polygonal mirror to being projected onto the substrate, as seen from a direction side orthogonal to the plane parallel to the deflection direction (scanning direction) of the measurement light, in a case where the optical axis of the measurement light reflected by the dichroic mirror shown in FIG. 14 is made eccentric in parallel relative to the optical axis of the beam transparently passed by the dichroic mirror;

DESCRIPTION OF EMBODIMENTS

The following is a detailed description of a pattern drawing apparatus, pattern drawing method, and device manufacturing method according to embodiments of the present invention, using preferred embodiments as examples and referencing the accompanying drawings. However, aspects of the present invention are not limited to these embodiments, and various alterations and improvements can be added. The configurational elements described below include elements substantially identical to elements that can be easily conceived of by someone with normal skill in the art, and the configurational elements described below can be combined as desired. Furthermore, the configurational elements can be omitted, replaced, or altered in a variety of ways without deviating from the scope of the present invention.

First Embodiment

Figure 1:
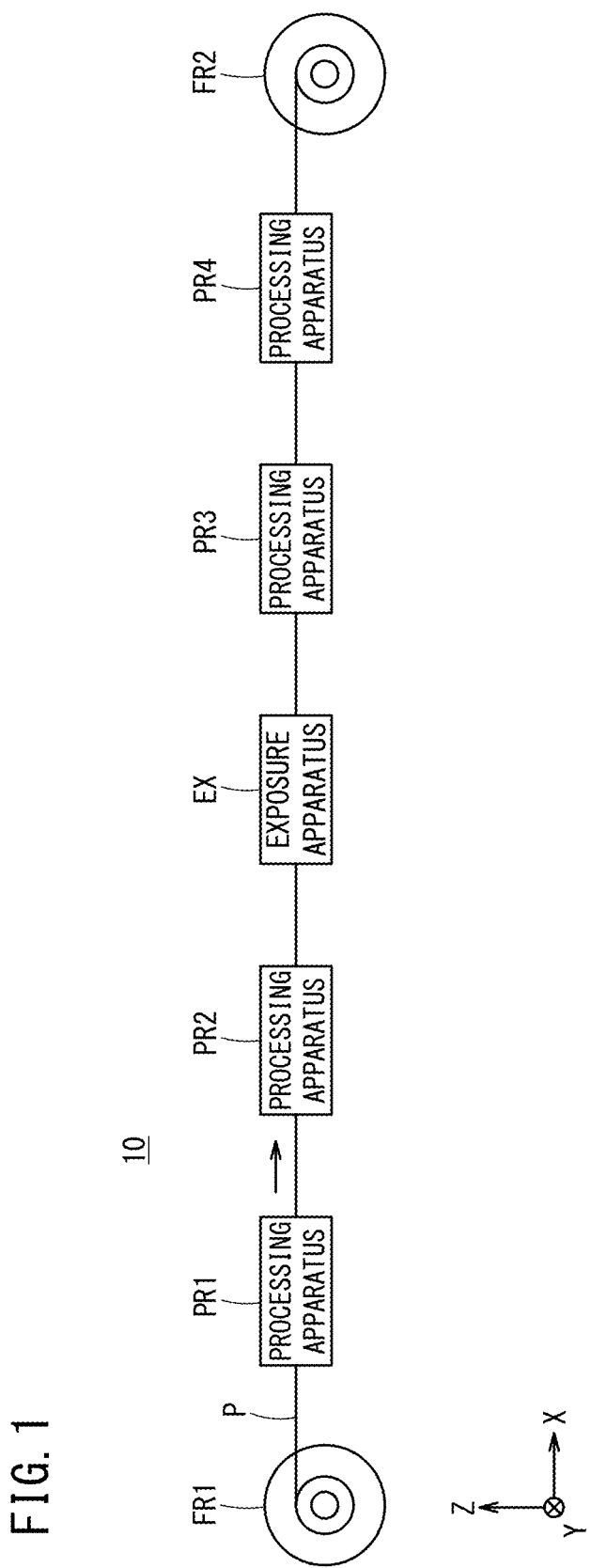
FIG. 1 is a diagram showing a schematic configuration of a device manufacturing system including an exposure apparatus that performs an exposure process on a substrate according to a first embodiment.

FIG. 1 is a diagram showing a schematic configuration of a device manufacturing system 10 including an exposure apparatus EX that performs an exposure process on a substrate (object to be irradiated) P according to a first embodiment. In the following description, unless explicitly stated otherwise, an XYZ orthogonal coordinate system is set with the direction of gravity being the Z direction, and the X direction, Y direction, and Z direction are described according to the arrow symbols shown in the drawings.

The device manufacturing system 10 is a system (substrate processing device) that manufactures an electronic device by applying a predetermined process (an exposure process or the like) to a substrate P. The device manufacturing system 10 is a manufacturing system in which is constructed a manufacturing line for manufacturing a flexible display, a film-shaped touch panel, a film-shaped color filter for a liquid crystal display panel, flexible wiring, a flexible sensor, or the like as the electronic device, for example. In the following description, the electronic device is assumed to be a flexible display. The flexible display can be an organic EL display, a liquid crystal display, or the like, for example. The device manufacturing system 10 has the structure of a so-called roll-to-roll system, in which a substrate (sheet substrate) shaped as a flexible sheet is transported from a supply roll FR1 around which the substrate P is rolled, various process are performed continuously on the transported substrate P, and then the substrate P that has undergone the various processes is wound on a recovery roll FR2. The substrate P has a belt shape in which the movement direction (transport direction) of the substrate P is the longitudinal direction (long dimension) and the width direction is the transverse direction (short dimension). In the present first embodiment, an example is shown in which the film-shaped substrate P passes through at least a processing device (first processing device) PR1, a processing device (second processing device) PR2, an exposure apparatus (third processing device) EX, a processing device (fourth processing device) PR3, and a processing device (fifth processing device) PR4 to be wound on the recovery roll FR2.

In the present first embodiment, the X direction is a direction in which the substrate P heads toward the recovery roll FR2 from the supply roll FR1 in a horizontal plane orthogonal to the Z direction. The Y direction is a direction that is orthogonal to the X direction in the horizontal plane orthogonal to the Z direction, and is the width direction (short dimension direction) of the substrate P. With the −Z direction being the direction in which gravity acts (the gravity direction), the transport direction of the substrate P is the +X direction.

A resin film, foil made of a metal such as stainless steel or a metal alloy, or the like, for example, is used as the substrate P. A substance including at least one or more of polyethylene resin, polypropylene resin, polyester resin, ethylene vinyl copolymer resin, polyvinyl chloride resin, cellulose resin, polyamide resin, polyimide resin, polycarbonate resin, polystyrene resin, and vinyl acetate resin, for example, may be used as the material of the resin film. Furthermore, the thickness and stiffness (Young's modulus)

of the substrate P only need to be in a range whereby irreversible creases and folds due to buckling do not occur when the substrate P passes through the transport path of the device manufacturing system 10. A film of PET (polyethylene terephthalate), PEN (polyethylene naphthalate), or the like with a thickness of approximately 10 μm to 200 μm is a typical example of a suitable sheet substrate for serving as the base material of the substrate P.

Since there are cases where the substrate P is heated in each of the various processes applied by the processing device PR1, the processing device PR2, the exposure apparatus EX, the processing device PR3, and the processing device PR4, a substrate P made of a material whose thermal expansion coefficient is not particularly large is preferably selected. For example, it is possible to restrict the thermal expansion coefficient by mixing an inorganic filler into a resin film. The inorganic filler may be titanium oxide, zinc oxide, alumina, silicon oxide, or the like, for example. Furthermore, the substrate P may be a single layer substrate of ultrathin glass with a thickness of approximately 100 μm manufactured using a float method or the like, or may be a layered body obtained by affixing the resin films, foil, and the like described above on this ultrathin glass.

It should be noted that the flexibility of the substrate P refers to the property of the substrate P being able to flex without cracking or breaking when a force approximately equal to its own weight is applied to the substrate P. Furthermore, the property of bending due to a force approximately equal to its own weight is also included in the term "flexibility". Yet further, the degree of flexibility changes according to the material, size, and thickness, of the substrate P, the layered structure formed on the substrate P, environmental factors such as temperature or humidity, and the like. Whichever the case, the substrate P can be said to be in the range of flexibility as long as it can be smoothly transported without experiencing buckling, creasing, or breaking (tears or cracks) when the substrate P is correctly wound on the members for changing the transport direction such as the various transport rollers and rotating drums provided in the transport path inside the device manufacturing system 10 according to the present first embodiment.

The processing device PR1 is a coating apparatus that performs a coating process on the substrate P while transporting the substrate P, which has been transported from the supply roller FR1, in the transport direction (+X direction) along the long dimension direction at a predetermined speed toward the processing device PR2. The processing device PR1 selectively or uniformly coats the surface of the substrate P with a photosensitive functional liquid. The substrate P whose surface has been coated with this photosensitive functional liquid is transported toward the processing device PR2.

The processing device PR2 is a drying apparatus that performs a drying process on the substrate P while transporting the substrate P, which has been transported from the processing device PR1, in the transport direction (+X direction) at a predetermined speed toward the exposure apparatus EX. The processing device PR2 removes the solvent or water included in the photosensitive functional liquid using a blower that blows drying air (heated air) such as hot wind or dry air onto the surface of the substrate P, an infrared light source, a ceramic heater, or the like, and dries the photosensitive functional liquid. In this way, a film that becomes a photosensitive functional layer (photosensitive layer) is formed selectively or uniformly on the surface of the substrate P. It should be noted that the photosensitive functional layer may be formed on the surface of the substrate P by affixing a dry film to the surface of the substrate P. In this case, it is only necessary to provide an affixing apparatus (processing device) that affixes the dry film to the substrate P, instead of the processing device PR1 and the processing device PR2.

Here, the object typifying this photosensitive functional liquid (layer) is a photoresist (in the form of a liquid or dry film), but there are materials for which a development process is unnecessary, such as a photosensitive silane coupling agent (SAM: Self-Assembled Monolayer) in which the lyophilic and lyophobic properties of the portion irradiated with ultraviolet rays is modified or a photosensitive reducing agent in which the plating reducing group is revealed in a portion irradiated with ultraviolet rays. If a photosensitive silane coupling agent is used as the photosensitive functional liquid (layer), the pattern portion that has been exposed to the ultraviolet rays on the substrate P is modified from being lyophobic to being lyophilic. Therefore, by selectively coating the portion that has become lyophilic with a liquid or the like containing conductive ink (ink containing conductive nanoparticles such as silver or copper) or a semiconductive material, it is possible to form a pattern layer that becomes an electrode forming a thin film transistor (TFT) or the like, a semiconductor, an insulator, connection wiring, or the like. If a photosensitive reducing agent is used as the photosensitive functional liquid (layer), the plating reducing group is revealed in the pattern portion that is exposed to the ultraviolet rays on the substrate P. Therefore, after the exposure, by immediately immersing the substrate P for a certain time in an electroless plating liquid including palladium ions or the like, a pattern layer made of palladium is formed (precipitated). Such a plating process is an additive process, but instead, an etching process may be assumed as a subtractive process. In this case, the substrate P transported to the exposure apparatus EX may be an object formed by, with the base material being PET or PEN, depositing a metal thin film of aluminum (Al), copper (Cu), or the like either selectively on the surface or on the entire surface, and then layering a photoresist layer thereon. In the present first embodiment, a photosensitive reducing agent is used as the photosensitive functional liquid (layer).

The exposure apparatus EX is a processing device that performs an exposure process on the substrate P while transporting the substrate P, which has been transported from the processing device PR2, in the transport direction (+X direction) at a predetermined speed toward the processing device PR3. The exposure apparatus EX irradiates the surface of the substrate P (the surface of the photosensitive functional layer, i.e. the photosensitive surface) with a light pattern corresponding to a pattern for an electronic device (e.g. a pattern of electrodes, wiring, or the like of a TFT forming an electronic device). In this way, a latent image (modified portion) corresponding to the pattern is formed on the photosensitive functional layer.

In the present first embodiment, the exposure apparatus EX is a direct-drawing exposure apparatus that does not use a mask, i.e. a so-called raster scan exposure apparatus (pattern drawing apparatus). As explained in detail further below, the exposure apparatus EX performs high-speed modulation (turning ON/OFF) of the intensity of the spot light SP according to the pattern data (drawing data, pattern information) while performing one-dimensional scanning (main scanning) with the spot light of the pulsed beam LB (pulse beam) used for exposure in a predetermined scanning direction (Y direction) on the surface to be irradiated (photosensitive surface) of the substrate P, as the substrate P is transported in the +X direction (sub scanning direction). In this way, a light pattern corresponding to a predetermined pattern of an electronic device, a circuit, wiring, or the like is drawn and exposed on the surface to be irradiated of the substrate P. In other words, with the sub scanning of the substrate P and the main scanning of the spot light SP, the surface to be irradiated (surface of the photosensitive functional layer) of the substrate P is scanned with the spot light SP relatively in two dimensions, and the predetermined pattern is drawn and exposed on the surface to be irradiated of the substrate P. Furthermore, since the substrate P is transported along the transport direction (+X direction), a plurality of exposure regions W in which the pattern is exposed by the exposure apparatus EX are provided with predetermined intervals therebetween along the longitudinal dimension direction of the substrate P (see FIG. 4). Electronic devices are formed in these exposure regions W, and therefore the exposure regions W are also device formation regions.

The processing device PR3 is a wet processing device that performs a wet process on the substrate P while transporting the substrate P, which has been transported from the exposure apparatus EX, in the transport direction (+X direction) at a predetermined speed toward the processing device PR4. In the present first embodiment, the processing device PR3 performs a plating process, which is one type of wet process, on the substrate P. In other words, the substrate P is immersed for a predetermined time in a plating liquid stored in a processing tank. In this way, a pattern layer corresponding to the latent image is precipitated (formed) on the surface of the photosensitive functional layer. In other words, a predetermined material (e.g. palladium) is selectively formed on the substrate P according to the difference between the spot light SP irradiated portion and the spot light SP non-irradiated portion on the photosensitive functional layer of the substrate P, and this material becomes the pattern layer.

If a photosensitive silane coupling agent is used as the photosensitive functional layer, the plating process or coating process with the liquid (e.g. a liquid containing conductive ink or the like) that is one type of wet process is performed by the processing device PR3. In this case as well, the pattern layer corresponding to the latent image is formed on the surface of the photosensitive functional layer. In other words, a predetermined material (e.g. conductive ink, palladium, or the like) is selectively formed on the substrate P according to the difference between the spot light SP irradiated portion and the spot light SP non-irradiated portion on the photosensitive functional layer of the substrate P, and this material becomes the pattern layer. Furthermore, if a photoresist is adopted as the photosensitive functional layer, a development process, which is one type of wet process, is performed by the processing device PR3. In this case, as a result of this development process, the pattern corresponding to the latent image is formed on the photosensitive functional layer (photoresist).

The processing device PR4 is a washing and drying apparatus that performs a washing and drying process on the substrate P while transporting the substrate P, which has been transported from the processing device PR3, in the transport direction (+X direction) at a predetermined speed toward the recovery roll FR2. The processing device PR4 performs washing with pure water on the substrate P on which the wet process has been performed, and then, at a temperature less than or equal to the glass transition temperature, performs drying until the water content of the substrate P is less than or equal to a predetermined value.

If a photosensitive silane coupling agent is used as the photosensitive functional layer, the processing device PR4 may be an annealing and drying apparatus that performs an annealing process and a drying process on the substrate P. The annealing process includes irradiating the substrate P with high-luminance pulsed light from a strobe lamp, for example, in order to strengthen the electrical bonding between nanoparticles contained in the conductive ink coating the substrate P. If a photoresist is adopted as the photosensitive functional layer, a processing device (wet processing device) PR5 that performs an etching process and a processing device (washing and drying apparatus) PR6 that performs a washing and drying process on the substrate P that has undergone the etching process may be provided between the processing device PR4 and the recovery roll FR2. In this way, if a photoresist is adopted as the photosensitive functional layer, the pattern layer is formed on the substrate P by having the etching process performed thereon. In other words, a predetermined material (e.g. aluminum (Al), copper (Cu), or the like) is selectively formed on the substrate P according to the difference between the spot light SP irradiated portion and the spot light SP non-irradiated portion of the photosensitive functional layer of the substrate P, and this material becomes the pattern layer. The processing devices PR5 and PR6 each have a function to transport the substrate P that is transported thereto toward the recovery roll FR2 in the transport direction (+X direction) at a predetermined speed. The transport mechanism that transports the substrate P of the plurality of processing device PR1 to PR4 (including the processing devices P5 and P6 as needed) and the exposure apparatus EX in the +X direction functions as a substrate transport apparatus of the device manufacturing system 10.

In this way, the substrate P that has undergone each process is recovered by the recovery roll FR2. One pattern layer is formed on the substrate P by passing through at least each process of the device manufacturing system 10. If an electronic device is formed by overlapping a plurality of pattern layers, the substrate P must be passed through each process of the device manufacturing system 10 such as shown in FIG. 1 at least two times in order to generate the electronic device. Therefore, it is possible to stack pattern layers by attaching the recovery roll FR2 on which the substrate P is wound to another device manufacturing system 10 as the supply roll FR1. Such an operation is repeated to form an electronic device. The substrate P that has been processed is in a state where a plurality of electronic devices are in series along the long dimension direction of the substrate P with predetermined intervals therebetween. In other words, the substrate P is a substrate for multi-chamfering.

The recovery roll FR2 on which the substrate P having the electronic devices formed in series thereon is wound may be attached to a dicing apparatus, which is not shown. The dicing apparatus to which the recovery roll FR2 is attached forms a plurality of single-leaf electronic devices by dividing (dicing) the processed substrate P at each electronic device (each exposure region W that is a device formation region). The dimensions of the substrate P are, for example, approximately 10 cm to 2 m in the width direction (short dimension direction) and greater than or equal to 10 m in the length direction (long dimension direction). The dimensions of the substrate P are not limited to these dimensions.

Figure 2:
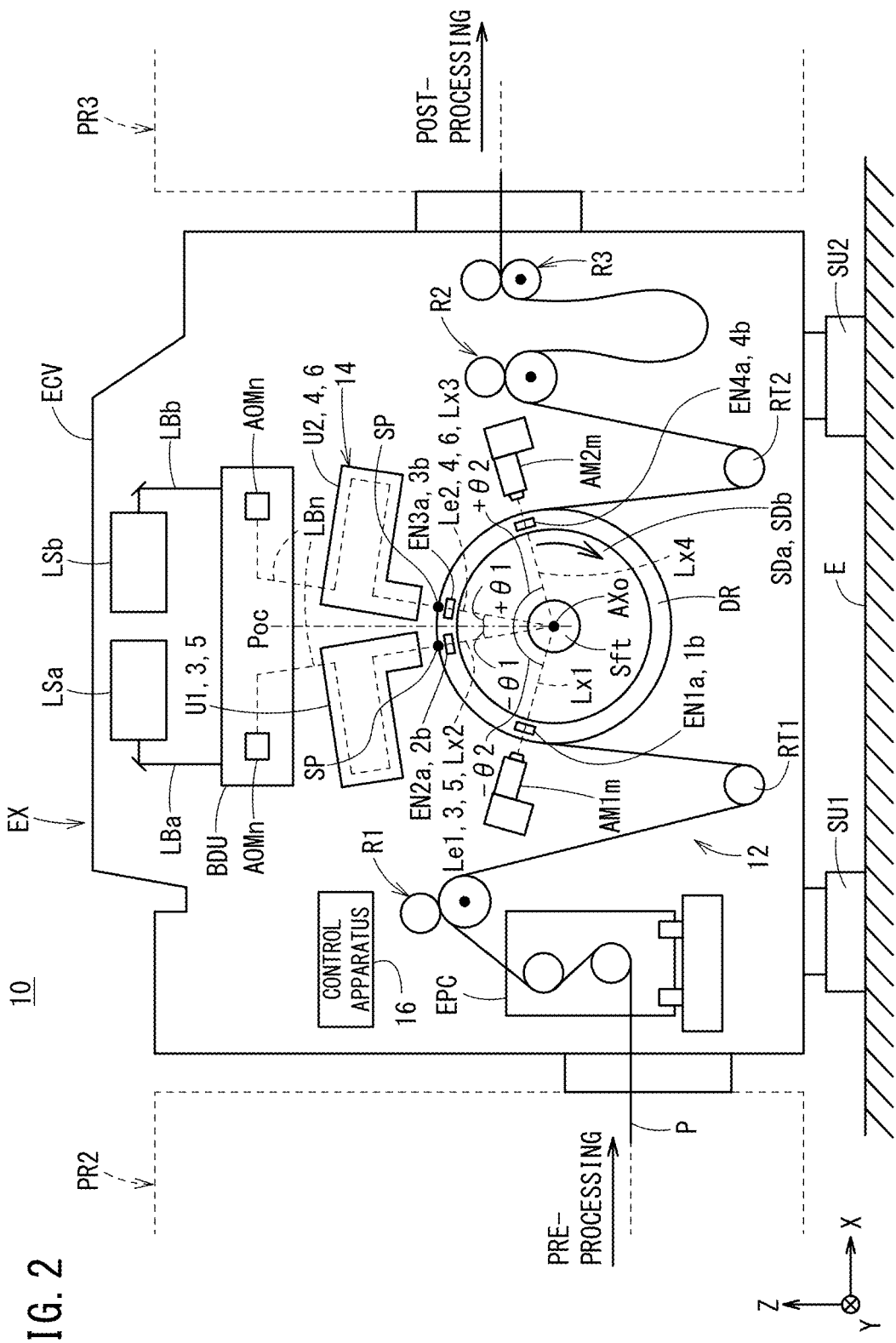
FIG. 2 is a configurational diagram showing the configuration of the exposure apparatus.

FIG. 2 is a configurational diagram showing the configuration of the exposure apparatus EX. The exposure apparatus EX is housed inside a temperature control chamber ECV. This temperature control chamber ECV suppresses shape change caused by temperature of the substrate P transported therein and also suppresses hygroscopicity of the substrate P and electrostatic charge or the like generated along with the transport of the substrate P, by keeping the inside of the temperature control chamber ECV at a predetermined temperature and a predetermined humidity. The temperature control chamber ECV is arranged on an installation surface E of a manufacturing factory via passive or active anti-shaking units SU1 and SU2. The anti-shaking units SU1 and SU2 reduce the vibrations from the installation surface E. This installation surface E may be the actual floor surface of the factory, or may be a surface on an installation foundation (pedestal) specially installed on the floor surface to realize a horizontal surface. The exposure apparatus EX includes at least a substrate transport mechanism 12, two light source apparatuses LS (LSa and LSb) having identical configurations, a beam switching unit BDU, an exposure head 14, a control apparatus 16, a plurality of alignment microscopes AM1$m$ and AM2$m$ (m=1, 2, 3, 4), and a plurality of encoder heads ENja and ENjb (j=1, 2, 3, 4). The control apparatus (control section) 16 is a component for controlling each section of the exposure apparatus EX. This control apparatus 16 includes a computer, a recording medium with a program recorded thereon, and the like, and functions as the control apparatus 16 of the present first embodiment by having this computer execute the program.

The substrate transport mechanism 12 is a component forming a portion of the substrate transport apparatus of the device manufacturing system 10, and after transporting the substrate P, which has been transported from the processing device PR2, in the inside of the exposure apparatus EX at a predetermined speed, sends the substrate P out to the processing device PR3 at a predetermined speed. The substrate transport mechanism 12 includes, in order from the upstream side (−X direction side) in the transport direction of the substrate P, an edge position controller EPC, a drive roller R1, a tension adjustment roller RT1, a rotating drum (cylindrical drum) DR, a tension adjustment roller RT2, a drive roller R2, and a drive roller R3. The transport path of the substrate P transported within the exposure apparatus EX is defined by the substrate P being passed through the edge position controller EPC of the substrate transport mechanism 12, the drive rollers R1 to R3, the tension adjustment rollers RT1 and RT2, and the rotating drum (cylindrical drum) DR.

The edge position controller EPC adjusts the position of the substrate transported from the processing device PR2 in the width direction (the Y direction, which is the short dimension direction of the substrate P). In other words, the edge position controller EPC adjusts the position of the substrate P in the width direction by moving the substrate P in the width direction such that the position of an edge portion (edge) in the width direction of the substrate P, being transported in a state where a predetermined tension is applied thereto, is within a range (allowable range) of approximately ±ten micrometers to tens of micrometers relative to the target position. The edge position controller EPC includes a roller to which the substrate P in a state where a predetermined tension is applied thereto is overlaid, and an edge sensor (edge portion detecting section), not shown in the drawings, that detects the position of an edge portion (edge) of the substrate P in the width direction. The edge position controller EPC moves the roller described above of the edge position controller EPC in the Y direction to adjust the position of the substrate P in the width direction, based on a detection signal detected by the edge sensor described above. The drive roller (nip roller) R1 rotates while holding both the back and front surfaces of the substrate P transported from the edge position controller EPC, and transports the substrate P toward the rotating drum DR. The edge position controller EPC suitably adjusts the position of the substrate P in the width direction such that the long dimension direction of the substrate P wound on the rotating drum DR is always orthogonal to the central axis AXo of the rotating drum DR, and may also suitably adjust the degree of parallelism between the rotational axis of the roller described above of the edge position controller EPC and the Y axis such that the inclination error in the progression direction of the substrate P is corrected.

The rotating drum DR has a central axis AXo extending both in the Y direction and a direction intersecting the direction in which gravity acts, and a cylindrical outer circumferential surface with a constant radius from the central axis AXo. The rotating drum DR rotates centered on the central axis AXo to transport the substrate P in the +X direction, while bending and supporting (holding) a portion of the substrate P along this outer circumferential surface (circular circumferential surface) to have a cylindrical surface shape in the long dimension direction. The rotating drum DR supports the region (portion) of the substrate P onto which the beam LB (spot light SP) is projected from the exposure head 14, with the outer circumferential surface thereof. The rotating drum DR supports (tightly holds) the substrate P from the surface thereof (back surface) opposite the surface on which the electronic device is formed (the surface of the side where the photosensitive surface is formed). Both sides of the rotating drum DR in the Y direction are provided with a shaft Sft supported by ring-shaped bearings such that the rotating drum DR rotates on the central axis AXo. The rotating drum DR rotates with a constant rotational speed on the central axis AXo, as a result of the rotational torque from a rotational drive source (e.g. a motor, a deceleration mechanism, or the like), not shown in the drawings, controlled by the control apparatus 16 being applied to the shaft Sft. For convenience, a plane parallel to the YZ plane and including the central axis AXo is referred to as the central plane Poc.

The drive rollers (nip rollers) R2 and R3 are arranged along the transport direction (+X direction) of the substrate P, with a predetermined interval therebetween, and provide a predetermined slackness (looseness) to the substrate P that has undergone exposure. In a similar manner as the drive roller R1, the drive rollers R2 and R3 rotate while holding both the front and back surfaces of the substrate P to transport the substrate P toward the processing device PR3. The tension adjustment rollers RT1 and RT2 are biased in the −Z direction, and apply a predetermined tension in the long dimension direction to the substrate P wound on and supported by the rotating drum DR. In this way, the tension in the long dimension direction applied to the substrate P on the rotating drum DR is stabilized to be within a predetermined range. The control apparatus 16 causes the drive rollers R1 to R3 to rotate by controlling a rotational drive force (e.g. a motor, deceleration mechanism, or the like) not shown in the drawings. The rotational axes of the drive rollers R1 to R3 and the rotational axes of the tension adjustment rollers RT1 and RT2 are parallel to the central axis AXo of the rotating drum DR.

The light source apparatuses LS (LSa and LSb) generate and emit pulsed beams (pulse beams, pulsed light, lasers). These beams LB are ultraviolet light with a peak wavelength in a wavelength band less than or equal to 370 nm, and the emission light frequency (oscillation frequency, predetermined frequency) is Fa. The beams LB emitted by the light source apparatuses LS (LSa and LSb) are incident to the exposure head 14 via the beam switching unit BDU. The light source apparatuses LS (LSa and LSb) generate and emit beams LB with a light emission frequency Fa, under the control of the control apparatus 16. The configurations of these light source apparatuses LS (LSa and LSb) are described in detail further below, but in the present first embodiment, the light source apparatuses LS (LSa and LSb) are each formed by a semiconductor laser element that emits pulsed light in the infrared wavelength region, a fiber amplifier, a wavelength converting element (harmonic generating element) that converts the amplified pulsed light in the infrared wavelength region into pulsed light in the ultraviolet wavelength region, and a fiber amplifier laser light source (harmonic laser light source) that is capable of ensuring that the oscillation frequency Fa is approximately hundreds of megahertz and obtaining ultraviolet pulsed light with a high luminance in which the light emission time of one light pulse is on the order of picoseconds is used in these light source apparatuses LS (LSa and LSb). In order to differentiate between the beam LB from the light source apparatus LSa and the beam LB from the light source apparatus LSb, the beam LB from the light source apparatus LSa is sometimes referred to as LBa and the beam LB from the light source apparatus LSb is sometimes referred to as LBb.

The beam switching unit BDU causes the beams LB (LBa and LBb) from the two light source apparatuses LS (LSa and LSb) to be incident to two scanning units Un among the plurality of scanning units Un (n=1, 2, . . . , 6) forming the exposure head 14, and also switches the scanning units Un to which the beams LB (LBa and LBb) are incident. Specifically, the beam switching unit BDU causes the beam LBa from the light source apparatus LSa to be incident to one scanning unit Un among the three scanning units U1 to U3, and causes the beam LBb from the light source apparatus LSb to be incident to one scanning unit Un among the three scanning units U4 to U6. Furthermore, the beam switching unit BDU switches the scanning unit Un to which the beam LBa is incident among the scanning units U1 to U3, and switches the scanning unit Un to which the beam LBb is incident among the scanning units U4 to U6. There are cases where the beam (LBa, LBb) from a light source apparatus LS (LSa, LSb) incident to a scanning unit Un via the beam switching unit BDU is expressed as LBn. Furthermore, there are cases where the beam LBn incident to the scanning unit U1 is expressed as LB1 and, similarly, the beams LBn incident to the scanning units U2 to U6 are expressed as LB2 to LB6.

The beam switching unit BDU switches the scanning unit Un to which the beam LBn is incident, such that the beam LBn is incident to the scanning unit Un that performs scanning with the spot light SP. In other words, the beam switching unit BDU causes the beam LBn (LBa) from the light source apparatus LSa to be incident to the one scanning unit Un performing the scanning with the spot light SP, among the scanning units U1 to U3. Similarly, the beam switching unit BDU causes the beam LBn (LBb) from the light source apparatus LSb to be incident to the one scanning unit Un performing the scanning with the spot light SP, among the scanning units U4 to U6. This beam switching unit BDU is described in detail further below. Concerning the scanning units U1 to U3, the scanning unit Un that performs the scanning with the spot light SP, i.e. the scanning unit Un to which the beam LBn is incident, is switched in the order of U1→U2→U3. Furthermore, concerning the scanning units U4 to U6, the scanning unit Un that performs the scanning with the spot light SP, i.e. the scanning unit Un to which the beam LBn is incident, is switched in the order of U4→U5→U6.

The configuration of the pattern drawing apparatus obtained by combining the light source apparatuses LS (LSa and LSb) and beam switching unit BDU such as described above is disclosed in International Publication 2015/166910, for example.

The exposure head 14 is a so-called multibeam type of exposure head, in which a plurality of scanning units Un (U1 to U6) having identical configurations are arrayed. The exposure head 14 draws a pattern using the plurality of scanning units Un (U1 to U6), on a portion of the substrate P supported by the outer circumferential surface (circular circumferential surface) of the rotating drum DR. The plurality of scanning units Un (U1 to U6) are arranged with a predetermined arrangement relationship. The plurality of scanning units Un (U1 to U6) are arranged in a staggered arrangement in two rows in the transport direction of the substrate P, sandwiching the central plane Poc. The odd-numbered scanning units U1, U3, and U5 are arranged in one row on the upstream side (−X direction side) in the transport direction of the substrate P, relative to the central plane Poc, and are separated by predetermined intervals along the Y direction. The even-numbered scanning units U2, U4, and U6 are arranged in one row on the downstream side (+X direction side) in the transport direction of the substrate P, relative to the central plane Poc, and are separated by predetermined intervals along the Y direction. The odd-numbered scanning units U1, U3, and U5 and the even-numbered scanning units U2, U4, and U6 are provided symmetrically relative to the central plane Poc, as seen from the XZ plane.

Each scanning unit Un (U1 to U6) performs one-dimensional scanning with the spot light SP using a rotating polygon mirror PM (see FIG. 5), while projecting the beam LBn from the light source apparatus LS (LSa, LSb) in a manner to converge into the spot light SP on the surface to be irradiated of the substrate P. The surface to be irradiated of the substrate P is one-dimensionally scanned with the spot light SP, by the polygon mirror PM of each of these scanning units Un (U1 to U6). As a result of the scanning with these spot lights SP, linear drawing lines (scan lines) SLn (n=1, 2, . . . , 6), which each draw one line portion of the pattern, are defined. In other words, the drawing lines SLn indicate scanning trajectories of the spot light SP of the beams LBn on the substrate P. The configuration of these scanning units Un is described in detail further below.

Figure 3:
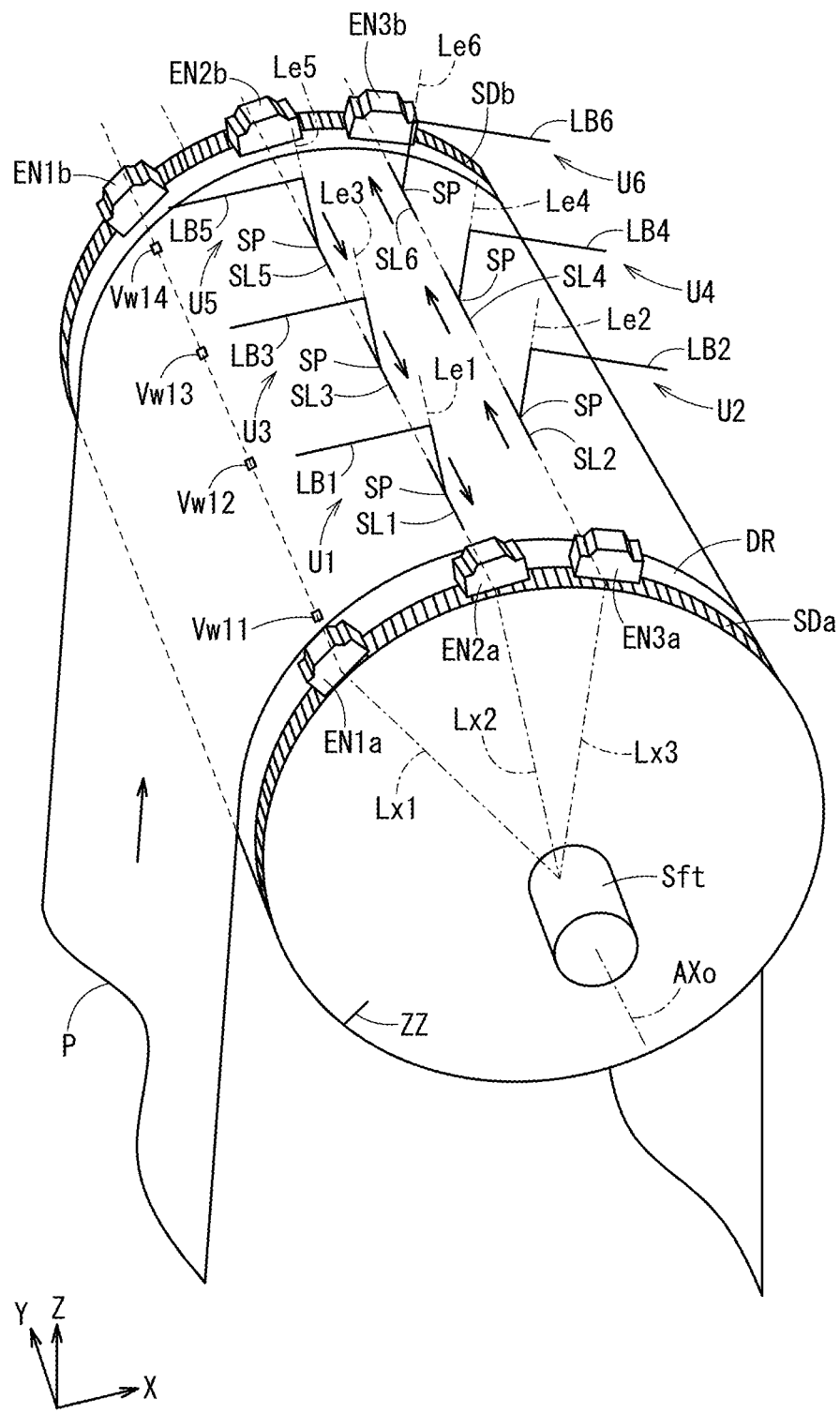
FIG. 3 is a detailed diagram showing a state in which the substrate is wound on the rotating drum shown in FIG. 2.
Figure 4:
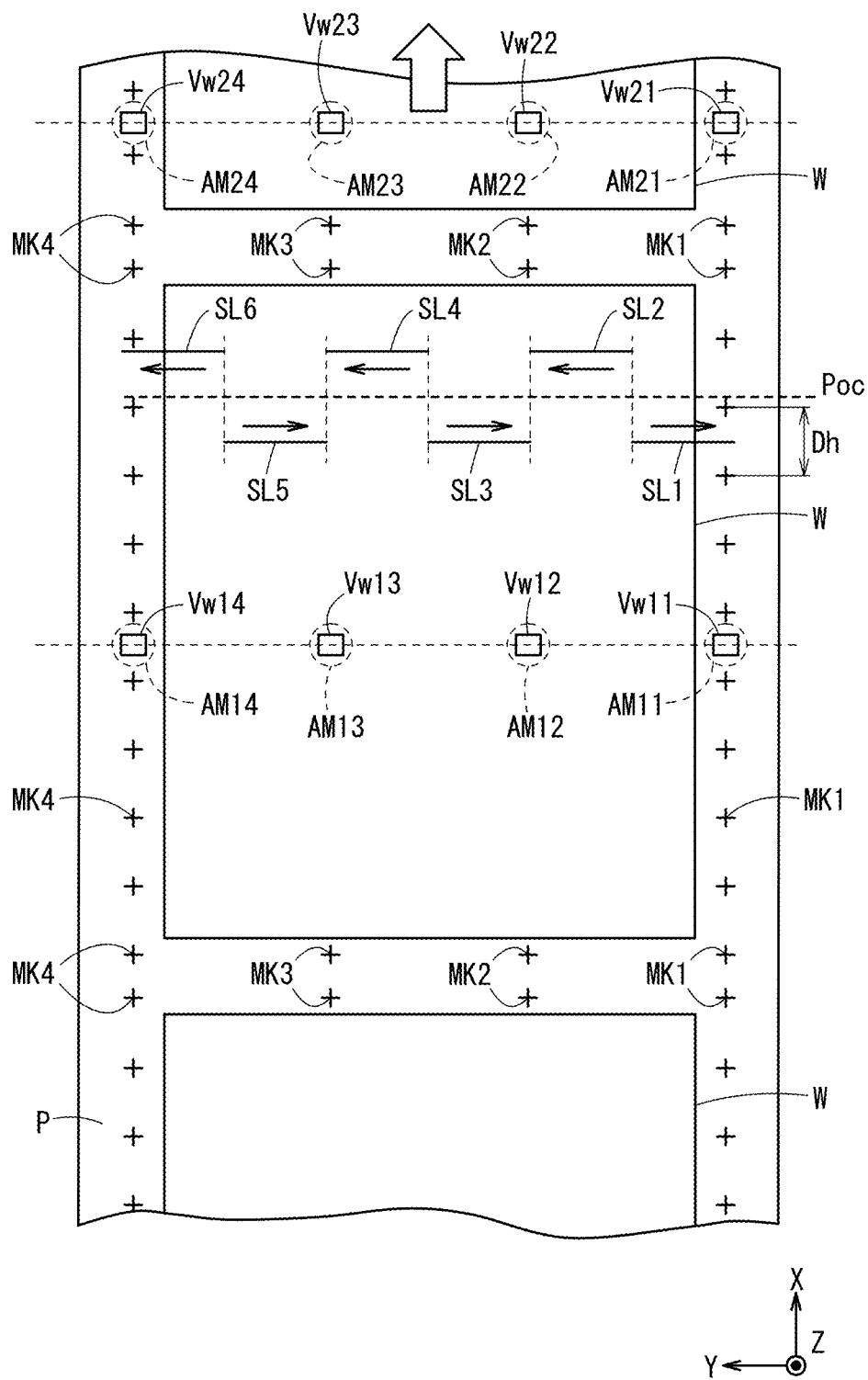
FIG. 4 is a diagram showing drawing lines of the spot light used for scanning on the substrate and marks for alignment formed on the substrate.

The scanning unit U1 scans with the spot light SP along the drawing line SL1 and, similarly, the scanning units U2 to U6 scan with the spot light SP along the drawing lines SL2 to SL6. The drawing lines SLn (SL1 to SL6) of the plurality of scanning units Un (U1 to U6) are such that, as shown in FIGS. 3 and 4, the odd-numbered drawing lines SL1, SL3, and SL5 and the even-numbered drawing lines SL2, SL4, and SL6 are distanced from each other in the X direction, but are set to be joined together without being separated from each other in the Y direction (the width direction of the substrate P, i.e. the main scanning direction). The beam LBn incident to a scanning unit Un may be a beam of linearly polarized light (P-polarized light or S-polarized light) that is polarized in a predetermined direction, and is a beam of P-polarized light in the present first embodiment.

As shown in FIG. 4, the scanning region of each scanning unit Un (U1 to U6) is divided such that the plurality of scanning units Un (U1 to U6) in total cover all of the width direction of the exposure region W. In this way, the scanning units Un (U1 to U6) can each draw a pattern for a respective region (drawing range) among the plurality of regions divided in the width direction of the substrate P. For example, by setting the scanning length (length of a drawing line SLn) in the Y direction for one scanning unit Un to be approximately 20 mm to 60 mm and arranging a total of six scanning units, including the three odd-numbered scanning units U1, U3, and U5 and the three even-numbered scanning units U2, U4, and U6, in the Y direction, the width in the Y direction in which drawing is possible increases to be approximately 120 mm to 360 mm. The length (drawing range length) of each drawing line SLn (SL1 to SL6) is the same, as a rule. In other words, the scanning distances for the spot light SP of the beams LBn scanning respectively along the drawing lines SL1 to SL6 are the same, as a rule. If there is a desire to increase the width of the exposure region W, this can be achieved by increasing the length of the drawing lines SLn themselves or by increasing the number of scanning units Un arranged in the Y direction.

Each actual drawing line SLn (SL1 to SL6) is set to be slightly shorter than the maximum length (maximum scanning length) across which the spot light SP can actually scan the surface to be irradiated. For example, when the scanning length of a drawing line SLn that can be pattern-drawn in a case where the drawing magnification in the main scanning direction (Y direction) is an initial value (no magnification correction) is 30 mm, the maximum scanning length of the spot light SP on the surface to be irradiated is set to approximately 31 mm to have a margin of approximately 0.5 mm on each of the drawing start point (scanning start point) side and the drawing end point (scanning end point) side of the drawing line SLn. By performing the setting in this manner, it is possible to finely adjust the position of the 30-mm drawing line SLn in the main scanning direction within a range of 31 mm, which is the maximum scanning length of the spot light SP, and to finely adjust the drawing magnification. The maximum scanning length of the spot light SP is not limited to being 31 mm, and is determined mainly according to the aperture diameter, focal distance, or the like of an fθ lens FT (see FIG. 5) provided behind the polygon mirror PM inside the scanning unit Un.

The plurality of drawing lines SLn (SL1 to SL6) are arranged in a staggered arrangement in two rows in the circumferential direction of the rotating drum DR, sandwiching the central plane Poc. The odd-numbered drawing lines SL1, SL3, and SL5 are positioned on the surface to be irradiated of the substrate P on the upstream side (−X direction side) in the transport direction of the substrate P, relative to the central plane Poc. The even-numbered drawing lines SL2, SL4, and SL6 are positioned on the surface to be irradiated of the substrate P on the downstream side (+X direction side) in the transport direction of the substrate P, relative to the central plane Poc. The drawing lines SL1 to SL6 are substantially parallel to the width direction of the substrate P, i.e. the central axis AXo of the rotating drum DR.

The drawing lines SL1, SL3, and SL5 are arranged in a straight line in one row, with predetermined intervals therebetween along the width direction (main scanning direction) of the substrate P. Similarly, the drawing lines SL2, SL4, and SL6 are also arranged in a straight line in one row, with predetermined intervals therebetween along the width direction (main scanning direction) of the substrate P. At this time, the drawing line SL2 is arranged between the drawing line SL1 and the drawing line SL3 in the width direction of the substrate P. Similarly, the drawing line SL3 is arranged between the drawing line SL2 and the drawing line SL4 in the width direction of the substrate P. The drawing line SL4 is arranged between the drawing line SL3 and the drawing line SL5 in the width direction of the substrate P, and the drawing line SL5 is arranged between the drawing line SL4 and the drawing line SL6 in the width direction of the substrate P.

The main scanning direction of the spot light SP of the beams LB1, LB3, and LB5 respectively scanning along the odd-numbered drawing lines SL1, SL3, and SL5 is a one-dimensional direction, and is the −Y direction. The main scanning direction of the spot light SP of the beams LB2, LB4, and LB6 respectively scanning along the even-numbered drawing lines SL2, SL4, and SL6 is a one-dimensional direction, and is the +Y direction. In this way, the end portions of the drawing lines SL1, SL3, and SL5 on the drawing start point side and the end portions of the drawing lines SL2, SL4, and SL6 on the drawing start point side are adjacent or partially overlapping in the Y direction. Furthermore, the end portions of the drawing lines SL3 and SL5 on the drawing end point side and the end portions of the drawing lines SL2 and SL4 on the drawing end point side are adjacent or partially overlapping in the Y direction. When arranging each drawing line SLn such that the end portions of drawing lines SLn that are adjacent in the Y direction partially overlap with each other, these end portions may be made to overlap in a range less than or equal to several percent of the length of each drawing line in the Y direction, including the drawing start point or drawing end point, for example. Having the drawing lines SLn being joined in the Y direction means that the end portions of drawing lines SLn are caused to be adjacent or partially overlapping in the Y direction.

In the case of the present first embodiment, the beams LB (LBa and LBb) from the light source apparatuses LS (LSa and LSb) are pulsed light, and therefore the spot light SP projected onto the drawing lines SLn between main scannings becomes discrete according to the oscillation frequency Fa (e.g. 100 MHz) of the beams LB (LBa and LBb). Therefore, the spot light SP projected by one light pulse of the beam LB and the spot light SP projected by the subsequent one light pulse must be made to overlap in the main scanning direction. The amount of this overlap is set according to the size of the spot light SP, the scanning speed (main scanning speed) of the spot light SP, and the oscillation frequency Fa of the beam LB. If the intensity distribution of the spot light SP is approximated by a Gaussian distribution, the size of the spot light SP is determined to be $1/e^2$ (or ½) of the peak intensity of the spot light SP. In the present first embodiment, the scanning speed Vs and the oscillation frequency Fa of the spot light SP are set such that the spot light SP overlaps by approximately half the size, relative to the effective size (dimensions). Accordingly, the projection interval along the main scanning direction of the spot light SP is a half size. Therefore, for the sub scanning direction (a direction orthogonal to the drawing lines SLn) as well, a setting is preferably made such that the substrate P is moved a distance of approximately ½ of the effective size of the spot light SP between one scanning with the spot light along a drawing line SLn and the subsequent scanning. Furthermore, in a case where drawing lines SL that are adjacent in the Y direction follow in the main scanning direction as well, the overlap is preferably caused to be a half size. In the present first embodiment, the size (dimensions) of the spot light SP is 3 µm.

The setting of the exposure amount for the photosensitive functional layer on the substrate P can be achieved by adjusting the peak value of the beam LB (pulsed light), but if there is a desire to increase the exposure amount in a state where the intensity of the beam LB cannot be increased, it is only necessary to increase the overlap amount of the spot light SP in the main scanning direction or the sub scanning direction, by any one of decreasing the scanning speed Vs of the spot light SP in the main scanning direction, increasing the oscillation frequency Fa of the beam LB, decreasing the transport speed Vt of the substrate P in the sub scanning direction, or the like. The scanning speed Vs of the spot light SP in the main scanning direction increases in proportion to the number of revolutions (rotational speed Vp) of the polygon mirror PM.

Each scanning unit Un (U1 to U6) radiates the respective beam LBn toward the substrate P such that the beam LBn progresses toward the central axis AXo of the rotating drum DR in at least the XZ plane. In this way, the optical path of beam LBn (central axis of the beam) progressing from each scanning unit Un (U1 to U6) toward the substrate P becomes parallel to a normal line of the surface to be irradiated of the substrate P in the XZ plane. Furthermore, each scanning unit Un (U1 to U6) radiates the beam LBn toward the substrate P such that the beam LBn irradiating the drawing line SLn (SL1 to SL6) becomes perpendicular to the surface to be irradiated of the substrate P in a plane parallel to the YZ plane. In other words, the beams LBn (LB1 to LB6) projected onto the substrate P scan in a telecentric state in the main scanning direction of the spot light SP of the surface to be irradiated. Here, lines perpendicular to the surface to be irradiated of the substrate P (also referred to as optical axes) and passing through the center points of the predetermined drawing lines SLn (SL1 to SL6) defined by the respective scanning units Un (U1 to U6) are referred to as irradiation central axes Len (Le1 to Le6).

Each irradiation central axis Len (Le1 to Le6) is a line connecting the respective drawing lines SL1 to SL6 to the central axis AXo in the XZ plane. The respective irradiation central axes Le1, Le3, and Le5 of the odd-numbered scanning units U1, U3, and U5 are oriented in the same direction as each other in the XZ plane, and respective irradiation central axes Le2, Le4, and Le6 of the even-numbered scanning units U2, U4, and U6 are oriented in the same direction as each other in the XZ plane. Furthermore, the irradiation central axes Le1, Le3, and Le5 and the irradiation central axes Le2, Le4, and Le6 are set such that the angles relative to the central surface Poc are ±θ1 (see FIG. 2) in the XZ plane.

The plurality of alignment microscopes AM1$m$ (AM11 to AM14) and AM2$m$ (AM21 to AM24) shown in FIG. 2 are components for detecting a plurality of alignment marks MKm (MK1 to MK4) formed on the substrate P shown in FIG. 4, and a plurality of these alignment microscopes (four in the present first embodiment) are provided along the Y direction. The plurality of marks MKm (MK1 to MK4) are reference marks for relatively aligning a predetermined pattern drawn on the exposure region W on the surface to be irradiated of the substrate P with the substrate P. The plurality of alignment microscopes AM1$m$ (AM11 to AM14) and AM2$m$ (AM21 to AM24) detect the plurality of marks MKm (MK1 to MK4) on the substrate P supported by the outer circumferential surface (circular circumferential surface) of the rotating drum DR. The plurality of alignment microscopes AM1$m$ (AM11 to AM14) are provided on the upstream side (−X direction side) in the transport direction of the substrate P, relative to the irradiated region (region surrounded by the drawing lines SL1 to SL6) on the substrate P resulting from the spot light SP of the beams LBn (LB1 to LB6) from the exposure head 14. Furthermore, the plurality of alignment microscopes AM2$m$ (AM21 to AM24) are provided on the downstream side (+X direction side) in the transport direction of the substrate P, relative to the irradiated region (region surrounded by the drawing lines SL1 to SL6) on the substrate P resulting from the spot light SP of the beams LBn (LB1 to LB6) from the exposure head 14.

The alignment microscopes AM1$m$ (AM11 to AM14) and AM2$m$ (AM21 to AM24) each include a light source that projects illumination light for alignment onto the substrate P, an observation optical system (including an objective lens) that acquires a magnified image of a local region (observation region) Vw1$m$ (Vw11 to Vw14) or Vw2$m$ (Vw21 to Vw24) that includes a mark MK on the surface of the substrate P, and an imaging element such as a CCD or CMOS that captures this magnified image with a high-speed shutter corresponding to the transport speed Vt of the substrate P while the substrate P moves in the transport direction. Imaging signals (image data) captured by each of the plurality of alignment microscopes AM1$m$ (AM11 to AM14) and AM2$m$ (AM21 to AM24) are sent to the control apparatus 16. A mark position detecting section 106 (see FIG. 12) of the control apparatus 16 detects the positions (mark position information) of the marks MKm (MK1 to MK4) on the substrate, by performing an image analysis on the plurality of imaging signals sent thereto. The illumination light for alignment is light with a wavelength to which the photosensitive functional layer on the substrate P has almost no sensitivity, and is light with a wavelength approximately from 500 nm to 800 nm, for example.

The plurality of marks MK1 to MK4 are provided around each exposure region W. A plurality of the marks MK1 and MK4 are formed on both sides of the exposure region in the width direction of the substrate P, at constant intervals Dh along the long dimension direction of the substrate P. The marks MK1 are formed on the −Y direction side in the width direction of the substrate P, and the marks MK4 are formed on the +Y direction side in the width direction of the substrate P. Marks MK1 and MK4 such as these are arranged to have the same positions in the long dimension direction (X direction) of the substrate P, in a state where the substrate P is not deformed due to receiving a large amount of tension or undergoing thermal processing. Furthermore, the marks MK2 and MK3 are formed between the marks MK1 and MK4, along the width direction (short dimension direction) of the substrate P in the margin between the +X direction side and the −X direction side of the exposure region W. The marks MK2 are formed on the −Y direction side in the width direction of the substrate P, and the marks MK3 are formed on the +Y direction side of the substrate P.

Furthermore, the intervals in the Y direction between the marks MK1 arranged at the end portion of the substrate P on the −Y direction side and the marks MK2 in the margin, the intervals in the Y direction between the marks MK2 and the marks MK3 in the margin, and the intervals in the Y direction between the marks MK4 arranged at the end portion of the substrate P on the +Y direction side and the marks MK3 in the margin are all set to be the same distance. These marks MKm (MK1 to MK4) may be formed together when forming the first layer of the pattern layer. For example, when exposing the pattern of the first layer, patterns for marks may be exposed together around the exposure region W in which the pattern is exposed. The marks MKm may be formed inside the exposure region W. For example, the marks MKm may be formed along the contour of the exposure region W, inside the exposure region W. Furthermore, a portion with a specified shape or a pattern portion at a predetermined position in the pattern of the electronic device formed inside the exposure region W may be used as a mark MKm.

The alignment microscopes AM11 and AM21 are arranged to capture an image of the marks present within the observation regions (detection regions) Vw11 and Vw21 using objective lenses, as shown in FIG. 4. Similarly, the alignment microscopes AM12 to AM14 and AM22 to AM24 are arranged to capture images of the marks present within the observation regions Vw12 to Vw14 and Vw22 to Vw24 using objective lenses. Accordingly, alignment microscopes AM11 to AM14 and AM21 to AM24 are provided along the width direction of the substrate P in the order of AM11 to AM14 and AM21 to AM24 from the −Y direction side of the substrate P, in correspondence with the positions of the plurality of marks MK1 to MK4. In FIG. 3, the observation regions Vw2m (Vw21 to Vw24) of the alignment microscopes AM2m (AM21 to AM24) are omitted from the drawing.

The plurality of alignment microscopes AM1m (AM11 to AM14) are arranged such that, in the X direction, the distance between an exposure position (drawing lines SL1 to SL6) and an observation region Vw1m (Vw11 to Vw14) is less than the length of the exposure region W in the X direction. Similarly, the plurality of alignment microscopes AM2m (AM21 to AM24) are arranged such that, in the X direction, the distance between an exposure position (drawing lines SL1 to SL6) and an observation region Vw2m (Vw21 to Vw24) is less than the length of the exposure region W in the X direction. The number of alignment microscopes AM1m and AM2m provided in the Y direction can be changed according to the number of marks MKm formed in the width direction of the substrate P. Furthermore, the size of each observation region Vw1m (Vw11 to Vw14) and Vw2m (Vw21 to Vw24) on the surface to be irradiated of the substrate P is set according to the alignment accuracy (position measurement accuracy) and size of the marks M, and is a size of an angle of approximately 100 μm to 500 μm square.

As shown in FIG. 3, scale sections SDa and SDb, which have graduations formed with ring shapes across the entire outer circumferential surface of the rotating drum DR in the circumferential direction, are provided at respective end portions of the rotating drum DR. These scale sections SDa and SDb are diffraction gratings with concave or convex grating lines (graduations) engraved at a constant pitch (e.g. 20 μm) in the circumferential direction of the outer circumferential surface of the rotating drum DR, and are configured as incremental scales. These scale sections SDa and SDb rotate integrally with the rotating drum DR on the central axis AXo. The encoder heads ENja and ENjb (j=1, 2, 3, 4), serving as the scale reading heads for reading the scale sections SDa and SDb, are provided in a manner to face these scale sections SDa and SDb (see FIGS. 2 and 3). In FIG. 3, the encoder heads EN4a and EN4b are omitted from the drawing.

The encoder heads ENja and ENjb are components for optically detecting the rotational angle position of the rotating drum DR. Four encoder heads ENja (EN1a, EN2a, EN3a, and EN4a) are provided facing the scale section SDa that is provided on the end portion of the rotating drum DR on the −Y direction side. Similarly, four encoder heads ENjb (EN1b, EN2b, EN3b, and EN4b) are provided facing the scale section SDb that is provided on the end portion of the rotating drum DR on the +Y direction side.

The encoder heads EN1a and EN1b are provided on the upstream side (−X direction side) of the central plane Poc in the transport direction of the substrate P, and are arranged on an installation direction line Lx1 (see FIGS. 2 and 3). The installation direction line Lx1 is a line connecting the central axis AXo and the projection positions (reading positions) of the measurement light beams of the encoder heads EN1a and EN1b projected onto the scale sections SDa and SDb in the XZ plane. Furthermore, the installation direction line Lx1 is a line connecting the central axis AXo and the observation region Vw1m (Vw11 to Vw14) of each alignment microscope AM1m (AM11 to AM14) in the XZ plane. In other words, the plurality of alignment microscopes AM1m (AM11 to AM14) are also arranged on the installation direction line Lx1.

The encoder heads EN2a and EN2b are provided on the upstream side (−X direction side) of the central plane Poc in the transport direction of the substrate P, and on the downstream side (+X direction side) of the encoder heads EN1a and EN1b in the transport direction of the substrate P. The encoder heads EN2a and EN2b are arranged on an installation direction line Lx2 (see FIGS. 2 and 3). The installation direction line Lx2 is a line connecting the central axis AXo and the projection positions (reading positions) of the measurement light beams of the encoder heads EN2a and EN2b projected onto the scale sections SDa and SDb in the XZ plane. This installation direction line Lx2 has the same angular position and overlaps with the irradiation central axes Le1, Le3, and Le5 in the XZ plane.

The encoder heads EN3a and EN3b are provided on the downstream side (+X direction side) of the central plane Poc in the transport direction of the substrate P, and are arranged on an installation direction line Lx3 (see FIGS. 2 and 3). The installation direction line Lx3 is a line connecting the central axis AXo and the projection positions (reading positions) of the measurement light beams of the encoder heads EN3a and EN3b projected onto the scale sections SDa and SDb in the XZ plane. This installation direction line Lx3 has the same angular position and overlaps with the irradiation central axes Le2, Le4, and Le6 in the XZ plane. Accordingly, the installation direction line Lx2 and the installation direction line Lx3 are set such that the angles thereof are ±θ1 relative to the central plane Poc in the XZ plane (see FIG. 2).

The encoder heads EN4a and EN4b are provided on the downstream side (+X direction side) of the encoder heads EN3a and EN3b in the transport direction of the substrate P, and are arranged on an installation direction line Lx4 (see FIG. 2). The installation direction line Lx4 is a line connecting the central axis AXo and the projection positions (reading positions) of the measurement light beams of the encoder heads EN4a and EN4b projected onto the scale sections SDa and SDb in the XZ plane. Furthermore, the installation direction line Lx4 is a line connecting the central axis AXo and the observation region Vw2m (Vw21 to Vw24) of each alignment microscope AM2m (AM21 to AM24) in the XZ plane. In other words, the plurality of alignment microscopes AM2m (AM21 to AM24) are also arranged on the installation direction line Lx4. The installation direction line Lx1 and the installation direction line Lx4 are set such that the angles thereof are ±θ2 relative to the central plane Poc in the XZ plane (see FIG. 2).

Each encoder head ENja (EN1a to EN4a) and ENjb (EN1b to EN4b) outputs a pulsed detection signal (a two-phase digital signal having a phase difference of ¼ of a period) to the control apparatus 16, by projecting a light beam for measurement toward the scale section SDa or SDb and photoelectrically detecting the resulting reflected light flux (diffracted light). A rotational position detecting section 108 (see FIG. 12) of the control apparatus 16 measures the rotational angle position and the angle change of the rotating drum DR with a sub-micron resolution, by counting count pulses generated by an interpolation processing of this detection signal (two-phase digital signal). The transport speed Vt of the substrate P can also be measured from the angle change of this rotating drum DR. The rotational position detecting section 108 separately counts the detection signal from each encoder head ENja (EN1a to EN4a) and ENjb (EN1b to EN4b).

The configuration of the pattern drawing apparatus in which is loaded the encoder heads ENja (EN1a to EN4a) and ENjb (EN1b to EN4b) such as described above is disclosed in International Publication 2013/146184, for example.

The rotational position detecting section 108 includes a plurality of counter circuits CNja (CN1a to CN4a) and CNjb (CN1b to CN4b). The counter circuit CN1a counts the pulses generated from the detection signal (two-phase digital signal) from the encoder head EN1a, and the counter circuit CN1b counts the pulses generated from the detection signal (two-phase digital signal) from the encoder head EN1b. Similarly, the counter circuits CN2a to CN4a and CN2b to CN4b count the pulses generated from the detection signals (two-phase digital signals) from the encoder heads EN2a to EN4a and EN2b to EN4b. Each counter circuit CNja (CN1a to CN4a) and CNjb (CN1b to CN4b), upon detecting an origin point mark (origin point pattern) ZZ shown in FIG. 3 formed by the respective encoder head ENja (EN1a to EN4a) or ENjb (EN1b to EN4b) on a portion of the scale sections SDa and SDb in the circumferential direction, resets a count value corresponding to the encoder head ENja or ENjb that detected the origin point mark ZZ to be zero.

Any one of the count values of these counter circuits CN1a and CN1b, or the average value of these count values, is used as the rotational angle position of the rotating drum DR on the installation direction line Lx1, and any one of the count values of these counter circuits CN2a and CN2b, or the average value of these count values, is used as the rotational angle position of the rotating drum DR on the installation direction line Lx2. Similarly, any one of the count values of these counter circuits CN3a and CN3b, or the average value of these count values, is used as the rotational angle position of the rotating drum DR on the installation direction line Lx3, and any one of the count values of these counter circuits CN4a and CN4b, or the average value of these count values, is used as the rotational angle position of the rotating drum DR on the installation direction line Lx4. As a rule, the count values of the counter circuits CN1a and CN1b are the same, except in a case where the rotating drum DR is rotating eccentrically relative to the central axis AXo due to a manufacturing error or the like of the rotating drum DR. Similarly, the count values of the counter circuits CN2a and CN2b are also the same, as are the count values of the counter circuits CN3a and CN3b and also the count values of the counter circuits CN4a and CN4b.

As described above, the alignment microscopes AM1m (AM11 to AM14) and the encoder heads EN1a and EN1b are arranged on the installation direction line Lx1, and the alignment microscopes AM2m (AM21 to AM24) and the encoder heads EN4a and EN4b are arranged on the installation direction line Lx4. Accordingly, the position of the substrate P on the installation direction line Lx1 can be measured with high accuracy, based on the position detection of the marks MKm (MK1 to MK4) resulting from the image analysis of the mark position detecting section 106 performed on the plurality of imaging signals captured by the plurality of alignment microscopes AM1m (AM11 to AM14) and on the information (count values based on the encoder heads EN1a and EN1b) of the rotational angle position of the rotating drum DR at the moment of image capturing by the alignment microscopes AM1m. Similarly, the position of the substrate P on the installation direction line Lx4 can be measured with high accuracy, based on the position detection of the marks MKm (MK1 to MK4) resulting from the image analysis of the mark position detecting section 106 performed on the plurality of imaging signals captured by the plurality of alignment microscopes AM2m (AM21 to AM24) and on the information (count values based on the encoder heads EN4a and EN4b) of the rotational angle position of the rotating drum DR at the moment of image capturing by the alignment microscopes AM2m.

Furthermore, the counter values based on the detection signals from the encoder heads EN1a and EN1b, the counter values based on the detection signals from the encoder heads EN2a and EN2b, the counter values based on the detection signals from the encoder heads EN3a and EN3b, and the counter values based on the detection signals from the encoder heads EN4a and EN4b are reset to zero at the moment when a respective encoder head ENja or ENjb detects the origin point mark ZZ. Therefore, in a case where the position of the substrate P, wound on the rotating drum DR, on the installation direction line Lx1 is a first position at the time when the count values based on the encoder heads EN1a and EN1b are a first value (e.g. 100), when the substrate P is transported such that the first position thereon reaches a position (position of a drawing line SL1, SL3, or SL5) on the installation direction line Lx2, the count values based on the encoder heads EN2a and EN2b become the first value (e.g. 100). Similarly, when the substrate P is transported such that the first position thereon reaches a position (position of a drawing line SL2, SL4, or SL6) on the installation direction line Lx3, the count values based on the detection signals from the encoder heads EN3a and EN3b become the first value (e.g. 100). Also similarly, when the substrate P is transported such that the first position thereon reaches a position on the installation direction line Lx4, the count values based on the detection signals from the encoder heads EN4a and EN4b become the first value (e.g. 100).

It should be noted that the substrate P is wound farther inward than the scale sections SDa and SDb at the ends of the rotating drum DR. In FIG. 2, the radius from the central axis AXo of the outer circumferential surfaces of the scale sections SDa and SDb is set to be less than the radius from the central axis AXo of the outer circumferential surface of the rotating drum DR. However, as shown in FIG. 3, the outer circumferential surfaces of the scale sections SDa and SDb may be set to be in the same plane as the outer circumferential surface of the substrate P wound on the rotating drum DR. In other words, the radius (distance) from the central axis AXo of the outer circumferential surfaces of the scale sections SDa and SDb and the radius (distance) from the central axis AXo of the outer circumferential surface (surface to be irradiated) of the substrate P wound on the rotating drum DR may be set to be the same as each other. In this way, each encoder head ENja (EN1a to EN4a) and ENjb (EN1b to EN4b) can detect the scale section SDa or SDb at a position in the radial section that is the same position as the surface to be irradiated of the substrate P wound on the rotating drum DR. Accordingly, it is possible to reduce the Abbe error occurring due to the difference, in the radial direction of the rotating drum DR, between the processing position (drawing lines SL1 to SL6) and the measurement positions of the encoder heads ENja and ENjb.

However, the thickness of the substrate P serving as the body to be irradiated differs greatly by tens of micrometers to hundreds of micrometers, and therefore it is difficult to always make the radius of the outer circumferential surfaces of the scale sections SDa and SDb and the radius of the outer circumferential surface of the substrate P wound on the rotating drum DR the same. Therefore, in the case of the scale sections SDa and SDb shown in FIG. 3, the radius of these outer circumferential surfaces (scale surfaces) is set to match the radius of the outer circumferential surface of the rotating drum DR. Furthermore, it is possible to form the scale sections SDa and SDb using separate disks, and to attach these disks (scale disks) coaxially to the shaft Sft of the rotating drum DR. In this case as well, the radius of the outer circumferential surfaces (scale surfaces) of the scale disks and the radius of the outer circumferential surface of the rotating drum DR should be set such that the Abbe error is within an allowable value range.

The control apparatus 16 determines the start position of the drawing exposure of the exposure region W in the long dimension direction (X direction) of the substrate P, based on the positions on the substrate P of the marks MKm (MK1 to MK4) detected by the alignment microscopes AM1$m$ (AM11 to AM14) and on the count value (the count value of any one of the counter circuits CN1$a$ and CN1$b$ or an average value of these count values) that is based on the encoder heads EN1$a$ and EN1$b$. Since the length of the exposure region W in the X direction is already known, the control apparatus 16 determines a mark MKm (MK1 to MK4) as the start position of the drawing exposure every time a mark MKm (MK1 to MK4) is detected a predetermined number of times. In a case where the count values based on the encoder heads EN1$a$ and EN1$b$ at the time when the exposure start position is determined are set to the first value (e.g. 100), when the count values based on the encoder heads EN2$a$ and EN2$b$ reach the first value (e.g. 100), the start position of the drawing exposure of the exposure region W in the long dimension direction of the substrate P is positioned on the drawing lines SL1, SL3, and SL5. Accordingly, the scanning units U1, U3, and U5 can start scanning with the spot light SP, based on the count values of the encoder heads EN2$a$ and EN2$b$. Furthermore, when the count values based on the encoder heads EN3$a$ and EN3$b$ reach the first value (e.g. 100), the start position of the drawing exposure of the exposure region W in the long dimension direction of the substrate P is positioned on the drawing lines SL2, SL4, and SL6. Accordingly, the scanning units U2, U4, and U6 can start scanning with the spot light SP, based on the count values of the encoder heads EN3$a$ and EN3$b$.

Usually, the substrate P is transported together with the rotation of the rotating drum DR while being firmly attached to the rotating drum DR, by having the tension adjustment rollers RT1 and RT2 apply a predetermined tension in the long dimension direction to the substrate P. However, there is a possibility of a phenomenon (micro-slipping), by which the substrate P that is supposed to be in close contact with the outer circumferential surface of the rotating drum DR slips slightly in the long dimension direction, occurring due to reasons such as the rotation speed Vp of the rotating drum DR being too high or the tension applied to the substrate P by the tension adjustment rollers RT1 and RT2 being temporarily too low or too high. In a state where the substrate P does not slip relative to the rotating drum DR, when the count values based on the encoder heads EN4$a$ and EN4$b$ are the same values as the count values (e.g. 150) based on the encoder heads EN1$a$ and EN1$b$ at the instant when the alignment microscope AM1$m$ imaged the mark MKmA (a certain mark MKm), this mark MKmA is detected by the alignment microscope AM2$m$.

However, in a case where the substrate P slips relative to the rotating drum DR, even when the count values based on the encoder heads EN4$a$ and EN4$b$ are the same values as the count values (e.g. 150) based on the encoder heads EN1$a$ and EN1$b$ at the instant when an alignment microscope AM1$m$ imaged the mark MKmA, this mark MKmA is not detected by the alignment microscope AM2$m$. In this case, after the count values based on the encoder heads EN4$a$ and EN4$b$ have exceeded 150, for example, the mark MKmA is detected by the alignment microscope AM2$m$. Accordingly, it is possible to obtain the slipping amount of the substrate P on the rotating drum DR based on the count values based on the encoder heads EN1$a$ and EN1$b$ at the instant when the alignment microscope AM1$m$ imaged the mark MKmA and the count values based on the encoder heads EN4$a$ and EN4$b$ at the instant when the alignment microscope AM2$m$ imaged this mark MKmA. In this way, it is possible to measure the slipping amount of the substrate P by additionally installing this alignment microscopes AM2$m$ and the encoder heads EN4$a$ and EN4$b$. The alignment microscope AM1$m$ and AM2$m$, the encoder heads ENja and ENjb, the scale sections SDa and SDb, the mark position detecting section 106, and the rotational position detecting section 108 are configured as an alignment system.

Figure 5:
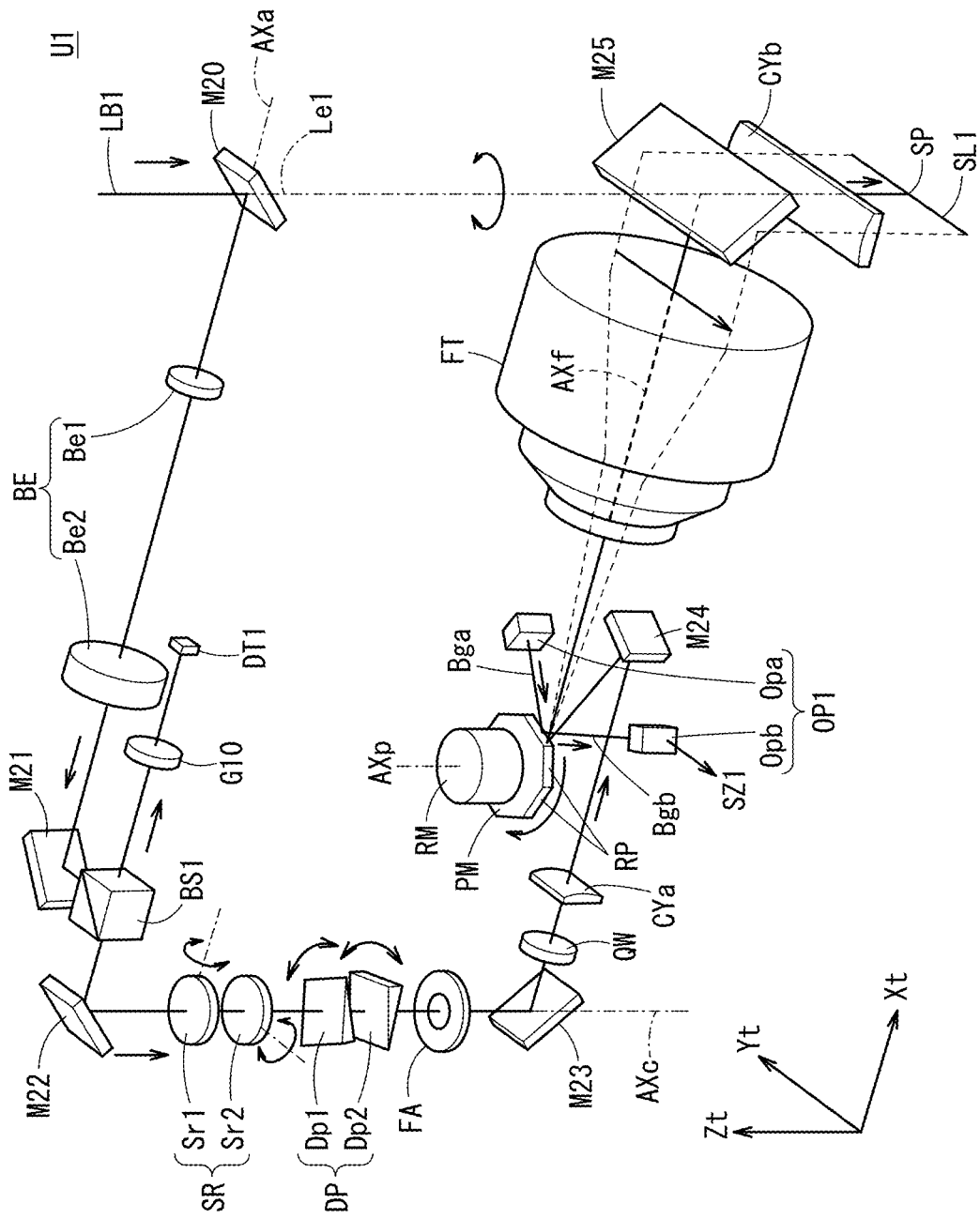
FIG. 5 is a diagram showing an optical configuration of the scanning unit shown in FIG. 2.

The following describes the optical configuration of the scanning units Un (U1 to U6), with reference to FIG. 5. Each scanning unit Un (U1 to U6) has the same configuration, and therefore the scanning unit (drawing unit) U1 is described, while descriptions of the other scanning units (drawing units) U2 to U6 are omitted. Furthermore, in FIG. 5, the direction parallel to the irradiation central axis Len (Le1) is the Zt direction, the direction in which the substrate P passes through the exposure apparatus EX from the processing device PR2 toward the processing device PR3 in a plane orthogonal to the Zt direction is the Xt direction, and the direction orthogonal to the Xt direction in a plane orthogonal to the Zt direction is the Yt direction. In other words, the three-dimensional coordinates of Xt, Yt, and Zt in FIG. 5 are three-dimensional coordinates obtained by rotating the three-dimensional coordinates of X, Y, and Z in FIG. 2 around the Y axis, such that the Z axis direction becomes parallel to the irradiation central axis Len (Le1).

As shown in FIG. 5, inside the scanning unit U1, a reflective mirror M20, a beam expander BE, a reflective mirror M21, a polarized beam splitter BS1, a reflective mirror M22, a shift optical member (parallel plates) SR, a deflection adjusting optical member (prism) DP, a field aperture FA, a reflective mirror M23, a λ/4 wave plate QW, a cylindrical lens CYa, a reflective mirror M24, a polygon mirror PM, the fθ lens FT, a reflective mirror M25, and a cylindrical lens CYb are provided along a progression direction of the beam LB1 from the position of incidence of the beam LB1 to the surface to be irradiated (substrate P). Furthermore, an origin point sensor (origin point detector) OP1 that detects the timing at which drawing by the scanning unit U1 can start and an optical lens system G10 and light detector (reflected light detecting section) DT1 for detecting the reflected light from the surface to be irradiated (substrate P) via the polarized beam splitter BS1 are provided in the scanning unit U1. The optical members (e.g. the polygon mirror PM, the fθ lens, and the like) from the reflective mirror M20 to the cylindrical lens CYb along the progression direction of the beam LB1 form a beam scanning section.

The beam LB1 incident to the scanning unit U1 proceeds in the −Zt direction, and becomes incident to the reflective mirror M20 that is inclined 45° relative to the XtYt plane. The axial line of the beam LB1 incident to this scanning unit U1 is incident to the reflective mirror M20 in a manner to be coaxial with the irradiation central axis Le1. The reflective mirror M20 functions as an incidence optical system that causes the beam LB1 to be incident to the scanning unit U1, and reflects the incident beam LB1 in the −Xt direction from the reflective mirror M20 toward the reflective mirror M21 distanced therefrom in the −Xt direction, along the optical axis AXa set parallel to the Xt axis. Accordingly, the optical axis AXa is orthogonal to the irradiation central axis Le1 within a plane parallel to the XtZt plane. The beam LB1 reflected by the reflective mirror M20 passes transparently through the beam expander BE arranged along the optical axis AXa, to be incident to the reflective mirror M21. The beam expander BE expands the diameter of the beam LB1 passing transparently therethrough. The beam expander BE includes a condensing lens Be1 and a collimating lens Be2 that converts the beam LB1, which diverges after converging due to the condensing lens Be1, into a parallel light flux.

The reflective mirror M21 is arranged at an incline of 45° relative to the YtZt plane, and reflects the incident beam LB1 (optical axis AXa) in the −Yt direction toward the polarized beam splitter BS1. The polarized splitting surface of the polarized beam splitter BS1 arranged at a distance from the reflective mirror M21 in the −Yt direction is arranged to be inclined 45° relative to the YtZt plane, reflects the P-polarized beam, and transparently passes the linearly polarized (S-polarized) beam that has been polarized in a direction orthogonal to the P-polarization. Since the beam LB1 incident to the scanning unit U1 is a P-polarized beam, the polarized beam splitter BS1 reflects the beam LB1 from the reflective mirror M21 in the −Xt direction, thereby guiding this beam LB1 to the reflective mirror M22.

The reflective mirror M22 is arranged at an incline of 45° relative to the XtYt plane, and reflects the incident beam LB1 in the −Zt direction toward the reflective mirror M23 distanced from the reflective mirror M22 in the −Zt direction. The beam LB1 reflected by the reflective mirror M22 passes along the optical axis AXc parallel to the Zt axis, through the shift optical member SR, the deflection adjusting optical member DP, and the field aperture (field of view diaphragm) FA to be incident to the reflective mirror M23. The shift optical member SR two-dimensionally adjusts the central position in the cross-sectional plane of the beam LB1, within a plane (XtYt plane) orthogonal to the progression direction (optical axis AXc) of the beam LB1. The shift optical member SR is formed by two quartz parallel plates Sr1 and Sr2 arranged along the optical axis AXc, the parallel plate Sr1 is capable of being inclined around the Xt axis, and the Sr2 is capable of being inclined around the Yt axis. By inclining these parallel plates Sr1 and Sr2 respectively on the Xt axis and the Yt axis, the central position of the beam LB1 is two-dimensionally shifted by a miniscule amount in the XtYt plane orthogonal to the progression direction of the beam LB1. These parallel plates Sr1 and Sr2 are driven by an actuator (drive section), not shown in the drawings, under control of the control apparatus 16.

The deflection adjusting optical member DP is a component for minutely adjusting the incline relative to the optical axis AXc of the beam LB1 that has been reflected by the reflective mirror M22 and passed through the shift optical member SR. The deflection adjusting optical member DP is formed by two wedge-shaped prisms Dp1 and Dp2 arranged along the optical axis AXc, and the prisms Dp1 and Dp2 are provided to each be able to independently rotate 360° on the optical axis AXc. By adjusting the rotation angle positions of the two prisms Dp1 and Dp2, parallelism is realized between the optical axis AXc and the axial line of the beam LB1 reaching the reflective mirror M23 and between the central irradiation line Le1 and the axial line of the beam LB1 reaching the surface to be irradiated of the substrate P. There are cases where the beam LB1 that has undergone the polarization adjustments by the two prisms Dp1 and Dp2 is horizontally shifted in a plane parallel to the cross-sectional plane of the beam LB1, and this horizontal shift can be returned to the original state by the shift optical member SR described above. The prisms Dp1 and Dp2 are driven by an actuator (drive section), not shown in the drawings, under control of the control apparatus 16.

In this way, the beam LB1 that has passed through the shift optical member SR and the deflection adjusting optical member DP transparently passes through the circular opening of the field aperture FA to reach the reflective mirror M23. The circular opening of the field aperture FA is a diaphragm that cuts off a skirt portion of the intensity distribution within the cross section of the beam LB1 expanded by the beam expander BE. When the diameter of the circular opening of the field aperture FA is an adjustable variable-iris diaphragm, it is possible to adjust the intensity (brightness) of the spot light SP.

The reflective mirror M23 is arranged at an inclination of 45° relative to the XtYt plane, and reflects the incident beam LB1 in the +Xt direction toward the reflective mirror M24. The beam LB1 reflected by the reflective mirror M23 is incident to the reflective mirror M24 via the λ/4 wave plate QW and the cylindrical lens CYa. The reflective mirror M24 reflects the incident beam LB1 toward the polygon mirror (rotating multi-surfaced mirror, scanning polarizing section, or deflection member) PM. The polygon mirror PM reflects the incident beam LB1 in the +Xt direction toward the fθ lens FT having an optical axis AXf that is parallel to the Xt axis. The polygon mirror PM one-dimensionally deflects (reflects) the incident beam LB1 in a plane parallel to the XtYt plane, in order to scan the surface to be irradiated of the substrate P with the spot light SP of the beam LB1. Specifically, the polygon mirror PM has a rotational axis AXp that extends in the Zt axis direction, and a plurality of reflective surfaces RP (the number Np of reflective surfaces RP is eight in the present embodiment) formed around the rotational axis AXp. It is possible to continuously change the reflective angle of the pulsed beam LB1 irradiating the reflective surfaces RP by rotating the polygon mirror PM in a predetermined rotational direction, centered on the rotational axis AXp. In this way, the reflection direction of the beam LB1 can be deflected by one reflective surface RP, and the surface to be irradiated of the substrate P can be scanned with the spot light SP of the beam LB1 along the main scanning direction (the width direction of the substrate P and the Yt direction).

In other words, it is possible to scan with the spot light SP of the beam LB1 along the main scanning direction using one reflective surface RP. Therefore, the number of drawing lines SL1 along which the surface to be irradiated of the substrate P is scanned with the spot light SP by a single rotation of the polygon mirror PM is at most eight, i.e. the same number as the number of reflective surfaces RP. The polygon mirror PM rotates at a constant speed according to a rotational drive source (e.g. a motor, deceleration mechanism, or the like) RM, under the control of the control apparatus 16. As described above, the actual length (e.g. 30 mm) of the drawing line SL1 is set to be less than or equal to a maximum scanning length (e.g. 31 mm) that can be scanned with the spot light SP by this polygon mirror PM and, according to the initial settings (design), the center point of the drawing line SL1 (point through which the central irradiation line Le1 passes) is set to be the center of the maximum scanning length.

The cylindrical lens CYa formed by a single lens converges the beam LB1 incident thereto on the reflective surface RP of the polygon mirror PM, in a non-scanning direction (Zt direction) orthogonal to the main scanning direction (rotational direction) of the polygon mirror PM. In other words, the cylindrical lens CYa converges the beam LB1 on the reflective surface RP with a slit shape (elliptical shape) extending in a direction parallel to the XtYt plane. Even in a case where the reflective surface RP is inclined relative to the Zt direction (inclination of the reflective surface RP relative to the normal line of the XtYt plane) by the cylindrical lens CYa whose busbar is parallel to the Yt direction and the cylindrical lens CYb described further below, it is possible to restrict the effect thereof. For example, the irradiation position of the beam LB1 (drawing line SL1) irradiating the surface to be irradiated of the substrate P can be restricted from being shifted in the Xt direction by the slight inclination error of each reflective surface RP of the polygon mirror PM.

The fθ lens (scanning lens system) FT having the optical axis AXf that extends in the Xt axis direction is a scan lens of a telecentric system projecting the beam LB1 reflected by the polygon mirror PM onto the reflective mirror M25, in a manner to be parallel to the optical axis AXf in the XtYt plane. The incidence angle θ of the beam LB1 relative to the fθ lens FT changes according to the rotational angle (θ/2) of the polygon mirror PM. The fθ lens FT projects the beam LB1 at an image height position on the surface to be irradiated of the substrate P proportional to the incidence angle θ, via the reflective mirror M25 and the cylindrical lens CYb formed by a single lens. With fo indicating the focal point distance and y indicating the image height position, the fθ lens FT is designed to satisfy the relationship (distortion aberration) y=fo×θ. Accordingly, with this fθ lens FT, it is possible to perform scanning with the beam LB1 accurately and with a constant speed in the Yt direction (Y direction). When the incidence angle θ relative to the fθ lens FT is 0°, the beam LB1 incident to the fθ lens FT progresses along the optical axis AXf.

The reflective mirror M25 reflects the beam LB1 from the fθ lens FT in the −Zt direction toward the substrate P. The beam LB1 reflected by the reflective mirror M25 is projected onto the substrate P via the cylindrical lens CYb. The beam LB1 projected onto the substrate P is converged to the miniature spot light SP with a diameter of several micrometers (e.g. 3 μm) on the surface to be irradiated of the substrate P, by the fθ lens FT and the cylindrical lens CYb whose busbar is parallel to the Yt direction. Furthermore, the spot light SP projected onto the surface to be irradiated of the substrate P is used to perform one-dimensional scanning according to the drawing line SL1 extending in the Yt direction, due to the polygon mirror PM. The optical axis AXf of the fθ lens FT and the central irradiation line Le1 are in the same plane, and this plane is parallel to the XtZt plane. Accordingly, the beam LB1 that has progressed on the optical axis AXf is reflected in the −Zt direction by the reflective mirror M25 to be projected onto the substrate P coaxially with the central irradiation line Le1. In the present first embodiment, at least the fθ lens FT functions as a projection optical system that projects the beam LB1 polarized by the polygon mirror PM onto the surface to be irradiated of the substrate P. Furthermore, at least the reflecting members (reflective mirrors M21 to M25 and the polarized beam splitter BS1 function as an optical path deflection member that folds back the optical path of the beam LB1 from the reflective mirror M20 to the substrate P. Due to this optical path deflection member, it is possible to make the incidence axis of the beam LB1 incident to the reflective mirror M20 and the central irradiation line Le1 substantially coaxial. The beam LB1 passing through the inside of the scanning unit U1, after having passed through the substantially U-shaped or C-shaped optical path, in the XtZt plane, progresses in the −Zt direction to be projected onto the substrate P.

In this way, in a state where the substrate P is being transported in the X direction, it is possible to relatively two-dimensionally scan the surface to be irradiated of the substrate P with the spot light SP, by one-dimensionally scanning with the spot light SP of the beams LBn (LB1 to LB6) in the main scanning direction (Y direction) using the respective scanning units Un (U1 to U6).

In the present first embodiment, in a case where the effective length of each drawing line SLn (SL1 to SL6) is 30 mm and the surface to be irradiated of the substrate P is irradiated with the spot light SP, having an effective size of 3 μm, along the drawing lines SLn (SL1 to SL6) while each overlaps by ½ the size thereof, i.e. 1.5 μm, the spot light SP is radiated at intervals of 1.5 μm. Accordingly, the number of spot lights SP radiated in one instance of scanning is 20000 (=30 [mm]/1.5 [μm]). Furthermore, when the feeding speed (transport speed) Vt of the substrate P in the main scanning direction is approximately 2.419 mm/sec and the scanning with the spot light SP in the sub scanning direction is performed at intervals of 1.5 μm, the time error Tpx between the timing of one instance of a scanning start (drawing start) along a drawing line SLn and the timing of a subsequent scanning start is approximately 620 μsec (=1.5[μm]/2.419 [mm/sec]). This time error Tpx is the time during which the polygon mirror PM having eight reflective surfaces RP rotates by one surface (45°=360°/8). In this case, it is necessary for the time of one rotation of the polygon mirror PM to be set to be approximately 4.96 msec (=8×620 [μsec]), and therefore the rotational speed Vp of the polygon mirror PM is set to approximately 201.613 (=1/4.96 [msec]) rotations per second, i.e. approximately 12096.8 rpm.

On the other hand, the maximum incidence angle (corresponding to the maximum scanning length of the spot light SP) at which the beam LB1 reflected by one reflective surface RP of the polygon mirror PM is effectively incident to the fθ lens FT is largely determined by the maximum scanning length and the focal point distance of the fθ lens FT. As an example, in a case where the polygon mirror PM has eight reflective surfaces RP, the rotational angle α ratio (scanning efficiency) contributing to actual scanning in a 45° rotational angle for one reflective surface RP is expressed as α/45°. In the present first embodiment, the rotational angle α contributing to actual scanning is 15°, and therefore the scanning efficiency is ⅓ (=15°/45°) and the maximum incidence angle of the fθ lens FT is 30° (±15° centered on the optical axis AXf). Therefore, the time Ts necessary for scanning with the spot light SP over the maximum scanning length (e.g. 31 mm) of a drawing line SLn is Ts=Tpx× scanning efficiency, and in the case of the exemplary numerical values described above, Ts is approximately 206.666 . . . μsec (=620 [μsec]/3). The effective scanning length of each drawing line SLn (SL1 to SL6) in the present first embodiment is 30 mm, and therefore the scanning time Tsp for one scan with the spot light SP along this drawing line SLn is approximately 200 μsec (=206.666 . . . [μsec]×30 [mm]/31 [mm]). Accordingly, during this time Tsp, it is necessary to radiate 20000 spot lights (pulsed lights), and therefore the light emission frequency (oscillation frequency) of the beams LB from the light source apparatuses (LSa and LSb) is Fa≈20000 times/200 μsec=100 MHz.

The origin point sensor OP1 shown in FIG. 5 generates an origin point signal SZ1 when the rotational position of a reflective surface RP of the polygon mirror PM reaches a predetermined position at which it is possible to scan with the spot light SP using the reflective surface RP. In other words, the origin point sensor OP1 generates the origin point signal SZ1 when the angle of the reflective surface RP that is to perform the following scanning with the spot light SP reaches a predetermined angular position. The polygon mirror PM has eight reflective surfaces RP, and therefore the origin point sensor OP1 outputs the origin point signal SZ1 eight times during the period of one rotation of the polygon mirror PM. The origin point signal SZ1 generated by this origin point sensor OP1 is sent to the control apparatus 16. After a delay time Td1 has passed from when the origin point sensor OP1 generated the origin point signal SZ1, the scanning with the spot light SP along the drawing line SL1 is started. In other words, this origin point signal SZ1 is information indicating the drawing-possible start timing (scanning-possible start timing) for the spot light SP by the scanning unit U1.

The origin point sensor OP1 includes a beam transmission system Opa that emits a laser beam Bga with a wavelength region to which the photosensitive functional layer of the substrate P does not have photosensitivity toward the reflective surface RP and a beam receiving system Opb that receives a reflected beam Bgb resulting from the laser beam Bga being reflected by the reflective surface RP and emits the origin point signal SZ1. Although not shown in the drawings, the beam transmission system Opa includes an optical member (reflective mirror, lens, or the like) that projects the laser beam Bga emitted by the light source onto the reflective surface RP. Although not shown in the drawings, the beam receiving system Opb includes a light receiving section, which has a photoelectric converting element that receives the received reflected beam Bgb and converts the reflected beam Bgb into an electrical signal, and an optical member (reflective mirror, lens, or the like) that guides the reflected beam Bgb that was reflected by the reflective surface RP to the light receiving section described above. The beam transmission system Opa and the beam receiving system Opb are provided at positions making it possible for the reflected beam Bgb of the laser beam Bga emitted by the beam transmission system Opa to be received by the beam receiving system Opb when the rotational position of the polygon mirror PM has reached a predetermined position immediately before the scanning with the spot light SP using the reflective surface RP is started. Origin point sensors OPn provided to the scanning units U2 to U6 are represented by OP2 to OP6, and origin point signals SZn generated by the origin point sensors OP2 to OP6 are represented by SZ2 to SZ6. The control apparatus 16 manages which scanning unit Un performs scanning with the spot light SP next, based on these origin point signals SZn (SZ1 to SZ6). Furthermore, there are cases where the delay times Tdn, from when the origin point signals SZ2 to SZ6 are generated to when the scanning with the spot light SP along the drawing lines SL2 to SL6 by the scanning units U2 to U6 is started, are represented by Td2 to Td6.

By changing this delay time Tdn, it is possible to shift the position of the drawing line SLn on the substrate P in the main scanning direction (Y direction). For example, by shortening the delay times Td1, Td3, and Td5, it is possible to shift the drawing lines SL1, SL3, and SL5 in a direction (+Y direction) that is the opposite of the main scanning direction (−Y direction) of the drawing lines SL1, SL3, and SL5. On the other hand, by lengthening the delay times Td1, Td3, and Td5, it is possible to shift the drawing lines SL1, SL3, and SL5 in the main scanning direction (−Y direction) of the drawing lines SL1, SL3, and SL5. Similarly, by shortening the delay times Td2, Td4, and Td6, it is possible to shift the drawing lines SL2, SL4, and SL6 in a direction (−Y direction) that is the opposite of the main scanning direction (+Y direction) of the drawing lines SL2, SL4, and SL6. On the other hand, by lengthening the delay times Td2, Td4, and Td6, it is possible to shift the drawing lines SL2, SL4, and SL6 in the main scanning direction (+Y direction) of the drawing lines SL2, SL4, and SL6.

The light detector DT1 shown in FIG. 5 includes a photoelectric converting element that photoelectrically converts the light incident thereto. Here, when the photosensitive functional layer of the substrate P is irradiated with the spot light SP of the beam LB1 from the scanning unit U1, the resulting reflected light passes through the cylindrical lens CYb, the reflective mirror M25, the fθ lens FT, the polygon mirror PM, the reflective mirror M24, the cylindrical lens CYa, the λ/4 wave plate QW, the reflective mirror M23, the field aperture FA, the deflection adjusting optical member DP, the shift optical member SR, and the reflective mirror M22, to be incident to the polarized beam splitter BS1. Here, the λ/4 wave plate QW is provided between the substrate P and the polarized beam splitter BS1, specifically between the cylindrical lens CYa and the reflective mirror M23. In this way, the beam LB1 irradiating the substrate P is converted from P-polarized light into the circularly polarized beam LB1 by this λ/4 wave plate QW, and the reflected light incident to the polarized beam splitter BS1 from the substrate P is converted from circularly polarized light into S-polarized light by this λ/4 wave plate QW. Accordingly, the reflected light from the substrate P transparently passes through the polarized beam splitter BS1, to be incident to the light detector DT1 via the optical lens system G10.

When the scanning unit U1 draws a new pattern (referred to below as a second pattern) on the photosensitive functional layer formed on the lower layer (base) on which a pattern (referred to below as a first pattern) has already been formed of a specified material, there are cases where a portion of the second pattern is drawn overlapping a portion of the first pattern of the lower layer. At this time, the reflected light resulting from the beam LB1 (spot light SP) projected onto the substrate P being reflected by the substrate P includes a normal reflected light (zero-order diffracted light) component that progresses in reverse along the incidence direction of the beam LB1 and a scattered light (or light diffracted in one or more dimensions) component that is reflected in a direction different from the incidence direction of the beam LB by the stepped structure (stepped edge) of the first pattern of the lower layer. The amount of each of the normal reflected light component and the scattered light or one or more-order (diffracted light) component generated changes according to the surface state of the lower layer (base) scanned with the spot light SP. The light detector DT1 in the present embodiment detects the change in mainly the light amount (brightness) of the normal reflected light, and it is possible to acquire image information corresponding to the first pattern of the lower layer by using a signal corresponding to this light amount.

Specifically, the intensity change of a photoelectric signal (detection signal) PS1 output from the light detector DT1 is acquired as one-dimensional data in the Yt direction, by digitally sampling this signal in response to a clock signal LTC (created by the light source apparatus LS) for pulsed light generation of the beam LB1 (spot light SP). Furthermore, two-dimensional image information of the first pattern is acquired by arranging in order the pieces of one-dimensional image data, oriented in the Yt direction, in the Xt direction at constant distances (e.g. ½ of the size of the spot light SP) in the sub scanning direction, according to the measurement values of the encoder heads EN2$a$ and EN2$b$ measuring the rotational angle position of the rotating drum DR on the drawing line SL1. The control apparatus 16 can acquire the information relating to the position of the first pattern formed on the lower layer and information relating to the shape (including distortion) of this pattern, based on the acquired two-dimensional image information. The control apparatus 16 uses this acquired information relating to the position of the first pattern and information relating to the shape of the first pattern to correct the position and shape of the second pattern that is to be newly drawn. The following describes the details of acquiring the information relating to the position of the first pattern and the information relating to the shape of the first pattern with the light detector DT1. The light detectors DTn provided to the scanning units U2 to U6 are represented by DT2 to DT6 and the photoelectric signals (detection signals) PSn resulting from the detection by the light detectors DT2 to DT6 are represented by PS2 to PS6.

It should be noted that the plurality of scanning units Un (U1 to U6) are supported by a body frame, not shown in the drawings, such that the plurality of scanning units Un (U1 to U6) can respectively pivot (rotate) with a fine angular resolution on the irradiation central axes Len (Le1 to Le6). When each scanning unit Un (U1 to U6) pivots on an irradiation central axis Len (Le1 to Le6), each drawing line SLn (SL1 to SL6) also pivots on the irradiation central axis Len (Le1 to Le6) on the surface to be irradiated of the substrate P. Accordingly, each drawing line SLn (SL1 to SL6) can be inclined relative to the Y direction with a fine angular resolution (e.g. on the order of micro radians). Even when each scanning unit Un (U1 to U6) pivots on an irradiation central axis Len (Le1 to Le6), the relative positional relationship between beam LBn (LB1 to LB6) passing through the scanning unit Un (U1 to U6) and the optical members inside the scanning unit Un (U1 to U6) does not change. Accordingly, it is possible for each scanning unit Un (U1 to U6) to scan with the spot light SP along a drawing line SLn (SL1 to SL6) that is pivoted on the surface to be irradiated of the substrate P. The pivoting of each scanning unit Un (U1 to U6) on the irradiation central axis Len (Le1 to Le6) is performed by an actuator, not shown in the drawings, under the control of the control apparatus 16.

The irradiation central axis Len of the scanning unit Un and the axis (pivoting central axis) on which the scanning unit Un actually pivots do not need to completely match, and it is only necessary that these axes are coaxial with a precision within a predetermined allowable range. This predetermined allowable range is set such that a difference, between the drawing start point (or drawing end point) of an actual drawing line SLn when the scanning unit Un is pivoted by an angle θsm and the drawing start point (or drawing end point) of the drawing line SLn as designed when the scanning unit Un is pivoted by a predetermined angle θsm and it is assumed that the irradiation central axis Len completely matches the rotation central axis, is within a predetermined distance (e.g. the size of the spot light SP) in the main scanning direction of the spot light SP. Furthermore, the optical axis (central axis) of the beam LBn that is actually incident to the scanning unit Un and the rotation central axis of the scanning unit Un do not need to completely match, and it is only necessary that these axes are coaxial with a precision within a predetermined allowable range.

Figure 6:
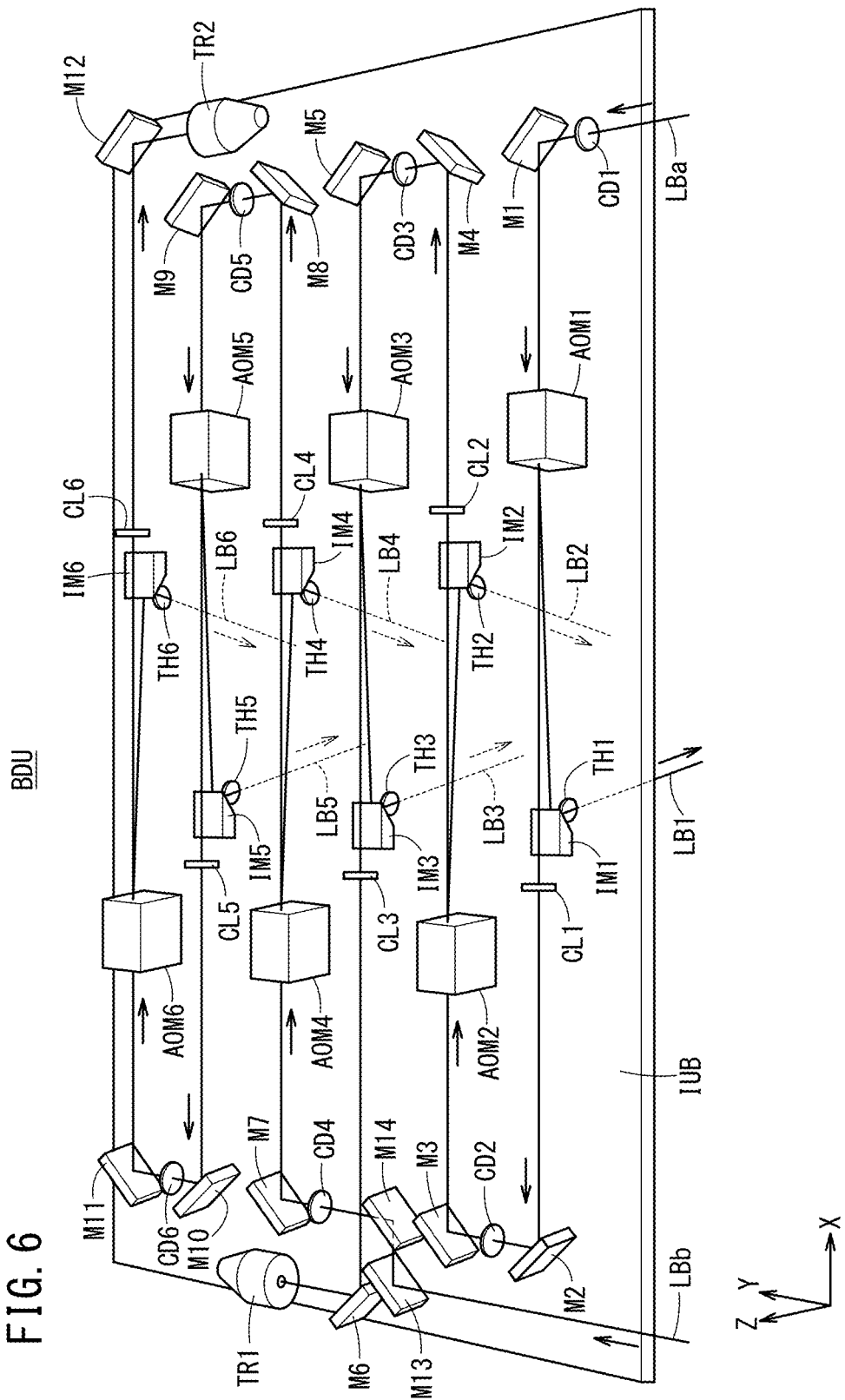
FIG. 6 is a configurational diagram of the beam switching section shown in FIG. 2.

FIG. 6 is a configurational view of the beam switching section BDU, and is also disclosed in International Publication 2015/166910. The beam switching section BDU includes a plurality of selection optical elements AOMn (AOM1 to AOM6), a plurality of condensing lenses CD1 to CD6, a plurality of reflective mirrors M1 to M14, a plurality of unit-side incidence mirrors IM1 to IM6, a plurality of collimating lenses CL1 to CL6, and absorbent bodies TR1 and TR2. The selection optical elements AOMn (AOM1 to AOM6) are components that are transparent with respect to the beams LB (LBa and LBb), and are acousto-optic modulators (AOM) driven by ultrasonic signals. These optical members (the selection optical elements AOM1 to AOM6, the condensing lenses CD1 to CD6, the reflective mirrors M1 to M14, the unit-side incidence mirrors IM1 to IM6, the collimating lenses CL1 to CL6, and the absorbent bodies TR1 and TR2) are supported by a board-shaped support member IUB. This support member IUB supports these optical members from below (the −Z direction side), above (+Z direction side) the plurality of scanning units Un (U1 to U6). Accordingly, the support member IUB also has a function of blocking heat between the plurality of scanning units Un (U1 to U6) and the selection optical elements AOMn (AOM1 to AOM6) that are sources of heat generation.

The beam LBa from the light source apparatus LSa passes through an optical path that is bent into a meandering shape by the reflective mirrors M1 to M6, to be guided to the absorbent body TR1. Similarly, the beam LBb from the light source apparatus LSb passes through an optical path that is bent into a meandering shape by the reflective mirrors M7 to M14, to be guided to the absorbent body TR2. The following is a detailed description of a case in which all of the selection optical elements AOMn (AOM1 to AOM6) are in an OFF state (a state in which the ultrasonic signals are not applied).

The beam LBa (parallel light flux) from the light source apparatus LSa progresses parallel to the Y axis in the +Y direction and passes through the condensing lens CD1 to be incident to the reflective mirror M1. The beam LBa that has been reflected in the −X direction by the reflective mirror M1 transparently passes in a straight manner through the first selection optical element AOM1 arranged at the focal point position (beam waist position) of the condensing lens CD1, is again made into a parallel light flux by the collimating lens CL1, and reaches the reflective mirror M2. The beam LBa that has been reflected in the +Y direction by the reflective mirror M2 passes through the condensing lens CD2, and is then reflected in the +X direction by the reflective mirror M3.

The beam LBa that has been reflected in the +X direction by the reflective mirror M3 transparently passes in a straight manner through the second selection optical element AOM2 arranged at the focal point position (beam waist position) of the condensing lens CD2, is again made into a parallel light flux by the collimating lens CL2, and reaches the reflective mirror M4. The beam LBa that has been reflected in the +Y direction by the reflective mirror M4 passes through the condensing lens CD3, and is then reflected in the −X direction by the reflective mirror M5. The beam LBa that has been reflected in the −X direction by the reflective mirror M5 transparently passes in a straight manner through the third selection optical element AOM3 arranged at the focal point position (beam waist position) of the condensing lens CD3, is again made into a parallel light flux by the collimating lens CL3, and reaches the reflective mirror M6. The beam LBa that has been reflected in the +Y direction by the reflective mirror M6 is incident to the absorbent body TR1. The absorbent body TR1 is a light trap that absorbs the beam LBa in order to restrict leakage of the beam LBa to the outside.

The beam LBb (parallel light flux) from the light source apparatus LSb progresses parallel to the Y axis in the +Y direction to be incident to the reflective mirror M13, and the beam LBb that has been reflected in the +X direction by the reflective mirror M13 is reflected in the +Y direction by the reflective mirror M14. The beam LBb that has been reflected in the +Y direction by the reflective mirror M14 passes through the condensing lens CD4, and is then reflected in the +X direction by the reflective mirror M7. The beam LBb that has been reflected in the +X direction by the reflective mirror M7 transparently passes in a straight manner through the fourth selection optical element AOM4 arranged at the focal point position (beam waist position) of the condensing lens CD4, is again made into a parallel light flux by the collimating lens CL4, and reaches the reflective mirror M8. The beam LBb that has been reflected in the +Y direction by the reflective mirror M8 passes through the condensing lens CD5, and is then reflected in the −X direction by the reflective mirror M9.

The beam LBb that has been reflected in the −X direction by the reflective mirror M9 transparently passes in a straight manner through the fifth selection optical element AOM5 arranged at the focal point position (beam waist position) of the condensing lens CD5, is again made into a parallel light flux by the collimating lens CL5, and reaches the reflective mirror M10. The beam LBb that has been reflected in the +Y direction by the reflective mirror M10 passes through the condensing lens CD6, and is then reflected in the +X direction by the reflective mirror M11. The beam LBb that has been reflected in the +X direction by the reflective mirror M11 transparently passes in a straight manner through the sixth selection optical element AOM6 arranged at the focal point position (beam waist position) of the condensing lens CD6, is again made into a parallel light flux by the collimating lens CL6, and reaches the reflective mirror M12. The beam LBb that has been reflected in the −Y direction by the reflective mirror M12 is incident to the absorbent body TR2. The absorbent body TR2 is a light trap (damper) that absorbs the beam LBb in order to restrict leakage of the beam LBb to the outside.

In the manner described above, the selection optical elements AOM1 to AOM3 are arranged in series along the progression direction of the beam LBa, such that the beam LBa from the light source apparatus LSa passes sequentially therethrough. Furthermore, the selection optical elements AOM1 to AOM3 are arranged such that the beam waist of the beam LBa is formed inside each of the selection optical elements AOM1 to AOM3 by the condensing lenses CD1 to CD3 and collimating lenses CL1 to CL3. In this way, the diameter of the beam LBa incident to the selection optical elements (acoutsto-optic modulators) AOM1 to AOM3 is made smaller and both the diffraction efficiency and the responsiveness are increased. Similarly, the selection optical elements AOM4 to AOM6 are arranged in series along the progression direction of the beam LBb, such that the beam LBb from the light source apparatus LSb passes sequentially therethrough. Furthermore, the selection optical elements AOM4 to AOM6 are arranged such that the beam waist of the beam LBb is formed inside each of the selection optical elements AOM4 to AOM6 by the condensing lenses CD4 to CD6 and collimating lenses CL4 to CL6. In this way, the diameter of the beam LBb incident to the selection optical elements (acoutsto-optic modulators) AOM4 to AOM6 is made smaller and both the diffraction efficiency and the responsiveness are increased.

Each selection optical element AOMn (AOM1 to AOM6) is a component that, upon having an ultrasonic signal (high frequency signal) applied thereto, generates first-order diffracted light, obtained by diffracting the incident beam (zero-order light) LB (LBa or LBb) with a diffraction angle corresponding to a harmonic frequency, as the emitted beam (the beam LBn). Accordingly, the beam emitted as first-order diffracted light from the selection optical element AOM1 is LB1 and, similarly, the beams emitted as first-order diffracted light from the selection optical elements AOM2 to AOM6 are respectively LB2 to LB6. In this way, each selection optical element AOMn (AOM1 to AOM6) realizes a function of deflecting the optical path of a beam LB (LBa or LBb) from the light source apparatus LSa or LSb. However, since an actual acousto-optic modulator has a first-order diffracted light generation efficiency that is approximately 80% that of zero-order light, the beams LBn (LB1 to LB6) deflected respectively by the selection optical elements AOMn (AOM1 to AOM6) have lower intensity than the original beams LB (LBa and LBb). Furthermore, when any one of the selection optical elements AOMn (AOM1 to AOM6) is in the ON state, approximately 20% of the zero-order light progressing in a straight line without being diffracted remains, but this light is ultimately absorbed by the absorbent bodies TR1 and TR2.

As shown in FIG. 6, each of the plurality of selection optical elements AOMn (AOM1 to AOM6) is arranged in a manner to deflect the beam LBn (LB1 to LB6), which is deflected first-order diffracted light, in the −Z direction relative to the beam LB (LBa or LBb) incident thereto. The beam LBn (LB1 to LB6) deflected by and emitted from each selection optical element AOMn (AOM1 to AOM6) is projected onto a respective unit-side incidence mirror IM1 to IM6 provided at a position that is a predetermined distance from the selection optical element AOMn (AOM1 to AOM6), and is then reflected in a manner to be coaxial with the irradiation central axis Le1 to Le6 in the −Z direction. The beams LB1 to LB6 reflected by the unit-side incidence mirrors IM1 to IM6 (also referred to below simply as mirrors IM1 to IM6) pass through respective opening portions TH1 to TH6 formed in the support member IUB to be incident to the scanning units U1 to U6 along the irradiation central axes Le1 to Le6.

The selection optical elements AOMn are diffraction gratings that cause a periodic density change in the refraction ratio in a predetermined direction within a transparent member due to ultrasonic waves, and therefore, in a case where the incident beam LB (LBa or LBb) is linearly polarized light (P-polarized light or S-polarized light), this polarization direction and the period direction of the diffraction grating are set such that the first-order diffracted light generation efficiency (diffraction efficiency) becomes as large as possible. In a case where each selection optical element AOMn is set in a manner to diffract and deflect the incident beam LB (LBa or LBs) in the −Z direction as shown in FIG. 6, the period direction of the diffraction grating generated within the selection optical elements AOMn is also the −Z direction, and therefore the polarization direction of the beams LB from the light source apparatuses LS (LSa and LSb) is set (adjusted) to match this direction.

In a case where the beam LBa (LBb) emitted from the light source apparatus LSa (LSb) is a parallel light flux with a radius that is less than approximately 1 mm, the condensing lenses CDn (CD1 to CD6) and collimating lenses CLn (CL1 to CL6) may be arranged such that the beam LB incident to each selection optical element AOMn is relayed as-is as a thin parallel light flux. In this case, the condensing lenses CDn may be provided between the selection optical elements AOMn and the corresponding unit-side incidence mirrors IMn (IM1 to IM6), and the beams LBn (LB1 to LB6) diffracted and deflected by the selection optical elements AOMn may be made to condense such that the beam waist is formed at or near the position of the unit-side incidence mirror IMn. Therefore, the selection optical elements AOMn are arranged at the front-side focal point positions of the condensing lenses CDn, and the unit-side incidence mirrors IMn are arranged at or near the back-side focal point positions of the condensing lenses CDn.

The configuration, function, operation, and the like of each selection optical element AOMn (AOM1 to AOM6) may be the same. The plurality of selection optical elements AOMn (AOM1 to AOM6) turn ON/OFF the emission of diffracted light obtained by diffracting the incident beam LB (LBa or LBb) according to the ON/OFF state of the drive signals (high frequency signals) from the control apparatus 16. For example, the selection optical element AOM1 transparently passes, without diffracting, the beam LBa incident thereto from the light source apparatus LSa, when in the OFF state without the drive signal (high frequency signal) from the control apparatus 16 being applied thereto. Accordingly, the beam LBa that has been transparently passed by the selection optical element AOM1 transparently passes through the collimating lens CL1 to be incident to the reflective mirror M2. On the other hand, the selection optical element AOM1 diffracts the beam LBa incident thereto and directs this beam toward the mirror IM1, when in the ON state with the drive signal (high frequency signal) from the control apparatus 16 being applied thereto. In other words, the selection optical element AOM1 is switched according to this drive signal. The mirror IM1 selects the beam LB1, which is first-order diffracted light diffracted by the selection optical element AOM1, and reflects this beam LB1 to the scanning unit U1 side. The beam LB1 reflected by this mirror IM1 for selecting passes through the opening portion TH1 of the of the support member IUB to be incident to the scanning unit U1 along the irradiation central axis Le1. Accordingly, the mirror IM1 reflects the incident beam LB1 such that the optical axis (central axis) of the reflected beam LB1 is coaxial with the irradiation central axis Le1. Furthermore, when the selection optical element AOM1 is in the ON state, the zero-order light (with an intensity that is approximately 20% of the incident beam) of the beam LB transparently passed in a straight manner by the selection optical element AOM1 then transparently passes through the following collimating lenses CL1 to CL3, condensing lenses CD2 and CD3, reflective mirrors M2 to M6, and selection optical elements AOM2 and AOM3 to reach the absorbent body TR1.

Similarly, the selection optical elements AOM2 and AOM3 transparently pass, without diffracting, the incident beam LBa to the collimating lenses CL2 and CL3 side (reflective mirrors M4 and M6 side), when in the OFF state without the drive signals (high frequency signals) from the control apparatus 16 being applied thereto. On the other hand, the selection optical elements AOM2 and AOM3 direct the incident beams LB2 and LB3, which are the first-order diffracted light of the incident beams LBa, toward the mirrors IM2 and IM3, when in the ON state with the drive signals from the control apparatus 16 being applied thereto. These mirrors IM2 and IM3 reflect the beams LB2 and LB3 diffracted by the selection optical elements AOM2 and AOM3 to the scanning units U2 and U3 side. The beams LB2 and LB3 reflected by the mirrors IM2 and IM3 pass through the opening portions TH2 and TH3 of the support member IUB, to be incident to the scanning units U2 and U3 while being coaxial with the irradiation central axes Le2 and Le3.

In this way, the control apparatus 16 switches any one of the selection optical elements AOM1 to AOM3 by turning ON/OFF (high/low) the drive signals (high frequency signals) to be applied respectively to the selection optical elements AOM1 to AOM3, and switches between directing the beam LBa to the following selection optical element AOM2 or AOM3 or the absorbent body TR1 and directing one of the deflected beams LB1 to LB3 toward the corresponding scanning unit U1 to U3.

Furthermore, the selection optical element AOM4 transparently passes, without diffracting, the incident beam LBb from the light source apparatus LSb to the collimating lens CL4 side (reflective mirror M8 side), when in the OFF state without the drive signal (high frequency signal) from the control apparatus 16 being applied thereto. On the other hand, the selection optical element AOM4 directs the beam LB4, which is the first-order diffracted light of the incident beam LBb, toward the mirror IM4, when in the ON state with the drive signals from the control apparatus 16 being applied thereto. This mirror IM4 reflects the beam LB4 diffracted by the selection optical element AOM4 to the scanning unit U4 side. The beam LB4 reflected by the mirror IM4 becomes coaxial to the irradiation central axis Le4, and passes through the opening portion TH4 of the support member IUB to be incident to the scanning unit U4.

Similarly, the selection optical elements AOM5 and AOM6 transparently pass, without diffracting, the incident beam LBb to the collimating lenses CL5 and CL6 side (reflective mirrors M10 and M12 side), when in the OFF state without the drive signals (high frequency signals) from the control apparatus 16 being applied thereto. On the other hand, the selection optical elements AOM5 and AOM6 direct the incident beams LB5 and LB6, which are the first-order diffracted light of the incident beams LBb, toward the mirrors IM5 and IM6, when in the ON state with the drive signals from the control apparatus 16 being applied thereto. These mirrors IM5 and IM6 reflect the beams LB5 and LB6 diffracted by the selection optical elements AOM5 and AOM6 to the scanning units U5 and U6 side. The beams LB5 and LB6 reflected by the mirrors IM5 and IM6 pass through the opening portions TH5 and TH6 of the support member IUB, to be incident to the scanning units U5 and U6 while being coaxial with the irradiation central axes Le5 and Le6.

In this way, the control apparatus 16 switches any one of the selection optical elements AOM4 to AOM6 by turning ON/OFF (high/low) the drive signals (high frequency signals) to be applied respectively to the selection optical elements AOM4 to AOM6, and switches between directing the beam LBb to the following selection optical element AOM5 or AOM6 or the absorbent body TR2 and directing one of the deflected beams LB4 to LB6 toward the corresponding scanning unit U4 to U6.

As described above, by including the plurality of selection optical elements AOMn (AOM1 to AOM3) arranged in series along the progression direction of the beam LBa from the light source apparatus LSa, the beam switching section BDU can switch the optical path of the beam LBa to select one scanning unit Un (U1 to U3) to which the beam LBn (LB1 to LB3) is incident. Accordingly, it is possible to make the beams LBn (LB1 to LB3), which are first-order diffracted light of the beam LBa from the light source apparatus LSa, sequentially incident to the respective three scanning units Un (U1 to U3). For example, when it is desired for the beam LB1 to be incident to the scanning unit U1, the control apparatus 16 just needs to set only the selection operation element AOM1 among the plurality of selection optical elements AOM1 to AOM3 to the ON state, and when it is desired for the beam LB3 to be incident to the scanning unit U3, the control apparatus 16 just needs to set only the selection optical element AOM3 to the ON state.

Similarly, by including the plurality of selection optical elements AOMn (AOM4 to AOM6) arranged in series along the progression direction of the beam LBb from the light source apparatus LSb, the beam switching section BDU can switch the optical path of the beam LBb to select one scanning unit Un (U4 to U6) to which the beam LBn (LB4 to LB6) is incident. Accordingly, it is possible to make the beams LBn (LB4 to LB6), which are first-order diffracted light of the beam LBb from the light source apparatus LSb, sequentially incident to the respective three scanning units Un (U4 to U6). For example, when it is desired for the beam LB4 to be incident to the scanning unit U4, the control apparatus 16 just needs to set only the selection operation element AOM4 among the plurality of selection optical elements AOM4 to AOM6 to the ON state, and when it is desired for the beam LB6 to be incident to the scanning unit U6, the control apparatus 16 just needs to set only the selection optical element AOM6 to the ON state.

The plurality of selection optical elements AOMn (AOM1 to AOM6) are provided corresponding to the plurality of scanning units Un (U1 to U6), and switch whether or not the beams LBn are incident to the corresponding scanning units Un. In the present first embodiment, the selection optical elements AOM1 to AOM3 are referred to as a first optical element module, and the selection optical elements AOM4 to AOM6 are referred to as a second optical element module. Furthermore, the scanning units U1 to U3 corresponding to the selection optical elements AOM1 to AOM3 of the first optical element module are referred to as a first scanning module, and the scanning units U4 to U6 corresponding to the selection optical elements AOM4 to AOM6 of the second optical element module are referred to as a second scanning module. Accordingly, the scanning (drawing operation) with the spot light SP is performed in parallel by any one scanning unit Un of the first scanning module and any one scanning unit Un of the second scanning module.

As described above, in the present first embodiment, the rotational angle α of the polygon mirror PM of a scanning unit Un contributing to the actual scanning is set to 15°, and therefore the scanning efficiency is ⅓. Accordingly, during a rotation of an angle (45°) of one reflective surface RP by one scanning unit Un, the angle over which the scanning with the spot light SP can be performed is 15°, and scanning with the spot light SP cannot be performed over any other angle range (30°), such that the beam LBn incident to the polygon mirror PM during this span is useless. Accordingly, while the rotational angle of the polygon mirror PM of one scanning unit Un is an angle that does not contribute to the actual scanning, by causing the beam LBn to be incident to another scanning unit Un, scanning with the spot light SP of this other scanning unit Un is performed by the polygon mirror PM. Since the scanning efficiency of the polygon mirror PM is ⅓, during the period from when one scanning unit Un performs scanning with the spot light to when the subsequent scanning is performed, it is possible to distribute the beam LBn to two other scanning units Un and perform scanning with the spot light SP. Therefore, in the present first embodiment, the plurality of scanning units Un (U1 to U6) are divided into two groups (scanning modules), in which the three scanning units U1 to U3 are the first scanning module and the three scanning units U4 to U6 are the second scanning module.

In this way, during a rotation of 45° (corresponding to one reflective surface RP) by the polygon mirror PM of the scanning unit U1, for example, it is possible to cause the beams LBn (LB1 to LB3) to be incident in order to any one of the three scanning units U1 to U3. Accordingly, it is possible for each scanning unit U1 to U3 to perform scanning with the spot light SP in order, without wasting the beam LBa from the light source apparatus LSa. Similarly, during a rotation of 45° (corresponding to one reflective surface RP) by the polygon mirror PM of the scanning unit U4, it is possible to cause the beams LBn (LB4 to LB6) to be incident in order to any one of the three scanning units U4 to U6. Accordingly, it is possible for the scanning units U4 to U6 to perform scanning with the spot light SP in order, without wasting the beam LBb from the light source apparatus LSb. It should be noted that, during the period from when each scanning unit Un starts scanning with the spot light SP to when the subsequent scanning is started, the polygon mirror PM rotates by exactly an angle (45°) corresponding to one reflective surface RP.

In the present first embodiment, each of the three scanning units Un (U1 to U3 and U4 to U6) in each scanning module performs scanning with the spot light SP in a predetermined order, and in accordance with this, the control apparatus 16 switches ON the three selection optical elements AOMn (AOM1 to AOM3 and AOM4 to AOM6) of each optical element module in a predetermined order to switch, in order, the scanning units (U1 to U3 and U4 to U6) to which the beams LBn (LB1 to LB3 and LB4 to LB6) are incident. For example, in a case where the order in which the scanning is performed with the spot light SP of the three scanning units U1 to U3 and U4 to U6 in each scanning module is U1→U2→U3 and U4→U5→U6, the control section 16 switches ON the three selection optical elements AOMn (AOM1 to AOM3 and AOM4 to AOM6) of each optical element module in the order of AOM1→AOM2→AOM3 and AOM4→AOM5→AOM6, and the scanning units Un to which the beams LBn are incident are switched in the order of U1→U2→U3 and U4→U5→U6.

During a rotation of an angle (45°) of one reflective surface RP by the polygon mirror PM, the three scanning units Un (U1 to U3 and U4 to U6) of each scanning module perform scanning with the spot light SP in order, and therefore each polygon mirror PM of the three scanning units Un (U1 to U3 and U4 to U6) of each scanning module must rotate in a manner to satisfy conditions such as the following. These conditions are that each polygon mirror PM of the three scanning units Un (U1 to U3 and U4 to U6) of each scanning module must be synchronously controlled to have the same rotational speed Vp, and the rotational angle position (angular position of each reflective surface RP) of each polygon mirror PM must be synchronously controlled to have a predetermined phase relationship. In the present first embodiment, the predetermined phase relationship refers to the relationship of the rotational angle positions of the polygon mirrors being shifted by 15° each. Having the polygon mirrors PM of the three scanning units Un in each scanning module rotate with the same rotational speed Vp is referred to as synchronized rotation.

Each selection optical element AOMn (AOM1 to AOM6) of the beam switching section BDU only needs to be in the ON state during one scanning period with the spot light SP by the polygon mirror in each scanning unit Un (U1 to U6). With the number of reflective surfaces of a polygon mirror PM being Np and the rotational speed of a polygon mirror PM being Vp (rpm), the time Tpx corresponding to a rotational angle for one reflective surface RP of the polygon mirror PM is Tpx=60/(Np×Vp) [sec]. For example, in a case where the number Np of reflective surfaces is 8 and the rotational speed Vp [rpm] is 12096.8, the time Tpx is approximately 0.62 milliseconds. When converted to frequency, this becomes approximately 1.6129 kHz, and this means that an acousto-optic modulator with a very low response frequency is acceptable, compared to an acousto-optic modulator for modulating a beam LB in the ultraviolet wavelength region according to pattern data (drawing data) at a high speed of approximately tens of megahertz. Therefore, it is possible to use something with a large diffraction angle for the beams LB1 to LB6 (first-order diffracted light) deflected relative to the incident beam LB (zero-order light), and a simpler arrangement is realized for the mirrors IM1 to IM6 that separate the deflected beams LB1 to LB6 relative to the progression path of the beam LB passing in a straight manner through the selection optical elements AOM1 to AOM6.

Figure 7:
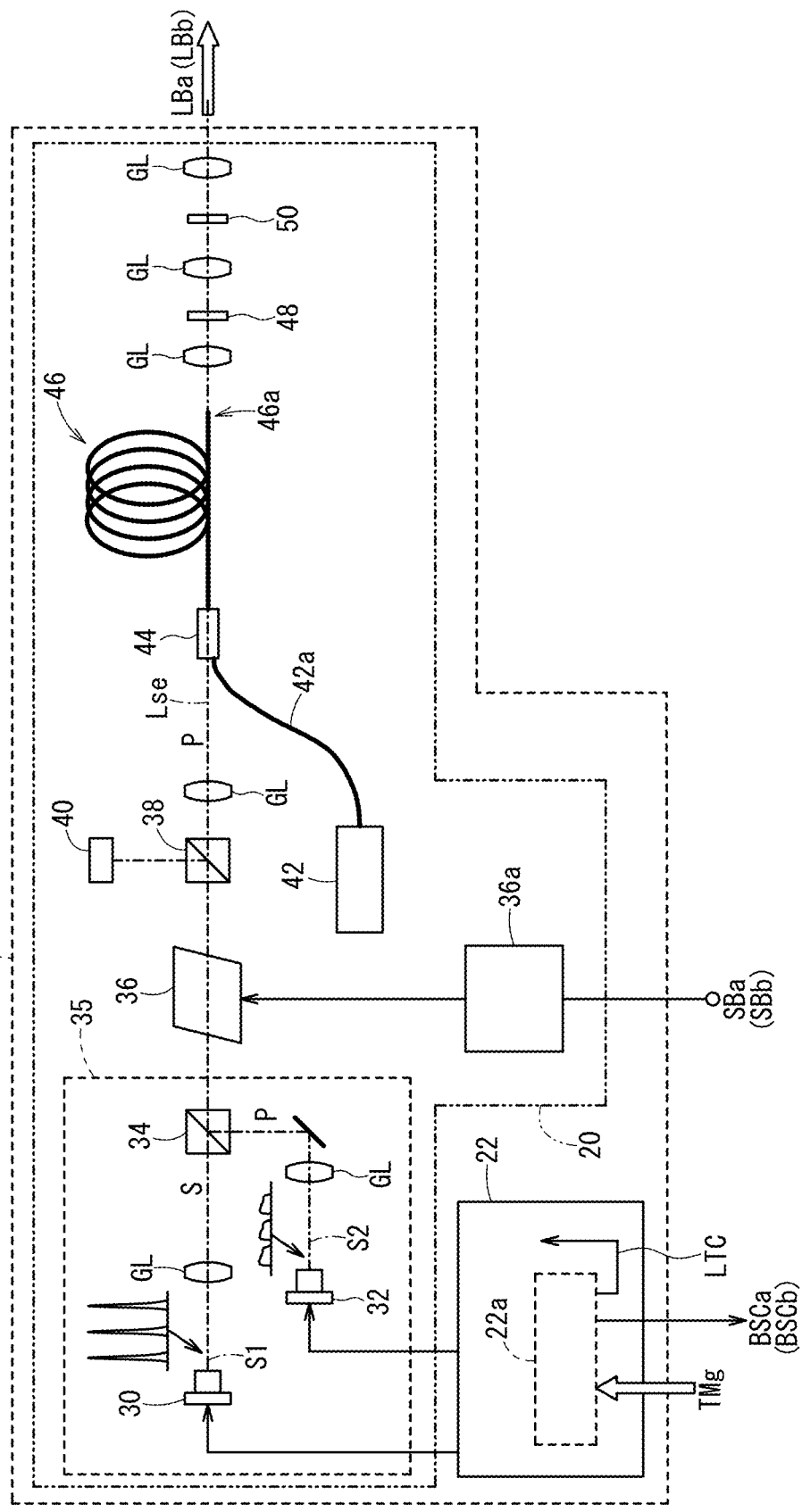
FIG. 7 is a diagram showing a configuration of the light source apparatus shown in FIG. 2.

FIG. 7 is a diagram showing the configuration of the light source apparatus (pulsed light source apparatus or pulse laser apparatus) LSa (LSb), which is basically the same configuration as disclosed in International Publication 2015/166910. The light source apparatus LSa (LSb) serving as the fiber laser apparatus includes a pulsed light generating section 20 and a control circuit 22. The pulsed light generating section 20 includes DFB semiconductor laser elements 30 and 32, a polarized beam splitter 34, an electro-optic element (beam intensity modulating section) 36 serving as a drawing light modulator, a drive circuit 36a of this electro-optic element 36, a polarized beam splitter 38, an absorbent body 40, an excitation light source 42, a combiner 44, a fiber optical amplifier 46, wavelength converting optical elements 48 and 50, and a plurality of lens elements GL. The control circuit 22 includes a signal generating section 22a that generates a clock signal LTC and a pixel shift pulse BSC. The pixel shift pulse BSC generated by the signal generating section 22a is output to an integrated control section 104 of the control apparatus 16. In order to distinguish between the pixel shift pulse BSC output to the integrated control section 104 from the signal generating section 22a of the light source apparatus LSa and the pixel shift pulse BSC output to the integrated control section 104 from the signal generating section 22a of the light source apparatus LSb, the pixel shift pulse BSC from the light source apparatus LSa is sometimes expressed as BSCa and the pixel shift pulse BSC from the light source apparatus LSb is sometimes expressed as BSCb.

The DFB semiconductor laser element (first solid state laser element) 30 generates sharp or acute pulsed seed light (pulse beam or beam) S1 with an oscillation frequency Fa (e.g. 100 MHz) that is a predetermined frequency, and the DFB semiconductor laser element (second solid state laser element) 32 generates slow (temporally broad) pulsed seed light (pulse beam or beam) S2 with an oscillation frequency Fa (e.g. 100 MHz) that is a predetermined frequency. The seed light S1 generated by the DFB semiconductor laser element 30 and the seed light S2 generated by the DFB semiconductor laser element 32 have synchronized light emission timings. The seed lights S1 and S2 have substantially the same energy per pulse, but the polarization states are different from each other and the seed light S1 has a stronger peak intensity. The seed light S1 and the seed light S2 are linearly polarized light, with polarization directions that are orthogonal to each other. In the present first embodiment, a description is provided in which the polarization state of the seed light S1 generated by the DFB semiconductor laser element 30 is S-polarization and the polarization state of the seed light S2 generated by the DFB semiconductor laser element 32 is P-polarization. The seed lights S1 and S2 are light in the infrared wavelength region.

The control circuit 22 controls the DFB semiconductor laser elements 30 and 32 in a manner to generate the seed lights S1 and S2 in response to a clock pulse of the clock signal LTC transmitted thereto from the signal generating section 22a. In this way, the DFB semiconductor laser elements 30 and 32 generate the seed lights S1 and S2 with the predetermined frequency (oscillation frequency) Fa, in response to each clock pulse (oscillation frequency Fa) of the clock signal LTC. The control circuit 22 is controlled by the control apparatus 16. The period (=1/Fa) of the clock pulse of this clock signal LTC is referred to as the reference period Ta. The seed lights S1 and S2 generated by the DFB semiconductor laser elements 30 and 32 are guided to the polarized beam splitter 34.

The clock signal LTC serving as this reference clock signal becomes the base of the pixel shift pulses (BSCa and BSCb). Furthermore, magnification correction information TMg for performing a magnification correction of the drawing lines SLn on the surface to be irradiated of the substrate P is input to the signal generating section 22a from the control apparatus 16. Described simply, the magnification correction involves changing the oscillation frequency Fa of the clock signal LTC according to the magnification correction information TMg, thereby uniformly and finely adjusting the projection interval of the spot light SP (i.e. the oscillation frequency of the spot light) projected along the main scanning direction, while the number of spot lights included in one pixel (one bit) in the drawing data is kept constant. In this way, it is possible to finely adjust the length (scanning length) of the drawing lines SLn on the surface to be irradiated of the substrate P. The extension and contraction of the drawing lines SLn (fine adjustment of the scanning length) can be performed within a range of the maximum scanning length (e.g. 31 mm) of the drawing lines SLn. It should be noted that the oscillation frequency Fa is 100 Mz when the magnification correction information is zero, i.e. when there is no correction.

The polarized beam splitter 34 is a component that transparently passes S-polarized light and reflects P-polarized light, and guides the seed light S1 generated by the DFB semiconductor laser element 30 and the seed light S2 generated by the DFB semiconductor laser element 32 to the electro-optic element 36. Specifically, the polarized beam splitter 34 guides the seed light S1 to the electro-optic element 36 by transparently passing the S-polarized seed light S1 generated by the DFB semiconductor laser element 30. Furthermore, the polarized beam splitter 34 guides the seed light S2 to the electro-optic element 36 by reflecting the P-polarized seed light S2 generated by the DFB semiconductor laser element 32. The DFB semiconductor laser elements 30 and 32 and the polarized beam splitter 34 form the pulsed light source section 35 that generates the seed lights S1 and S2.

The electro-optic element (beam intensity modulating section) 36 is a component that is transparent relative to the seed lights S1 and S2, and an electro-optic modulator (EOM) is used, for example. The electro-optic element 36 is a component that switches the polarization states of the seed lights S1 and S2 using the drive circuit 36a, in response to the high/low state of drawing bit sequence data SBa (SBb). The drawing bit sequence data SBa is generated based on pattern data (bit pattern) corresponding to the pattern to be exposed by each scanning unit U1 to U3, and the drawing bit sequence data SBb is generated based on pattern data (bit pattern) corresponding to the pattern to be exposed by each scanning unit U4 to U6. Accordingly, the drawing bit sequence data SBa is input to the drive circuit 36a of the light source apparatus LSa, and the drawing bit sequence data SBb is input to the drive circuit 36a of the light source apparatus LSb. The seed lights S1 and S2 respectively from the DFB semiconductor laser element 30 and DFB semiconductor laser elements 32 have long wavelengths in a wavelength region greater than or equal to 800 nm, and therefore it is possible to use a component with a polarization state switching responsiveness on the order of GHz as the electro-optic element 36.

The pattern data (drawing data) is provided for each scanning unit Un, and is data in which a pattern to be drawn by each scanning unit Un is divided according to pixels with dimensions Pxy set according to the size φ of the spot light SP and each of the plurality of pixels is expressed by logic information (pixel data) corresponding to the pattern. In other words, this pattern data is bitmap data formed by logic information of a plurality of pixels expanded two-dimensionally, with the direction along the main scanning direction (Y direction) of the spot light SP being a row direction and the direction along the sub scanning direction (X direction) of the substrate P being a column direction. This logic information of the pixels is 1-bit data that is "0" or "1". Logic information of "0" means that the intensity of the spot light SP projected onto the substrate P is set to low level (no drawing), and logic information of "1" means that the intensity of the spot light SP projected onto the substrate P is set to high level (drawing). It should be noted that for the dimensions Pxy of the pixels, the dimension in the main scanning direction (Y direction) is Py and the dimension in the sub scanning direction (X direction) is Px.

The logic information for one column of pixels in the pattern data corresponds to one drawing line SLn (SL1 to SL6). Accordingly, the number of pixels in one column is determined according to the length of the drawing line SLn and the pixel dimensions Pxy on the surface to be irradiated of the substrate P. The dimensions Pxy of one pixel are set to be approximately equal to the size φ of the spot light SP or greater than or equal to this size φ, and in a case where the effective size φ of the spot light SP is 3 μm, for example, the dimensions Pxy of one pixel are set to be greater than or equal to 3 μm square. The intensity of the spot light SP projected onto the substrate P along one drawing line SLn (SL1 to SL6) is modulated according to the logic information of one column of pixels. This logic information for one column of pixels is referred to as serial data DLn. In other words, the pattern data is bit map data in which the serial data DLn is lined up in the column direction. The serial data DLn of the pattern data of the scanning unit U1 is expressed as DL1 and, similarly, the pieces of serial data DLn of the pattern data of the scanning units U2 to U6 are expressed as DL2 to DL6. In the present embodiment, the spot lights SP projected onto the substrate P each overlap by 1.5 μm (½ of the size), and therefore two spot lights SP correspond to one pixel. Accordingly, since the number of spot lights projected along the drawing lines SLn is 20,000, the number of pixels in one column is half of this, i.e. 10,000. Therefore, the oscillation frequency of the pixel shift pulse BSC (BSCa or BSCb) controlling the timing at which the logic information of one column of pixels is output to a drive circuit 36a, sequentially from the first row, is ½ of the oscillation frequency Fa of the clock signal LTC. In other words, the pixel shift pulse BSC is obtained by frequency dividing the clock signal LTC in half.

Furthermore, the three scanning units U1 to U3 (U4 to U6) of a scanning module repeat the operation of performing one scanning at a time with the spot light SP in a predetermined order, and therefore, in correspondence with this, the pieces of serial data DL1 to DL3 (DL4 to DL6) of the pattern data of the three scanning units U1 to U3 (U4 to U6) of the scanning module are also output to the drive circuit 36a of the light source apparatus LSa (LSb) in the predetermined order. The pieces of serial data DL1 to DL3 sequentially output to the drive circuit 36a of this light source apparatus LSa are referred to as drawing bit sequence data SBa, and the pieces of serial data DL4 to DL6 sequentially output to the drive circuit 36a of this light source apparatus LSb are referred to as drawing bit sequence data SBb.

As an example, in a case where the order of the scanning units Un performing scanning with the spot light SP in the first scanning module is U1→U2→U3, first, the serial data DL1 of one column is output to the drive circuit 36a of the light source apparatus LSa and then the serial data DL2 of one column is output to the drive circuit 36a of the light source apparatus LSa, and in this way, the one-column pieces of serial data DL1 to DL3 forming the drawing bit sequence data SBa are output to the drive circuit 36a of the light source apparatus LSa in the order of DL1→DL2→DL3. After this, the next column of each piece of serial data DL1 to DL3 is output to the drive circuit 36a of the light source apparatus LSa as the drawing bit sequence data SBa in the order of DL1→DL2→DL3. Similarly, in a case where the order of the scanning units Un performing scanning with the spot light SP in the second scanning module is U4→U5→U6, first, the serial data DL4 of one column is output to the drive circuit 36a of the light source apparatus LSb and then the serial data DL5 of one column is output to the drive circuit 36a of the light source apparatus LSb, and in this way, the one-column pieces of serial data DL4 to DL6 forming the drawing bit sequence data SBb are output to the drive circuit 36a of the light source apparatus LSb in the order of DL4→DL5→DL6. After this, the next column of each piece of serial data DL4 to DL6 is output to the drive circuit 36a of the light source apparatus LSb as the drawing bit sequence data SBb in the order of DL4→DL5→DL6.

When the logic information of one pixel of the drawing bit sequence data SBa (SBb) input to the drive circuit 36a is in the low ("0") state, the electro-optic element 36 guides the seed lights S1 and S2 to the polarized beam splitter 38 as-is, without changing the polarization states thereof. On the other hand, when the logic information of one pixel of the drawing bit sequence data SBa (SBb) input to the drive circuit 36a is in the high ("1") state, the electro-optic element 36 changes the polarization states of the seed lights S1 and S2 incident thereto, i.e. changes the polarization directions thereof by 90°, and guides the resulting seed lights S1 and S2 to the polarized beam splitter 38. By having the drive circuit 36a drive the electro-optic element 36 based on the drawing bit sequence data SBa (SBb) in this way, the electro-optic element 36 converts the S-polarized seed light S1 into P-polarized seed light S1 and converts the P-polarized seed light S2 into S-polarized seed light S2, when the logic information of a pixel of the drawing bit sequence data SBa (SBb) is in the high ("1") state.

The polarized beam splitter 38 is a component that transparently passes the P-polarized light to guide this light to the combiner 44 via the lens element GL, and reflects the S-polarized light to guide this light to the absorbent body 40. The light (seed light) transparently passed through this polarized beam splitter 38 is expressed as a beam Lse. The oscillation frequency of this pulsed beam Lse is Fa. The excitation light source 42 generates excitation light, and the generated excitation light is guided to the combiner 44 via the optical fiber 42a. The combiner 44 combines the excitation light and the beam Lse irradiated from the polarized beam splitter 38, and outputs the result to the fiber optical amplifier 46. The fiber optical amplifier 46 is doped with a laser medium excited by the excitation light. Accordingly, as a result of the laser medium being excited by the excitation light within the fiber optical amplifier 46 that transmits the combined beam Lse and excitation light, the beam Lse is amplified as seed light. A rare earth element such as erbium (Er), ytterbium (Yb), or thulium (Tm) is used as the laser medium doped in the fiber optical amplifier 46. This amplified beam Lse is emitted along with a predetermined divergence angle from the emission end 46a of the fiber optical amplifier 46, and is converged or collimated by the lens element GL to be incident to the wavelength converting optical element 48.

The wavelength converting optical element (first wavelength converting optical element) 48 converts the beam Lse (wavelength λ) incident thereto into a second harmonic whose wavelength is ½ of λ, using second harmonic generation (SHG). A PPLN (Periodically Poled $LiNbO_3$) crystal, which is a quasi phase matching (QPM) crystal, is preferably used as the wavelength converting optical element 48. It is also possible for a PPLT (Periodically Poled $LiTaO_3$) crystal or the like to be used.

The wavelength converting optical element (second wavelength converting optical element) 50 generates a third harmonic whose wavelength is ⅓ of λ, by performing sum frequency generation (SFG) on the second harmonic (wavelength of λ/2) generated by the wavelength converting optical element 48 and the seed light (wavelength of λ) that remains without being converted by the wavelength converting optical element 48. This third harmonic is ultraviolet light (beam LB) with a peak wavelength in a wavelength band (e.g. 355 nm) less than or equal to 370 nm.

In a case where the logic information of one pixel of the drawing bit sequence data SBa (SBb) applied to the drive circuit 36a is low ("0"), the electro-optic element (beam intensity modulating section) 36 guides the seed lights S1 and S2 incident thereto to the polarized beam splitter 38 as-is, without changing the polarization states thereof. Therefore, the beam Lse transparently passed through the polarized beam splitter 38 becomes the seed light S2. Accordingly, the P-polarized LBa (LBb) ultimately output from the light source apparatus LSa (LSb) has the same oscillation profile (time characteristic) as the seed light S2 from the DFB semiconductor laser element 32. In other words, in this case, the beam LBa (LBb) has a low peak intensity for the pulse and a temporally broad dull characteristic. Since the fiber optical amplifier 46 has a low amplification efficiency for the seed light S2 having such a low peak intensity, the beam LBa (LBb) emitted from the light source apparatus LSa (LSb) becomes light that is not amplified up to an amount of energy necessary for exposure. Accordingly, when considered from the point of view of exposure, the effect is substantially the same as the light source apparatus LSa (LSb) not outputting the beam LBa (LBb). In other words, the intensity of the spot light SP irradiating the substrate P is low level. However, in the period (non-exposure period) during which pattern exposure is not performed, the irradiation continues even when the unnecessary beam LBa (LBb) in the ultraviolet region derived from the seed light S2 has a slight intensity. Therefore, a pivoting chuck should be provided in the optical path from an emission window (omitted from the drawings) of the beam LBa (LBb) of the light source apparatus LSa (LSb) to directly behind the cylindrical lens CYb of each scanning unit U1 to U6, in order to prevent irradiation of the substrate P with an unnecessary beam in the ultraviolet region in a case where a drawing line SL1 to SL6 remains at the same position on the substrate P for a long time (e.g. a case where the substrate P has been stopped due to trouble in the transport system or the like).

On the other hand, in a case where the logic information of one pixel of the drawing bit sequence data SBa (SBb) applied to the drive circuit 36a is high ("1"), the electro-optic element (beam intensity modulating section) 36 changes the polarization states of the seed lights S1 and S2 and guides the resulting lights to the polarized beam splitter 38. Therefore, the beam Lse transparently passed through the polarized beam splitter 38 becomes the seed light S1. Accordingly, the beam LBa (LBb) emitted from the light source apparatus LSa (LSb) is generated by being derived from the seed light S1 from the DFB semiconductor laser element 30. Since the seed light S1 from the DFB semiconductor laser element 30 has a strong peak intensity, this light is efficiently amplified by the fiber optical amplifier 46, and the P-polarized beam LBa (LBb) output from the light source apparatus LSa (LSb) has the energy necessary for exposure of the substrate P. In other words, the intensity of the spot light SP irradiating the substrate P is high level.

In this way, since the electro-optic element 36 is provided as the drawing light modulator inside the light source apparatus LSa (LSb), by controlling one electro-optic element (beam intensity modulating section) 36, it is possible to modulate the intensity of the spot light SP used for scanning by the three scanning units U1 to U3 (U4 to U6) of a scanning module according to the pattern to be drawn. Accordingly, the beam LBa (LBb) emitted from the light source apparatus LSa (LSb) is a drawing beam that has been intensity-modulated.

Here, in the present first embodiment, even during the period when the drawing bit sequence data SBa (DL1 to DL3) and SBb (DL4 to DL6) is not applied to the drive circuit 36a, the beams LBa and LBb derived from the seed light S2 from the light source apparatuses LSa and LSb are emitted. Therefore, even when the effective scanning length (e.g. 30 mm) of a drawing line SLn is set in a range less than or equal to the maximum scanning length (e.g. 31 mm) over which scanning with the spot light SP is possible, actual scanning with the spot light SP is performed along the main scanning direction over the entire range of the maximum scanning length. However, the intensity of the spot light SP projected at positions outside the drawing lines SLn is low level. Accordingly, the drawing lines SLn in the present first embodiment are scanned while modulating the intensity of the spot light SP according to each piece of serial data DL1 to DL6, i.e. the drawing lines SLn refer to drawn scanning lines. Accordingly, the period during which scanning with the spot light SP is performed along the drawing lines SLn and the period during which the logic information of each pixel of the serial data DLn is output are substantially the same.

Figure 8A:
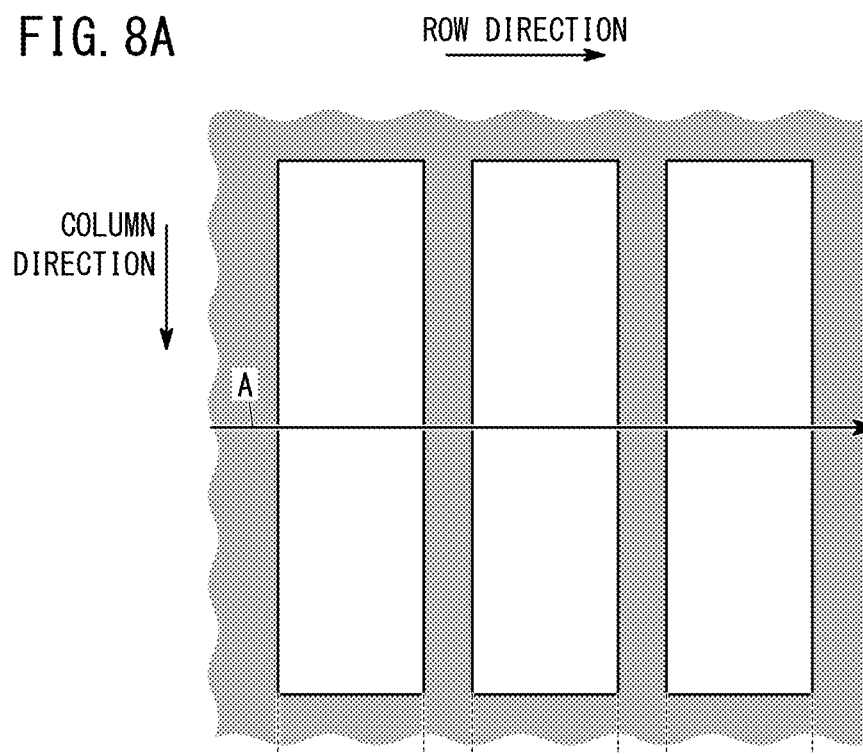
FIG. 8A is a diagram showing exemplary pattern data corresponding to a portion of a second pattern to be newly drawn by the scanning unit.
Figure 8B:
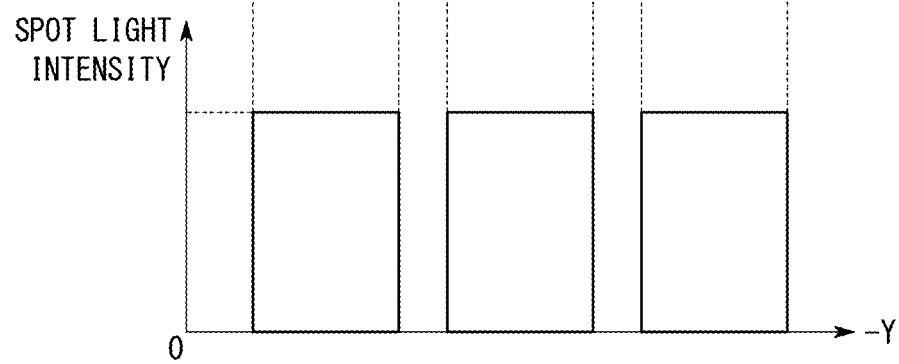
FIG. 8B is a diagram showing the intensity of the spot light in a case where the drawing with the spot light is performed along the drawing line, based on the serial data of a column at position A shown in FIG. 8A.
Figure 9A:
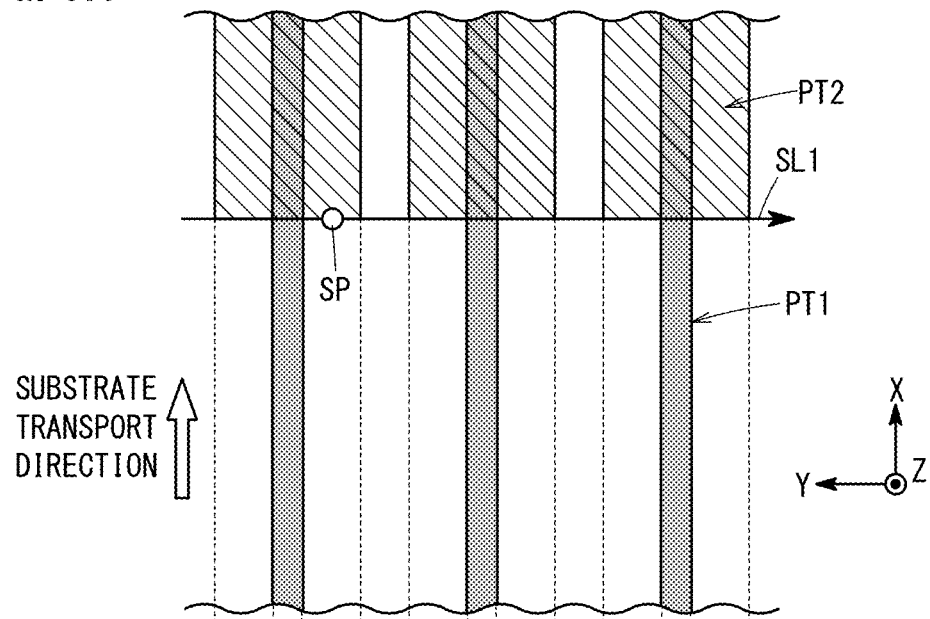
FIG. 9A is a diagram showing an example in which the pattern data shown in FIG. 8A is used to draw the second pattern overlapping the first pattern on the lower layer.
Figure 9B:
FIG. 9B is a diagram showing the intensity of the reflected light detected by the light detector then.

The following describes the acquisition of the information relating to the position and the information relating to the shape of the first pattern by the light detector DT1. FIG. 8A is a diagram showing exemplary pattern data corresponding to a portion of a second pattern PT2 to be newly drawn by the scanning unit U1, and FIG. 8B is a diagram showing the intensity of the spot light SP in a case where the drawing with the spot light SP (scanning with the spot light SP while modulating the intensity) is performed along the drawing line SL1, based on the serial data DL1 of a column at position A shown in FIG. 8A. In FIG. 8A, regions where the pixel logic information is "1" are shown in white, and regions where the pixel logic information is "0" are shown in gray. FIG. 9A is a diagram showing an example in which the pattern data shown in FIG. 8A is used to draw the second pattern PT2 overlapping the first pattern PT1 on the lower layer, and FIG. 9B is a diagram showing the intensity of the reflected light detected by the light detector DT1 at this time. FIG. 9A shows a state in which drawing with the spot light has been performed based on the column serial data DL1 at position A, and FIG. 9B shows the intensity of the reflected light detected by the light detector DT1 at this time. In FIG. 9A, regions shown in gray represent the first pattern PT1, and regions shown with diagonal lines represent the drawn second pattern PT2.

As shown in FIG. 8B, the intensity of the spot light SP of the beam LB1 projected onto the substrate P is high level in the regions where the pixel logic information is "1", and is zero (low level) in the regions where the pixel logic information is "0". As described above, although the spot light SP of the beam LB1 is projected onto the substrate P even when the pixel logic information is "0", when the intensity of this beam LB1 is considered from the point of view of exposure, the spot light SP can be considered as not substantially being projected, and therefore the intensity of the spot light SP in regions where the pixel logic information is "0" is treated as being zero. The same is true in FIG. 9B.

On the other hand, for the reflected light from the substrate P, as shown in FIG. 9B, in the region where there pixel logic information is "1", the intensity Ea of the reflected light of the spot light SP irradiating regions where the first pattern PT1 is formed is highest, and the intensity Eb of the reflected light of the spot light SP irradiating the regions where the first pattern PT1 is not formed is lower than the intensity Ea. Furthermore, in regions where the pixel logic information is "0" (i.e. regions not irradiated with the spot light SP), the intensity of the reflected light is zero. Accordingly, the image data (signal waveform) acquired using the light detector DTn is image data in which, in the regions overlapping with the drawn second pattern PT2, regions where the first pattern PT1 is formed are bright and regions where the first pattern PT1 is not formed are dark. Regions that do not overlap with the second pattern PT2 do not have the spot light SP projected thereon, and therefore these regions are darkest. In FIG. 9A and FIG. 9B, the substrate P is a PET sheet with a thickness of approximately 100 µm, and copper (Cu) with high reflectance and a thickness of tens of micrometers is deposited on the surface thereof as the first pattern PT1.

Accordingly, the control section 16 (specifically the measuring section 116 described further below with reference to FIG. 12) can measure the position where the first pattern PT1 is formed and the shape (including distortion and the like) thereof, by extracting regions where the luminance is higher than a threshold value, based on the image data acquired using the light detector DTn. Furthermore, the control apparatus 16 (measuring section 116) can also measure the relative positional relationship between the first pattern PT1 and the second pattern PT2 to be newly drawn, by measuring the position of the first pattern PT1. As described above, the position on the substrate P where the second pattern PT2 is to be drawn is identified using an alignment system, and therefore the position of the second pattern PT2 is known in advance and it is also possible to measure the position of the second pattern PT2 based on the image data acquired using the light detector DT1. The control section 16 (specifically the exposure control section 114 described further below with reference to FIG. 12) can perform the overlap accuracy and alignment accuracy of the second pattern PT2 relative to the first pattern PT1 with high accuracy by correcting the second pattern PT2 currently being drawn, based on at least one of the position of the first pattern PT1, the shape of the first pattern PT1, and the relative positional relationship between the second pattern PT2 and the first pattern PT1, which are measured by the measuring section 116. Each position of the first pattern PT1 in the X direction is represented by a count value based on the encoder heads EN2a and EN2b. Furthermore, the acquisition of the information relating to the position and the information relating to the shape of the first pattern by the light detector DT1 was described, but this description is similar for the light detectors DT2 to DT6.

Figure 10A:
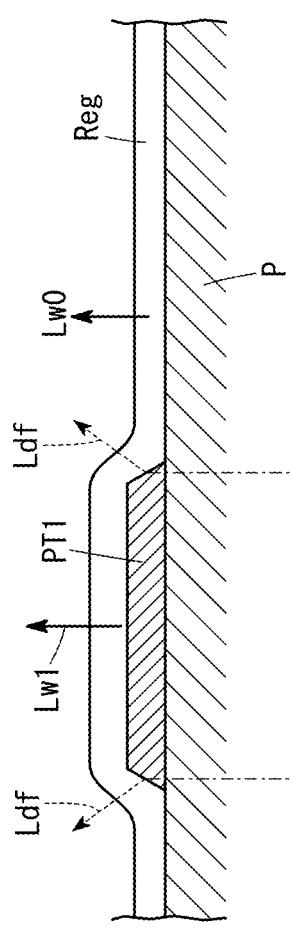
FIG. 10A is a diagram showing an exemplary cross-sectional configuration of the first pattern of the lower layer formed on the substrate.
Figure 10B:
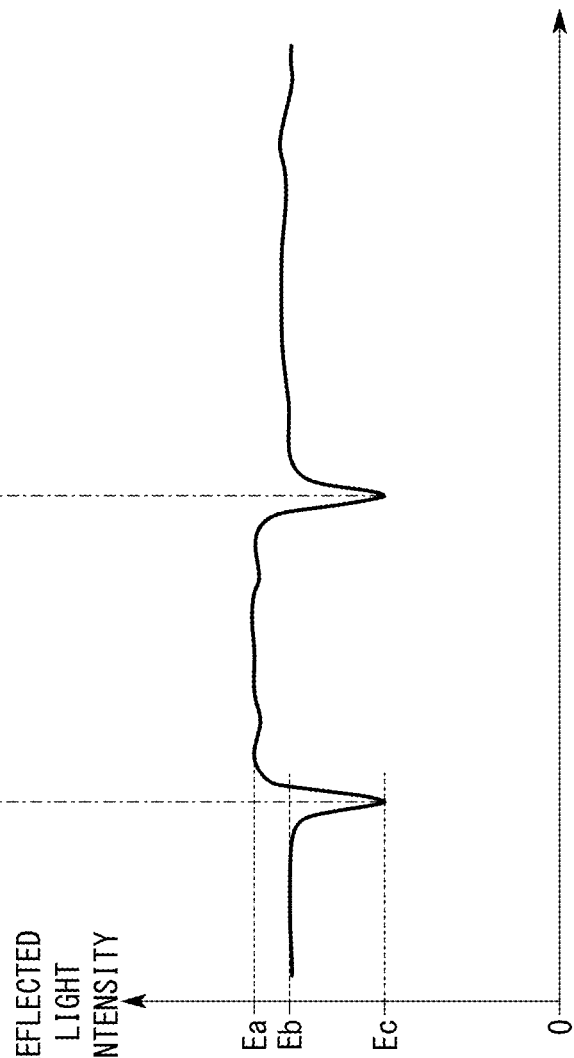
FIG. 10B is a diagram showing the intensity of the reflected light detected by the light detector then.

It should be noted that the image data (signal waveform) detected by the light detector DT1 is not limited to a case in which, as shown in FIG. 9B, the ratio (contrast) between the intensity Ea of the reflected light at a portion of the first pattern PT1 and the intensity Eb of the reflected light at a portion (substrate P) other than the first pattern is clearly high. For example, in a case where the reflectivity with respect to the wavelength of the beam LBn (spot light SP) for drawing is low due to the material of the first pattern PT1, the contrast (Ea/Eb) of the detected image data (signal waveform) is reduced. However, since the first pattern PT1 has a stepped structure with a predetermined thickness, at an edge portion of the first pattern PT1, the amount of diffused light is increased and the amount of normal reflected light reaching the light detector DT1 is reduced. FIGS. 10A and 10B are diagrams describing exemplary image data (signal waveform) obtained in such a situation.

As shown in FIG. 10A, in a state where the first pattern PT1 with a predetermined thickness and low reflectance is formed on the substrate P and a resist layer Reg with a predetermined thickness is uniformly formed on the first pattern PT1, when scanning is performed with the spot light SP in a manner to traverse the first pattern PT1, normal reflected light Lw0 is emitted from the substrate P, normal reflected light Lw1 is emitted from the first pattern PT1, and diffused light Ldf is emitted from the stepped edge portion of the first pattern PT1. The diffused light Ldf is emitted in a different direction than the normal reflected lights Lw0 and Lw1, which progress in a direction opposite the incidence direction of the beam Lbn, and does not reach the light detector DT1. Therefore, as shown in FIG. 10B, the waveform (signal waveform) of the image data that can be acquired from the light detector DT1 is in a state where there is no large difference between the intensity Eb of the normal reflected light Lw0 and the intensity Ea of the normal reflected light Lw1. Then, at the stepped edge portion of the first pattern PT1, the intensity Ec of the normal reflected light relatively drops in a trough shape, due to the generation of the diffused light Ldf. Even in the case of a signal waveform such as shown in FIG. 10B, the control apparatus 16 (measuring section 116) can analyze the edge position of the first pattern PT1.

It should be noted that, although the second pattern PT2 is drawn with a predetermined alignment accuracy relative to the first pattern PT1, there are also cases where the second pattern PT2 is drawn (exposed) in regions not overlapping with the first pattern PT1. In such a case, since the reflected light Lw1 from the first pattern PT1 cannot be obtained, it is impossible to measure the position and shape of the first pattern PT1 and the relative positional relationship between the first pattern PT1 and the second pattern PT2. In a case where there are many regions where the first pattern PT1 and the second pattern PT2 do not overlap, the alignment accuracy and overlap accuracy cannot be measured in the portions desired to be confirmed in the exposure region W (FIG. 4). Therefore, the pattern data for drawing the second pattern PT2 incorporates data of a dummy pattern that overlaps a portion of the first pattern PT1.

Figure 11:
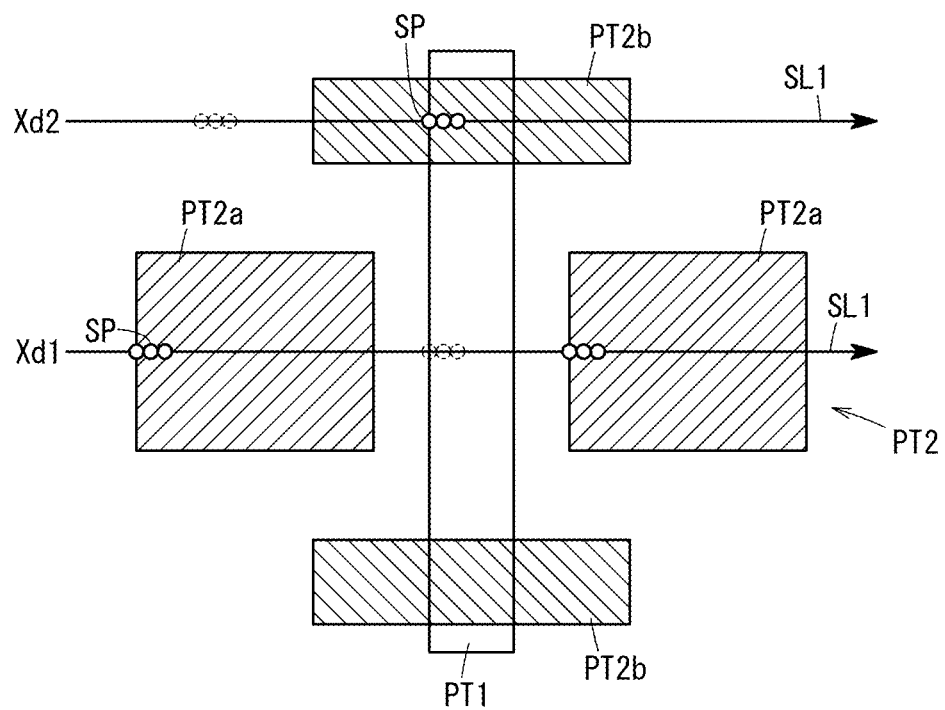
FIG. 11 is a diagram showing the first pattern of the lower layer already formed, and the second pattern aligned and exposed based on the pattern data of a second layer for overlapping exposure incorporating the dummy pattern data.

FIG. 11 is a diagram showing the first pattern PT1 of the lower layer already formed on the substrate P, and the second pattern PT2 aligned and exposed on the substrate P based on the pattern data of a second layer for overlapping exposure incorporating the dummy pattern data. In FIG. 11, as an example, a case is shown in which the second pattern PT2 (including the dummy pattern) is drawn by the scanning unit U1, and a case in which the drawing line SL1 resulting from the scanning with the beam LB1 (spot light SP) is positioned at each position Xd1 and Xd2 in the transport direction (X direction) of the substrate P.

In FIG. 11, the first pattern PT1 is a pattern forming an electronic device, and the second pattern PT2 drawn based on the pattern data includes a main pattern PT2a that forms an electronic device and a dummy pattern PT2b that does not form an electronic device. The dummy pattern PT2b has a position and shape such that the operation and capability of the electronic device are not affected, and is set at a predetermined interval distance relative to the main pattern PT2a. The main pattern PT2a does not overlap with the first pattern PT1, but at least a portion of the dummy pattern PT2b is drawn to overlap at least a portion of the first pattern PT1. In other words, on the drawing line SL1 at the position Xd1, the spot light SP of the beam LB1 generating pulsed light is projected only onto the drawing regions of the main pattern PT2a and is not projected onto the first pattern PT1. Furthermore, on the drawing line SL1 at the position Xd2, regardless of the presence of the main pattern PT2a, the spot light SP of the beam LB1 generating pulsed light is projected only on the drawing regions of the dummy pattern PT2b including a portion of the first pattern PT1.

In this way, even when the second pattern PT2 (main pattern PT2a) forming the electronic device does not overlap with the first pattern PT1, it is possible to expose the dummy pattern PT2b in a manner overlapping the first pattern PT1 by incorporating the dummy pattern data in the pattern data corresponding to the second pattern PT2. Accordingly, even in a case where the main pattern PT2a forming the electronic device is a region that does not overlap with the first pattern PT1, the control apparatus 16 (measuring section 116) can measure the position and shape of the first pattern PT1 in this region and the relative positional relationship between the first pattern PT1 and the second pattern PT2 in this region. In this way, it is possible to confirm the alignment accuracy and overlap accuracy, during exposure, of the second pattern PT2 relative to the first pattern PT1 with high accuracy, practically in real time.

Furthermore, a dummy pattern may be provided in the first pattern PT1 of the lower layer, in a manner to overlap with the second pattern PT2 being newly drawn. FIG. 12 is a diagram showing the first pattern PT1 of the lower layer already formed on the substrate P, and the second pattern PT2 aligned and exposed on the substrate P based on the pattern data of a second layer for exposure. The first pattern PT1 includes a main first pattern PT1a forming an electronic device and a dummy pattern PT1b that does not form an electronic device, and the second pattern PT2 drawn based on the pattern data is a main pattern forming the electronic device. The main pattern PT1a does not overlap with the second pattern PT2, but at least a portion of the dummy pattern PT1b is formed to overlap with at least a portion of the second pattern PT2. Here as well, the dummy pattern PT1b has a position and shape such that the operation and capability of the electronic device are not affected, and is set at a predetermined interval distance relative to the main pattern PT1a.

Figure 12:
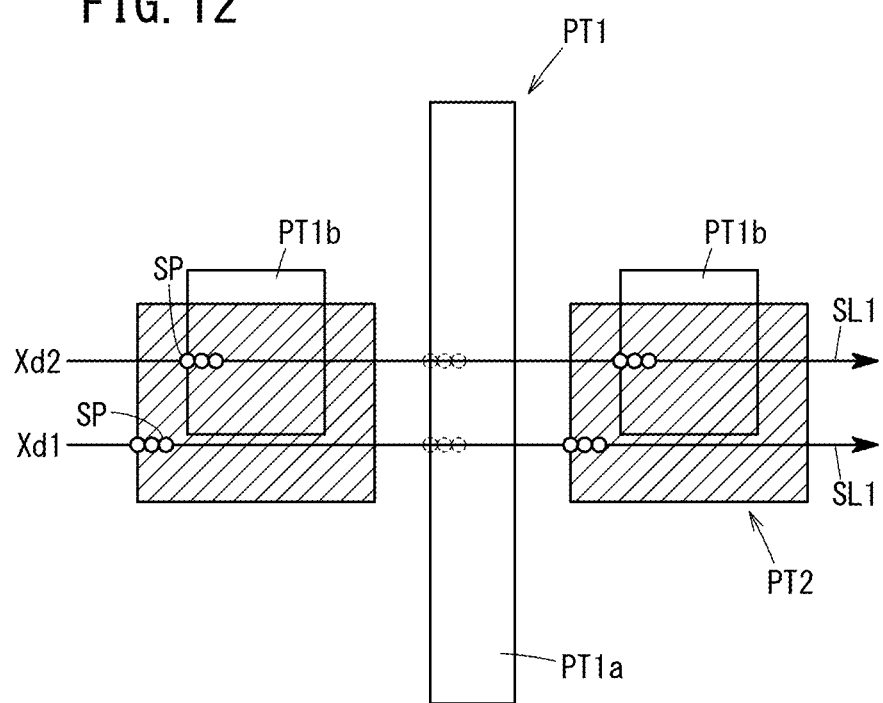
FIG. 12 is a diagram showing the first pattern of the lower layer formed on the substrate, and the second pattern aligned and exposed with respect to the first pattern based on the pattern data.

In FIG. 12 as well, as an example, a case is shown in which the second pattern PT2 (including the main pattern PT2a) is drawn by the scanning unit U1, and a case is shown in which the drawing line SL1 resulting from the scanning with the beam LB1 (spot light SP) is positioned at each position Xd1 and Xd2 in the transport direction (X direction) of the substrate P. On the drawing lines SL1 and SL2 at each of the positions Xd1 and Xd2, the spot light SP of the beam LB1 generating pulsed light is projected only onto the drawing regions of the main pattern PT2a and is not projected onto the main pattern PT1a of the first pattern PT1. However, in order to expose the main pattern PT2a on the drawing line SL1 at the position Xd2, the spot light SP is also projected onto the dummy pattern PT1b of the first pattern PT1 while the spot light SP of the beam LB1 generating pulsed light is being projected. In this way, even when the first pattern PT1 (main pattern PT1a) forming the electronic device does not overlap with the second pattern PT2, it is possible to expose a portion of the second pattern PT2 overlapping with the dummy pattern PT1b by providing the dummy pattern PT1b in advance in the first pattern PT1. Accordingly, even in the case of regions where the main pattern PT1a forming the electronic device does not overlap with the second pattern PT2, the control apparatus 16 (measuring section 116) can measure the position and shape of the first pattern PT1 in this region and the relative positional relationship between the first pattern PT1 and the second pattern PT2 in this region. In this way, it is possible to confirm the alignment accuracy and overlap accuracy, during exposure, of the second pattern PT2 relative to the first pattern PT1 with high accuracy practically in real time.

Furthermore, the dummy pattern PT1b may be provided to the first pattern PT1 of the lower layer, and also the dummy data may be incorporated in the pattern data for drawing the second pattern PT2. In this case, the first pattern PT1 includes the main pattern PT1a forming the electronic device and the dummy pattern PT1b that does not affect the operation and capability of the electronic device. Furthermore, the second pattern PT2 drawn according to the pattern data includes the main pattern PT2a forming the electronic device and the dummy pattern PT2b that does not affect the operation and capability of the electronic device. Accordingly, in this case, at least a portion of the dummy pattern PT2b is exposed in a manner to overlap with at least a portion of the dummy pattern PT1b. As described above, by performing exposure with the dummy pattern PT1*b* formed in advance on the substrate P and the dummy pattern PT2*b* drawn on the substrate P at least partially overlapping, it is possible to measure the relative positional relationship between the first pattern PT1 and the second pattern PT2 in this region. In this way, the alignment accuracy and overlap accuracy of the second pattern PT2 relative to the first pattern PT1 can be confirmed with high accuracy.

Figure 13:
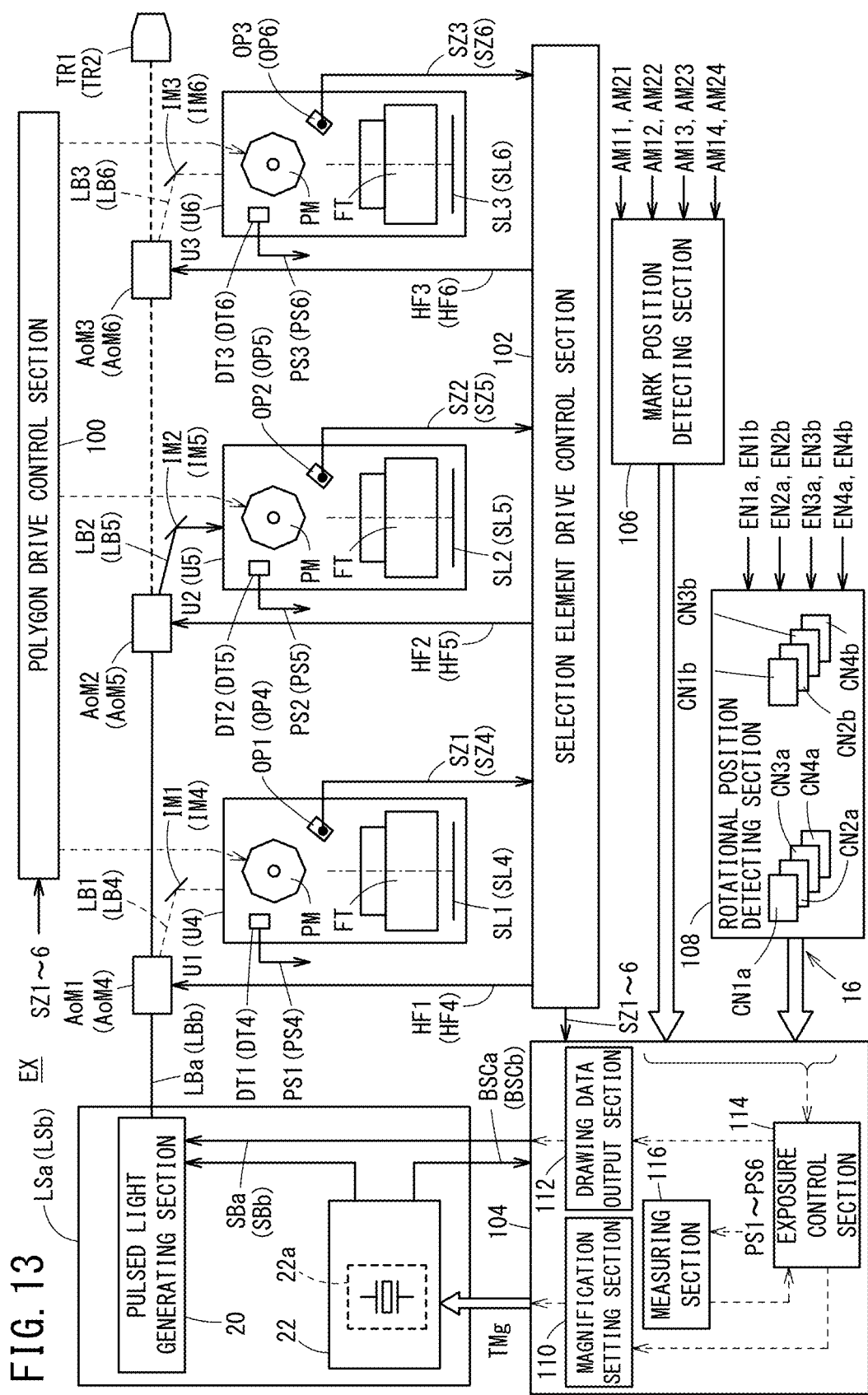
FIG. 13 is a block diagram showing a configuration of an electrical control system of the exposure apparatus.

FIG. 13 is a block diagram showing a configuration of an electrical control system of the exposure apparatus EX. The control apparatus 16 of the exposure apparatus EX includes a polygon drive control section 100, a selection element drive control section 102, the integrated control section 104, the mark position detecting section 106, and the rotational position detecting section 108. The origin point signal SZn (SZ1 to SZ6) output by the origin point sensor OPn (OP1 to OP6) of each scanning unit Un (U1 to U6) is input to the polygon drive control section 100 and the selection element drive control section 102. Furthermore, the photoelectric signal (detection signal) PSn (PS1 to PS6) detected by the light detector DTn (DT1 to DT6) of each scanning unit Un (U1 to U6) is input to the integrated control section 104 (measuring section 116). In the example shown in FIG. 13, a state is shown in which the beam LBa (LBb) from the light source apparatus LSa (LSb) is diffracted by the selection optical element AOM2 (AOM5), and the resulting beam LB2 (LB5) that is first-order diffracted light is incident to the scanning unit U2 (U5)

The polygon drive control section 100 performs drive control of the rotation of the polygon mirror PM of each scanning unit Un (U1 to U6). The polygon drive control section 100 includes a rotational drive source (motor, decelerator, or the like) RM (see FIG. 5) that drives the polygon mirror of each scanning unit Un (U1 to U6), and performs drive control of the rotation of the polygon mirror PM by performing drive control of the rotation of this motor. The polygon drive control section 100 causes each polygon mirror PM of the three scanning units Un (U1 to U3 and U4 to U6) in each scanning module to rotate synchronously, such that the rotational angle positions of the polygon mirrors PM of the three scanning units Un (U1 to U3 and U4 to U6) in each scanning module have a predetermined positional relationship. Specifically, the polygon drive control section 100 controls the rotation of the polygon mirrors PM of the plurality of scanning units Un (U1 to U6) such that the rotational velocities (number of revolutions) Vp of the polygon mirrors PM of the three scanning units Un (U1 to U3 and U4 to U6) in each scanning module are the same as each other and the phases of the rotational angle positions are each shifted by a constant angle. The rotational velocities Vp of the polygon mirrors PM of each scanning unit Un (U1 to U6) are all the same.

In the present first embodiment, as described above, the rotational angle α of a polygon mirror PM contributing to the actual scanning is 15°, and therefore the scanning efficiency of an octagonal polygon mirror PM having eight reflective surfaces RP is ⅓. In the first scanning module, the scanning with the spot light SP by the three scanning units Un is performed in the order of U1→U2→U3. Accordingly, the polygon mirror PM in each of the scanning units U1 to U3 is controlled by the polygon drive control section 100 to be driven at constant rotational speeds in a state where, in the order described above, the phases of the rotational angle positions of the polygon mirrors PM of the respective three scanning units U1 to U3 are shifted by 15° each. Furthermore, in the second scanning module, the scanning with the spot light SP by the three scanning units Un is performed in the order of U4→U5→U6. Accordingly, the polygon mirror PM in each of the scanning units U4 to U6 is controlled by the polygon drive control section 100 to be driven at constant rotational speeds in a state where, in the order described above, the phases of the rotational angle positions of the polygon mirrors PM of the respective three scanning units U4 to U6 are shifted by 15° each.

Specifically, for the first scanning module, for example, the polygon drive control section 100 controls the rotational phase of the polygon mirror PM of the scanning unit U2 such that, with the origin point signal SZ1 from the origin point sensor OP1 of the scanning unit U1 as a reference, the origin point signal SZ2 from the origin point sensor OP2 of the scanning unit U2 is emitted with a delay of a time Ts. The polygon drive control section 100 controls the rotational phase of the polygon mirror PM of the scanning unit U3 such that, with the origin point signal SZ1 as a reference, the origin point signal SZ3 from the origin point sensor OP3 of the scanning unit U3 is emitted with a delay of 2×time Ts. This time Ts is the time in which a polygon mirror PM rotates by 15° (maximum scanning time of the spot light SP), and in the present first embodiment, is approximately 206.666 . . . μsec (=Tpx×⅓=620 [μsec]/3). In this way, the phase differences between the rotational angle positions of the polygon mirrors PM in the respective scanning units U1 to U3 are each in a state shifted by 15° in the order of U1, U2, and U3. Accordingly, the three scanning units U1 to U3 of the first scanning module can perform scanning with the spot light SP in the order of U1→U2→U3.

Similarly, for the second scanning module, for example, the polygon drive control section 100 controls the rotational phase of the polygon mirror PM of the scanning unit U5 such that, with the origin point signal SZ4 from the origin point sensor OP4 of the scanning unit U4 as a reference, the origin point signal SZ5 from the origin point sensor OP5 of the scanning unit U5 is emitted with a delay of a time Ts. The polygon drive control section 100 controls the rotational phase of the polygon mirror PM of the scanning unit U6 such that, with the origin point signal SZ4 as a reference, the origin point signal SZ6 from the origin point sensor OP6 of the scanning unit U6 is emitted with a delay of 2×time Ts. In this way, the phase differences between the rotational angle positions of the polygon mirrors PM in the respective scanning units U4 to U6 are each in a state shifted by 15° in the order of U4, U5, and U6. Accordingly, the three scanning units Un (U4 to U6) of the second scanning module can perform scanning with the spot light SP in the order of U4→U5→U6.

The selection element drive control section (beam switching drive control section) 102 controls the selection optical elements AOMn (AOM1 to AOM3 and AOM4 to AOM6) of each optical element module of the beam switching section BDU, to distribute the beams LB (LBa and LBb) from the light source apparatuses LS (LSa and LSb) to the three scanning units Un (U1 to U3 and U4 to U6) of each scanning module in order, from the start of the scanning with the spot light SP by one scanning unit Un of each scanning module to the start of the subsequent scanning. From the start of the scanning with the spot light SP by one scanning unit Un of each scanning module to the start of the subsequent scanning, a polygon mirror PM rotates 45°, and this time interval is the time Tpx (=3×Ts).

Specifically, when the origin point signal SZn (SZ1 to SZ6) is emitted, the selection element drive control section 102 applies a drive signal (high frequency signal) HFn (HF1 to HF6) to the selection optical element AOMn (AOM1 to AOM6) corresponding to the scanning unit Un (U1 to U6)

that emitted the origin point signal SZn (SZ1 to SZ6), after a certain time (ON time Ton) from when the origin point signal SZn was emitted. In this way, the selection optical element AOMn to which the drive signal (high frequency signal) is applied enters the ON state for the ON time Ton, and can cause the beam LBn to be incident to the corresponding scanning unit Un. The ON time Ton is a time equal to or less than Ts. Furthermore, since the beam LBn is incident to the scanning unit Un that emitted the origin point signal SZn, the beam LBn can be made incident to a scanning unit Un that can perform the scanning with the spot light SP. Furthermore, the selection element drive control section 102 outputs the acquired origin point signals SZn (SZ1 to SZ6) to the integrated control section 104.

The origin point signals SZ1 to SZ3 emitted by the three scanning units U1 to U3 of the first scanning module are emitted in the order of SZ1→SZ2→SZ3, at intervals of the time Ts. Therefore, the drive signals (high frequency signals) HF1 to HF3 are applied for just the ON time Ton to each selection optical element AOM1 to AOM3 of the first optical element module in the order of AOM1→AOM2→AOM3, at time intervals of the time Ts. Accordingly, the first optical element module (AOM1 to AOM3) can switch the one scanning unit Un to which the beam LBn (LB1 to LB3) from the light source apparatus LSa is incident, in the order of U1→U2→U3 and at time intervals of the time Ts. In this way, the scanning unit Un performing the scanning with the spot light SP is switched in the order of U1→U2→U3, at time intervals of the time Ts. Furthermore, during the time (Tpx=3×Ts) from the start of scanning with the spot light SP by the scanning unit U1 to the start of the subsequent scanning, the beam LBn (LB1 to LB3) from the light source apparatus LSa can be made incident to any one of the three scanning units Un (U1 to U3) in order.

Similarly, the origin point signals SZ4 to SZ6 emitted by the three scanning units U4 to U6 of the second scanning module are emitted in the order of SZ4→SZ5→SZ6, at intervals of the time Ts. Therefore, the drive signals (high frequency signals) HF4 to HF6 are applied for just the ON time Ton to each selection optical element AOM4 to AOM6 of the second optical element module in the order of AOM4→AOM5→AOM6, at time intervals of the time Ts. Accordingly, the second optical element module (AOM4 to AOM6) can switch the one scanning unit Un to which the beam LBn (LB4 to LB6) from the light source apparatus LSb is incident, in the order of U4→U5→U6 and at time intervals of the time Ts. In this way, the scanning unit Un performing the scanning with the spot light SP is switched in the order of U4→U5→U6, at time intervals of the time Ts. Furthermore, during the time (Tpx=3×Ts) from the start of scanning with the spot light SP by the scanning unit U4 to the start of the subsequent scanning, the beam LBn (LB4 to LB6) from the light source apparatus LSb can be made incident to any one of the three scanning units Un (U4 to U6) in order.

As shown in FIG. 13, the integrated control section (beam control section) 104 is a component for controlling the intensity modulation of the beam LB and the magnification of the drawing lines SLn drawn by the spot light SP of the beam LB, the correction of the shape of the pattern to be drawn, and the like. The integrated control section 104 includes a magnification setting section 110, a drawing data output section 112, an exposure control section 114, and the measuring section 116 that inputs the detection signal PSn (PS1 to PS6) from the light detector DTn (DT1 to DT6) in each scanning unit Un (U1 to U6). The magnification setting section 110 stores magnification correction information TMg sent from the exposure control section 114, and also outputs the magnification correction information TMg to the signal generating section 22a of the control circuit 22 of each light source apparatus (LSa and LSb). The clock generating section 60 of the signal generating section 22a generates the clock signal LTC with the oscillation frequency Fa corresponding to this magnification correction information TMg. Therefore, it is possible to change the oscillation frequency of the pixel shift pulse BSC (BSCa and BSCb) or to minutely change the oscillation frequency of the clock signal LTC at places during one scanning with the beam LBn, according to the drawing magnification correction information TMg. The measuring section 116 includes an analog/digital converter (A/D converter) that inputs the detection signal PSn from each light detector DTn, and digitally samples and temporarily stores the intensity of the waveform of the detection signal PSn (e.g. FIG. 9B and FIG. 10B), in response to each clock pulse of the clock signal LTC or each pulse of the pixel shift pulse BSCa (BSCb) generated by the control circuit 22 (signal generating section 22a) in the light source apparatus LSa (LSb) of FIG. 7.

The drawing data output section 112 stores the pattern data corresponding to each of the plurality of scanning units Un (U1 to U6) in a storage section, not shown in the drawings, provided within the drawing data output section 112. The drawing data output section 112 outputs one column of serial data DLn (DL1 to DL3) corresponding to the scanning unit Un that emitted the origin point signal SZn (the scanning unit UN that is to perform scanning with the spot light SP from now) from among the three scanning units Un (U1 to U3) of the first scanning module, to the drive circuit 36a of the light source apparatus LSa as the drawing bit sequence data SBa. Furthermore, the drawing data output section 112 outputs one column of serial data DLn (DL4 to DL6) corresponding to the scanning unit Un that emitted the origin point signal SZn (the scanning unit UN that is to perform scanning with the spot light SP from now) from among the three scanning units Un (U4 to U6) of the second scanning module, to the drive circuit 36a of the light source apparatus LSb as the drawing bit sequence data SBb. For the first scanning module, the order of the scanning units U1 to U3 performing scanning with the spot light SP is U1→U2→U3, and therefore the drawing data output section 112 outputs the serial data DL1 to DL3 repeated in the order of DL1→DL2→DL3 as the drawing bit sequence data SBa. For the second scanning module, the order of the scanning units U4 to U6 performing scanning with the spot light SP is U4→U5→U6, and therefore the drawing data output section 112 outputs the serial data DL4 to DL6 repeated in the order of DL4→DL5→DL6 as the drawing bit sequence data SBb.

Furthermore, the drawing data output section 112 controls the output timing of the serial data DLn (DL1 to DL6) according to the delay time Tdn (Td1 to Td6) sent from the exposure control section 114. Specifically, the drawing data output section 112 outputs the serial data DLn (DL1 to DL6) corresponding to the scanning unit Un (U1 to U6) that emitted the origin point signal SZn (SZ1 to SZ6), after the delay time Tdn (Td1 to Td6) has passed from the emission timing of the origin point signal SZn (SZ1 to SZ6). For example, when the origin point sensor OP1 emits the origin point signal SZ1, the drawing data output section 112 outputs the serial data DL1 after the delay time Td1 has passed from the emission timing of the origin point signal SZ1. Similarly, when the origin point sensors OP2 to OP6 emit the origin point signals SZ2 to SZ6, the drawing data output section 112 outputs the serial data DL2 to DL6 after the delay times Td2 to Td6 have passed from the emission timings of the origin point signals SZ2 to SZ6. When no correction is performed on the pattern being drawn, the delay time Tdn (Td1 to Td6) is set to the initial value. This initial value is a value that causes the center point of the drawing line SLn (SL1 to SL6) to match the center (center point) of the maximum scanning length of the drawing line SLn (SL1 to SL6). By changing this delay time Tdn (Td1 to Td6), the exposure control section 114 can shift the position on the substrate P of the drawing line SLn (SL1 to SL6) in the main scanning direction (Y direction).

This serial data DLn (DL1 to DL6) is formed by the logic information of a plurality of pixels lined up in the row direction, as described above. Therefore, the drawing data output section 112 outputs the logic information of the plurality of pixels of the output serial data DL1 to DL3 to the drive circuit 36a of the light source apparatus LSa sequentially from the first row, according to the pixel shift pulse BSCa sent from the light source apparatus LSa. Similarly, the drawing data output section 112 outputs the logic information of the plurality of pixels of the output serial data DL4 to DL6 to the drive circuit 36a of the light source apparatus LSb sequentially from the first row, according to the pixel shift pulse BSCb sent from the light source apparatus LSb. Specifically, the drawing data output section 112 includes a Y address counter, which is not shown in the drawings, and designates a Y address value (count value) in the row direction (Y direction) of the output pixel logic information, by using this Y address counter to count each of the pixel shift pulses BSCa and BSCb. The drawing data output section outputs the pixel logic information at the designated Y address values (count values). In this way, the output pixel logic information is shifted in the row directions, according to the pixel shift pulse BSCa and BSCb.

The column-direction shift of the serial data DL1 to DL3 output to the drive circuit 36a of the light source apparatus LSa is performed by, for example, an X address counter, not shown in the drawings, provided to the drawing data output section 112. These X address counters are provided correspondingly respectively to the pieces of serial data DL1 to DL3 (or scanning units U1 to U3), and designate X address values (count values) in the column direction of the pieces of serial data DL1, DL2, and DL3 to be output next by counting the origin point signals SZ2, SZ3, and SZ1 of the origin point sensors OP2, OP3, and OP1 of the scanning units U2, U3, and U1 that are to perform scanning next. For example, the X address counter provided corresponding to the serial data DL1 (or scanning unit U1), after the output of the serial data DL1 has ended, selects the X address value (count value) in the column direction of the serial data DL1 to be output next, by counting the origin point signal SZ2 of the origin point sensor OP2 of the scanning unit U2 that is to perform scanning next.

Similarly, the column-direction shift of the serial data DL4 to DL6 output to the drive circuit 36a of the light source apparatus LSb is performed by, for example, an X address counter, not shown in the drawings, provided to the drawing data output section 112. These X address counters are provided corresponding respectively to the pieces of serial data DL4 to DL6 (or scanning units U4 to U6), and designate X address values (count values) in the column direction of the pieces of serial data DL4, DL5, and DL6 to be output next by counting the origin point signals SZ5, SZ6, and SZ4 of the origin point sensors OP5, OP6, and OP4 of the scanning units U5, U6, and U4 that are to perform scanning next. For example, the X address counter provided corresponding to the serial data DL4 (or scanning unit U4), after the output of the serial data DL4 has ended, selects the X address value (count value) in the column direction of the serial data DL4 to be output next, by counting the origin point signal SZ5 of the origin point sensor OP5 of the scanning unit U5 that is to perform scanning next.

The exposure control apparatus 114 shown in FIG. 13 is a component that controls the magnification setting section 110 and the drawing data output section 112. Position information of the marks MKm (MK1 to MK4) on the installation direction lines Lx1 and Lx4 detected by the mark position detecting section 106 and rotational angle position information (count values based on the counter circuits CN1a to CN4a and CN1b to CN4b) of the rotating drum DR on the installation direction lines Lx1 to Lx4 detected by the rotational position detecting section 108 are input to the exposure control section 114. The exposure control section 114 detects (determines) the start position of the drawing exposure for the exposure region W in the sub scanning direction (X direction) of the substrate P, based on the position information of the marks MKm (MK1 to MK4) on the installation direction line Lx1 and the rotational angle position information (count values based on the counter circuits CN1a and CN1b) of the rotating drum DR on the installation direction line Lx1.

The exposure control section 114 judges whether the drawing exposure start position of the substrate P has been transported to the drawing lines SL1, SL3, and SL5 on the installation direction line Lx2, based on the rotational angle position of the rotating drum DR on the installation direction line Lx1 at the time when the drawing exposure start position was detected and the rotational angle position (count values based on the counter circuits CN2a and CN2b) on the installation direction line Lx2. Upon judging that the drawing exposure start position has been transported to the drawing lines SL1, SL3, and SL5, the exposure control section 114 controls the magnification setting section 110, the drawing data output section 112, and the like to cause the scanning units U1, U3, and U5 to start drawing by scanning with the spot light SP. The drawing performed by the scanning units U1, U3, and U5 scanning with the spot light SP is started by outputting the serial data DL1, DL3, and DL5 to the drive circuits 36a of the light source apparatuses LSa and LSb.

After this, the exposure control section 114 judges whether the drawing exposure start position of the substrate P has been transported to the drawing lines SL2, SL4, and SL6 on the installation direction line Lx3, based on the rotational angle position of the rotating drum DR on the installation direction line Lx1 at the time when the drawing exposure start position was detected and the rotational angle position (count values based on the counter circuits CN3a and CN3b) on the installation direction line Lx3. Upon judging that the drawing exposure start position has been transported to the drawing lines SL2, SL4, and SL6, the exposure control section 114 controls the magnification setting section 110 and the drawing data output section 112, and further causes the scanning units U2, U4, and U6 to start drawing by scanning with the spot light SP. The drawing performed by the scanning units U2, U4, and U6 scanning with the spot light SP is started by outputting the serial data DL2, DL4, and DL6 to the drive circuits 36a of the light source apparatuses LSa and LSb.

Upon judging that the drawing exposure end position of the exposure region W in the sub scanning direction (X direction) of the substrate P has reached the drawing lines SL1, SL3, and SL5, the exposure control section 114 ends the scanning with the spot light SP by the scanning units U1, U3, and U5. Furthermore, upon judging that the drawing exposure end position of the exposure region W in the sub scanning direction (X direction) of the substrate P has reached the drawing lines SL2, SL4, and SL6, the exposure control section 114 ends the scanning with the spot light SP by the scanning units U2, U4, and U6.

Furthermore, the exposure control section 114 consecutively calculates the distortion (deformation) of the substrate P or exposure region W, based on the position information of the marks MKm (MK1 to MK4) on the installation direction lines Lx1 and Lx4 detected by the mark position detecting section 106 and the rotational angle position information of the rotating drum DR on the installation direction lines Lx1 and Lx4 detected by the rotational position detecting section 108. For example, in a case where the substrate P is deformed by receiving a large amount of tension in the long dimension direction or undergoing a heating process, the shape of the exposure region W (first pattern PT1 of the lower layer) also distorts (deforms) and the arrangement of the marks MKm (MK1 to MK4) also enters a distorted (deformed) state and does not remain as the rectangular shape such as shown in FIG. 4. In a case where the substrate P or the exposure region W (first pattern PT1 on the lower surface) is distorted, a relative positional error occurs between the first pattern PT1 and the second pattern PT2 to be newly drawn. Accordingly, the exposure control section 114 measures (estimates) at least one of the estimated positional error and shape error (distortion error) of the first pattern PT1 or the relative overlap error between the first pattern PT1 and the second pattern PT2 to be drawn, based on the position of the marks MKm detected on the substrate P by the alignment system. The drawing state of the second pattern PT2 being newly drawn is then corrected based on at least one of the estimated positional error, shape error, and overlap error. Specifically, the exposure control section (correcting section) 114 corrects the drawing state of the second pattern PT2 by correcting at least one of the pattern data corresponding to the second pattern PT2, the drawing timing of the beam LBs (LBa, LBb, and LBn) by the electro-optic element 36, the magnification of the second pattern PT2, and the inclination of the drawing line SLn (SL1 to SL6). In this way, the second pattern PT2 is exposed in an overlapping manner while in a corrected state realized by reducing the overlap error, according to the positional error, shape error, or the like of the first pattern PT1 in the exposure region W estimated based on the arrangement of the marks MKm formed on the substrate P.

By having the exposure control section 114 correct the pattern data stored in the drawing data output section 112, it is possible to correct the shape and the drawing position of the second pattern PT2 drawn and exposed according to the pattern data. By having the exposure control section 114 correct the delay time Tdn (Td1 to Td6) output to the drawing data output section 112, the drawing timing of the beam LB by the electro-optic element 36 is corrected and the position of the drawing line SLn (SL1 to SL6) on the substrate P is shifted in the main scanning direction. In this way, it is possible to correct the shape and drawing position of the second pattern PT2 that is drawn and exposed. By having the exposure control section 114 generate the magnification correction information TMg output to the magnification setting section 110, it is possible to correct the magnification (size) of the second pattern PT2 that is drawn and exposed. Furthermore, by gradually changing the magnification correction information TMg for every column of serial data DLn (DL1 to DL6), i.e. for every scanning (or every set of a plurality of scannings) with the spot light SP along the drawing line SLn (SL1 to SL6), it is possible to intentionally distort the shape of the second pattern PT2 that is drawn and exposed. By having the exposure control section 114 generate corrected inclination angle information for controlling the actuators provided for pivoting the plurality of scanning units Un (U1 to U6) respectively on the irradiation central axes Len (Le1 to Le6), it is possible to correct the inclination of the drawing lines SLn (SL1 to SL6) relative to the Y direction. In this way, it is possible to correct the shape and the drawing position of the second pattern PT2 that is drawn and exposed.

In this way, by having the exposure control section 114 correct the second pattern PT2 that is newly drawn, according to the first pattern PT1 (exposure region W) formed on the lower layer, it is possible to improve the alignment accuracy and the overlap accuracy. However, in the alignment system (the alignment microscopes AM1m and AM2m, the encoder heads ENja and ENjb, and the scale sections SDa and SDb), deformation of the first pattern PT1 of the lower layer is detected using the marks MKm (specifically the marks MKm formed around the exposure region W) formed having a constant positional relationship with the first pattern PT1. Therefore, deformation or the like inside the first pattern PT1 (exposure region W) is not considered. Accordingly, in the correction of the second pattern PT2 using the alignment system, there is the possibility of a remaining relative positional error (overlap error) between the first pattern PT1 formed on the lower layer and the second pattern PT2 being newly drawn, and there are also cases of insufficient alignment accuracy and overlap accuracy between the first pattern PT1 and the second pattern PT2. In particular, in the joining portions of the pattern exposed by the respective drawing lines SLn of the scanning units Un, it is necessary for both the overlap accuracy and this joining accuracy to be kept within an allowable range.

Therefore, in the present first embodiment, while the position correction based on the measurement results from the alignment system (alignment microscopes AM11 to AM14) and the actual drawing and exposure of the second pattern PT2 are performed, the measuring section 116 provided to the integrated control section 104 measures the relative positional relationship between the first pattern PT1 formed on the substrate P and the second pattern PT2 being drawn and exposed, or measures the position and shape of the first pattern PT1, based on the optical signal (detection signal) PSn detected by the light detector DTn (DT1 to DT6). The measurement of the relative positional relationship between the first pattern PT1 that has already been formed on the substrate P and the second pattern PT2 to be drawn and exposed is performed by obtaining each position of the first pattern PT1 (main pattern PT1a or dummy pattern PT1b) and of the second pattern PT2 (main pattern PT2a or dummy pattern PT2b) to be drawn and exposed, along with the change position of the waveform in the optical signal (detection signal) PSn, in association with the count value of the shift pulse of the pixel shift pulse BSCa (BSCb) or the clock pulse of the clock signal LTC. This relative positional relationship between the first pattern PT1 and the second pattern PT2 is a positional error (remaining positional error) that remains despite the correction based on the mark position measurement results obtained with the alignment system. The exposure control section 114 consecutively corrects the second pattern PT2 to be subsequently drawn after the measurement of the remaining positional error, using at least one of the remaining positional error of the relative positional relationship between the first pattern PT1 and the second pattern PT2 measured by the measuring section 116 or the shape information of the first pattern PT1. The correction of the second pattern PT2 in this case as well is performed by correcting at least one of the pattern data corresponding to the second pattern PT2, the drawing timing of the beam LBs (LBa, LBb, and LBn) by the electro-optic element 36, the magnification of the second pattern PT2, and the inclination of the drawing line SLn (SL1 to SL6). In this way, the remaining positional error between the first pattern PT1 and the second pattern PT2 can be restricted, and it is possible to continuously perform exposure of long patterns (the long exposure regions W) while keeping the overlap accuracy and the alignment accuracy between the first pattern PT1 and the second pattern PT2 within an allowable range over a long time period.

In the first embodiment described above, the drawing position of the second pattern PT2 is corrected based on the measurement results of the alignment system and then the remaining positional error of the exposure state (overlapping state) of the second pattern PT2 is obtained and consecutively corrected by the measuring section 116, but in a case where the measurement results of the alignment system are already within the allowable range for the overlap accuracy, it is acceptable to continue with only the measurement of the remaining positional error by the measuring section 116, without correcting the drawing position of the second pattern PT2, and it is enough to confirm whether the overlap accuracy of the second pattern PT2 actually being exposed is within the allowable range.

In this way, the exposure apparatus EX of the first embodiment is a device that draws a pattern on the substrate P by projecting the beam LBn onto the substrate P and performing scanning in the main scanning direction while performing intensity modulation on the beam LBn from the light source apparatus LS according to the pattern information, and comprises a scanning unit Un that includes a beam scanning section having a polygon mirror PM deflecting the beam LBn from the light source apparatus LS in order to scan with the beam LBn in the main scanning direction, and a light detector DTn that photoelectrically detects a reflected beam emitted when the beam LBn is projected onto the substrate P, via the polygon mirror PM of the beam scanning section; an electro-optic element 36 that controls the intensity modulation of the beam LBn according to the pattern information, such that at least a portion of the second pattern PT2 to be newly drawn is drawn overlapping with at least a portion of the first pattern PT1 already formed of a specified material on the substrate P; a measuring section 116 that measures at least one of the drawing position and shape of the first pattern PT1, or the relative positional relationship between the first pattern PT1 and the second pattern PT2, based on the detection signal PS output from the light detector DTn while the second pattern PT2 is being drawn on the substrate P. In this way, while the second pattern PT2 continues to actually be drawn, it is possible to continue confirming, with high accuracy, the relative positional relationship (overlap accuracy) between the first pattern PT1 already formed on the substrate P and the second pattern PT2 to be newly exposed.

The exposure apparatus includes an alignment system (alignment microscopes AM11 to AM14) that detects alignment marks MKm formed on the substrate P to have a constant positional relationship with the first pattern PT1 formed on the substrate P and estimates the relative positional error between the second pattern PT2 to be drawn and the first pattern PT1, based on the detected positions of the marks MKm, prior to the drawing of the second pattern PT2 by scanning with the beam LBn, and therefore it is possible to measure in advance, to a certain extent, misalignment or shape deformation of the first pattern PT1 before actually drawing the second pattern PT2.

The electro-optic element 36 corrects the drawing timing of the beam LBn based on the pattern information of the pattern PT2, such that the relative positional error between the first pattern PT1 and the second pattern PT2 estimated by the alignment system is reduced. The measuring section 116, using the clock signal LTC as a reference, obtains and compares the information relating to the measured position of the first pattern PT1 to the position of the second pattern PT2 drawn after the drawing timing and the like are corrected using the electro-optic element 36, and therefore it is possible to obtain the relative remaining positional error between the first pattern PT1 and the second pattern PT2 practically in real time.

As described above, the exposure control section 114 of the exposure apparatus EX corrects the drawing state of the second pattern to be drawn, based on the relative positional relationship (including the relative remaining positional error as well) between the first pattern PT1 and the second pattern PT2 measured by the measuring section 116. In this way, it is possible to maintain high accuracy during exposure for the alignment and overlapping between the first pattern PT1 and the second pattern PT2. The exposure control section 114 performs at least one of a correction of the pattern data (drawing data, pattern information) corresponding to the second pattern PT2, a correction of the drawing timing of the beam LBn by the electro-optic element 36 and of the magnification of the second pattern PT2, or a shape correction of the second pattern PT2, based on the relative positional relationship between the first pattern PT1 and the second pattern PT2 measured by the measuring section 116.

The first pattern PT1 may include the dummy pattern PT1*b* provided to overlap with at least a portion of the second pattern PT2, and the second pattern PT2 may include the dummy pattern PT2*b* incorporated in the pattern data in a manner to overlap with at least a portion of the first pattern PT1. Furthermore, the first pattern PT includes the main pattern PT1*a* forming the electronic device and the dummy pattern PT1*b*, and the second pattern PT2 may include the dummy pattern PT2*b* incorporated in the pattern data in a manner to overlap with at least a portion of the dummy pattern PT1*b* of the first pattern PT1. In this way, even in case where portions of the main pattern PT1*a* of the first pattern PT1 forming the electronic device and the main pattern PT2 of the second pattern PT2 forming the electronic device do not overlap with each other, it is possible to draw the second pattern PT2 such that a portion thereof overlaps with the first pattern PT1. Accordingly, the measuring section 116 can measure the shape error or misalignment of the first pattern PT1 during exposure practically in real time, and can accurately measure the relative positional relationship between the first pattern PT1 and the second pattern PT2.

Second Embodiment

In the first embodiment described above, the reflected light of the beam LBn for exposure is detected, and therefore, for regions on the substrate P onto which the spot light SP of the beam LBn for exposure is not projected, it is impossible to measure the position and shape of the first pattern PT1 and the relative positional relationship between the first pattern PT and the second pattern PT2. In the second embodiment, a scanning unit Una projects a beam MLn (referred to below as measurement light) for measurement that is separate from the beam LBn for exposure, and a light detector DTnm detects the reflected light that is reflected by the substrate P due to the projection of the measurement light MLn. In this way, for the regions on the substrate P onto which the beam LBn for exposure is not projected as well, it is possible to measure at least one of the position and shape of the first pattern PT1, or the relative positional relationship between the first pattern PT1 and the second pattern PT2. This measurement light MLn is a beam (non-exposure beam) in a wavelength region to which the photosensitive surface of the substrate P has low sensitivity or no sensitivity. Low sensitivity with respect to the photosensitive surface of the substrate P is, for example, a sensitivity of less than or equal to 1% of the beam LBn for exposure.

Figure 14:
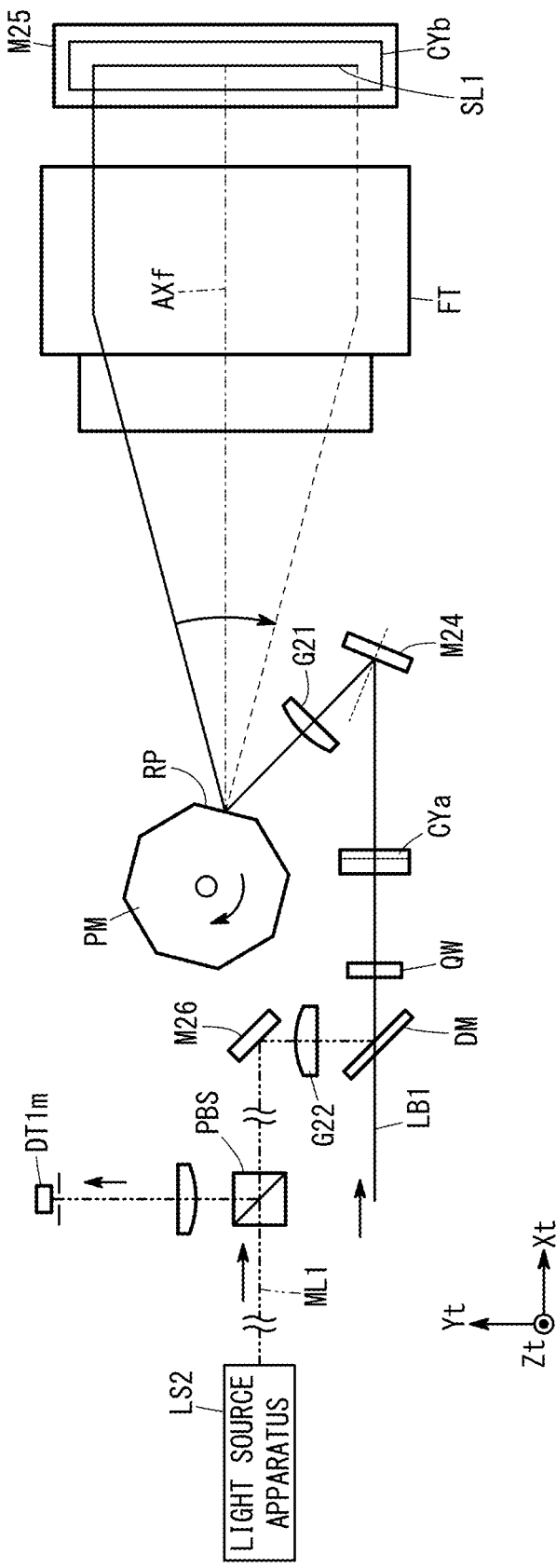
FIG. 14 is a diagram showing a configuration of a scanning unit of the second embodiment.

FIG. 14 is a diagram showing the configuration of the scanning unit U1a according to the second embodiment. Each scanning unit Una (U1a to U6a) has the same configuration, and therefore the scanning unit (drawing unit) U1a is described, while descriptions of the other scanning units (drawing units) U2a to U6a are omitted. Furthermore, configurations that are the same as in the first embodiment described above are given the same reference numerals, and only portions differing from the first embodiment described above are described. Accordingly, optical components that are not particularly necessary for description are omitted from the drawings. In FIG. 14, the direction parallel to the optical axis AXf of the fθ lens FT is the Xt direction, the direction orthogonal to the Xt direction in a plane passing through the optical axis AXf and parallel to the polarization direction of the polygon mirror PM is the Yt direction, and the direction orthogonal to the XtYt plane is the Zt direction.

The dichroic mirror DM with wavelength selectivity inclined 45° relative to the XtZt plane transparently passes as-is the beam LB1 that is a parallel light flux progressing in the +Xt direction, and guides this beam LB1 to the reflective mirror M24 arranged at a distance from the +Xt direction side of the dichroic mirror DM. The dichroic mirror DM reflects the measurement light ML1 from a light source apparatus (second light source apparatus) LS2 toward the reflective mirror M24. The beam LB1 having passed through the dichroic mirror DM incidents the reflective mirror 24 via a λ/4 wave plate QW and the cylinder lens CY. The reflective mirror M24 reflects the incident beam LB1 toward the polygon mirror PM. The fθ lens FT, the reflective mirror M25, and the cylindrical lens CYb formed by a single lens, which are provided behind the polygon mirror PM, are the same as in the first embodiment described above, and so descriptions thereof are omitted.

The polarized beam splitter PBS transparently passes the linearly polarized measurement light ML1 emitted by the light source apparatus (second light source apparatus) LS2. The wavelength of the measurement light ML1 is set to be longer than the wavelength (e.g. 355 nm) of the beam LB1 for exposure, and long enough to be able to be separated by the dichroic mirror. For example, in a case where the measurement light ML1 emitted by the light source apparatus LS2 is P-polarized light, the polarized beam splitter PBS transparently passes the P-polarized light and reflects the linearly polarized light (i.e. the S-polarized light) orthogonal to the P-polarized light. In the present second embodiment, the measurement light ML1 emitted by the light source apparatus LS2 is described as being P-polarized light. The measurement light ML1 transparently passed by the polarized beam splitter PBS progresses toward the −Yt direction side via the reflective mirror M26 and the lens G22, to be incident to the dichroic mirror DM inclined at 45° relative to the XtZt plane. In this way, the dichroic mirror DM reflects the incident measurement light ML1 toward the +Xt direction side, guiding this measurement light ML1 to the reflective mirror M24. The measurement light ML1 incident to the dichroic mirror DM is a parallel light flux. The measurement light ML1 reflected by the dichroic mirror DM passes through the λ/4 wave plate QW and the cylindrical lens CYa, to be incident to the reflective mirror M24. The reflective mirror M24 reflects the incident measurement light ML1 toward the polygon mirror PM. In this way, due to the polygon mirror PM, the fθ lens FT, and the like, the spot light MSP of the measurement light ML1 is also used to scan along the main scanning direction (Y direction and Yt direction) on the substrate P.

The reflected light resulting from the measurement light ML1 and the beam LB1 reflected by the substrate P is incident to the dichroic mirror DM, via the cylindrical lens CYb, the reflective mirror M25, the fθ lens FT, the polygon mirror PM, the reflective mirror M24, the cylindrical lens CYa, and the λ/4 wave plate QW. The dichroic mirror DM transparently passes the wavelength band of the beam LB1 and reflects the wavelength band of the measurement light ML1, and therefore the reflected light resulting from the measurement light ML1 (spot light MSP) reflected by the substrate P is reflected by the dichroic mirror DM to be incident to the polarized beam splitter PBS via the lens G22, the reflective mirror M26, and the like. Since the λ/4 wave plate QW is provided between the dichroic mirror DM and the reflective mirror M24, the measurement light ML1 projected onto the substrate P is converted from P-polarized light into circularly polarized light by this λ/4 wave plate QW, and the reflected light resulting from the measurement light ML1 incident to the polarized beam splitter BS1 from the substrate P is converted from circularly polarized light to S-polarized light by this λ/4 wave plate QW. Accordingly, the measurement light ML1 incident to the polarized beam splitter PBS is reflected by the polarized beam splitter PBS to be incident to the light detector DT1m via the lens G24.

Here, the light source apparatus LS2 may be a component that continues to continuously emit the measurement light (continuous light) ML1, or may be a component that emits pulsed measurement light (pulsed light) with a predetermined frequency. This light source apparatus LS2 may be provided for every scanning unit Una (Un1 to Un6), or one or two light source apparatuses LS2 may be provided. In a case where there is one light source apparatus LS2, the measurement light ML emitted by the light source apparatus LS2 is branched into six lights via a beam splitter or the like, and the respective measurement lights MLn (ML1 to ML6) resulting from the branching are incident to the scanning units Un (U1 to U6). In a case where there are two light source apparatuses LS2, as described above, the measurement light MLn emitted by each of the two light source apparatuses LS2 may be time-split using the acousto-optic converting elements (AOM), and input sequentially to the respective set of three scanning units U1a to U3a and U4a to U6a. The switching of the scanning unit Una to which the measurement light MLn is incident is, in the same manner as in the case of the beam LBn, switching according to the emission timing of the origin point signal SZn. In other words, the measurement light MLn is incident to the scanning unit Una that is to perform scanning with the spot light SP from now.

Figure 15A:
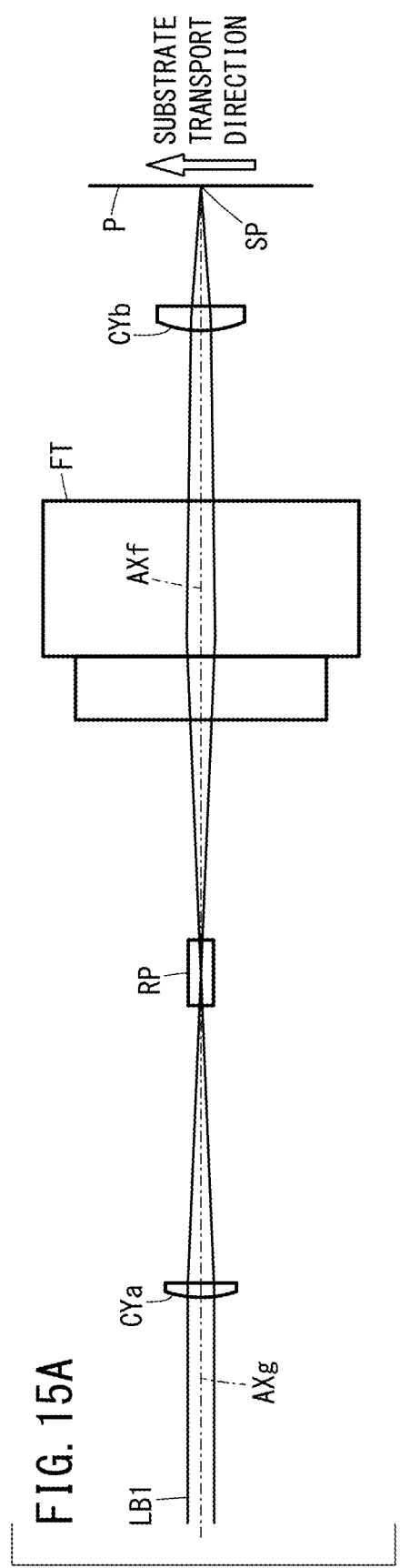
FIG. 15A is a schematic diagram of a case in which the beam, from the cylindrical lens disposed in front of the polygon mirror shown in FIG. 14 until being projected onto the substrate, is seen from the −Yt direction side parallel to the polarization direction (scanning direction) of the beam.
Figure 15B:
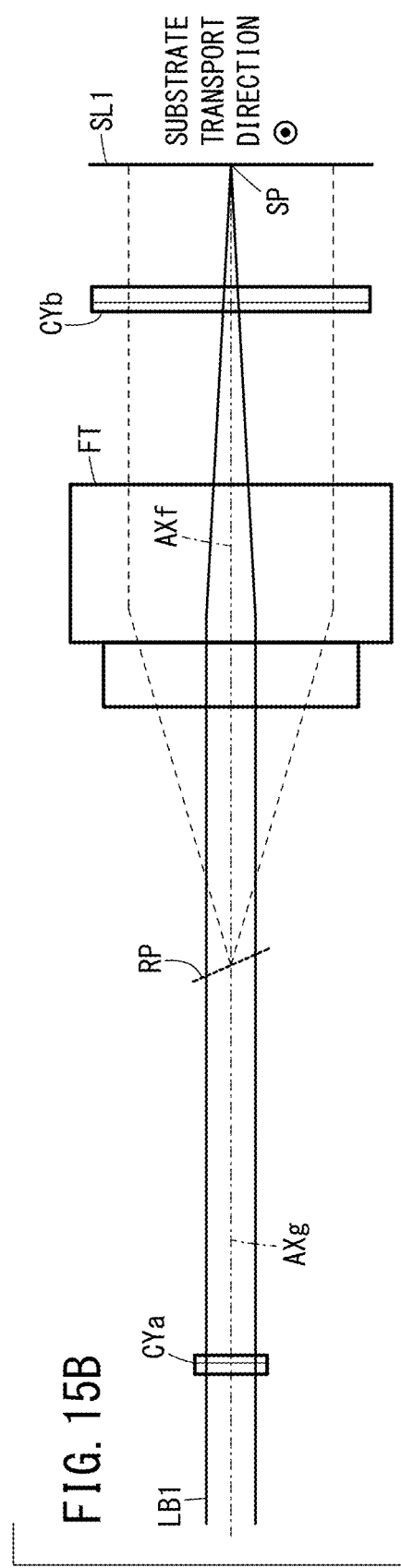
FIG. 15B is a schematic diagram of a case in which the beam, from the cylindrical lens shown in FIG. 14 until being projected onto the substrate, is seen from the direction orthogonal to a plane parallel to the deflection direction (scanning direction) of the beam.

FIG. 15A is a schematic diagram of a case in which the beam LB1, from the cylindrical lens CYa shown in FIG. 14 until being projected onto the substrate, is seen from the −Yt direction side parallel to the polarization direction (scanning direction) of the beam LB1, and FIG. 15B is a schematic diagram of a case in which the beam LB1, from the cylindrical lens CYa shown in FIG. 14 until being projected onto the substrate, is seen from the direction orthogonal to a plane parallel to the polarization direction (scanning direction) of the beam LB1. The optical path and the shape of the beam LB1, from the cylindrical lens CYa to being projected onto the substrate P is described, with reference to FIG. 14, FIG. 15A, and FIG. 15B.

The cylindrical lens CYa has a busbar that is parallel to the Yt direction, and therefore, with regard to the scanning direction (Yt direction), the beam LB1 and the measurement light ML1 that are incident parallel light flux are passed as-is (see FIG. 15B), and with regard to the plane (XtZt plane) perpendicular to the scanning direction, the beam LB1 and the measurement light ML1 that are incident parallel light flux are converged at a back focal point position (see FIG. 14A). In this way, by providing the cylindrical lens CYa such that the busbar is parallel to the Yt direction, it is possible to form the beam LB1 and the measurement light ML1 with a slit shape (elliptical shape) extending in a direction parallel to the XtYt plane on the reflective surface RP of the polygon mirror PM.

The fθ lens FT, with regard to the non-scanning direction (Zt direction), causes the beam LB1 and the measurement light ML1, which are diffused after being reflected by the reflective surface RP, to be parallel light fluxes (see FIG. 15B). Furthermore, the fθ lens FT, with regard to plane (XtYt plane) perpendicular to the scanning direction, causes the beam LB1 and the measurement light ML1, which are parallel light fluxes reflected by the reflective surface RP, to converge on the substrate P (see FIG. 15A). The cylindrical lens CYb has a busbar parallel to the Yt direction and therefore, with regard to the non-scanning direction (converted from the Zt direction to the Xt direction by the reflective mirror M25), causes the beam LB1 and the measurement light ML1, which are parallel light fluxes transparently passed through the fθ lens FT, to converge on the substrate P (see FIG. 15B), and with regard to the plane parallel to the scanning direction (converted from the XtYt plane to the YtZt plane by the reflective mirror M25), transparently passes as-is the beam LB1 and the measurement light ML1 from the fθ lens FT (see FIG. 15A). In this way, the beam LB1 irradiating the substrate P is spot light (size φ of approximately 3 μm). In FIG. 15A and FIG. 15B, the optical axis (central axis) of the beam LB1 is represented by Axg. Furthermore, as shown in FIG. 15A, with regard to the non-scanning direction, the optical axis Axg of the beam LB1 and the optical axis (central axis) AXf of the fθ lens FT overlap.

In a case where the measurement light ML1 is incident to the dichroic mirror DM such that the optical axis (central axis) of the measurement light ML1 reflected by the dichroic mirror DM and the optical axis (central axis) of the beam LB1 transparently passed by the dichroic mirror DM are coaxial, the optical path and shape of the measurement light ML1 are the same as those of the beam LB1. In other words, the measurement light ML1 irradiating a reflective surface RP of the polygon mirror PM is formed with a slit shape (elliptical shape) extending in a direction parallel to the XtYt plane on the reflective surface RP, in the same manner as the beam LB1, and the spot light MSP of the measurement light ML1 is projected onto the substrate P at a projection position corresponding to the rotational angle of the polygon mirror PM. Accordingly, the spot light MSP of the measurement light ML1 is also drawn in the Y direction along the drawing line SL1, and the scanning with the spot light SP and the scanning with the spot light MSP are performed simultaneously.

However, since the wavelength (or wavelength band) of the beam LB1 and the wavelength (or wavelength band) of the measurement light ML1 are different, the scanning position of the spot light MSP is actually shifted from the drawing line SL1 due to the effect of chromatic aberration. In other words, since the optical elements (the cylindrical lenses CYa and CYb, the fθ lens FT, and the like) within the scanning unit U1a are designed according to the wavelength (or wavelength band) of the beam LB1 such that the scanning with the spot light SP of the beam LB1 is performed precisely along the linear drawing line SL1, there are cases where the position at which the spot light MSP of the measurement light ML1 is projected has an error relative to the drawing line SL1 due to the effect of chromatic aberration.

Figure 16:
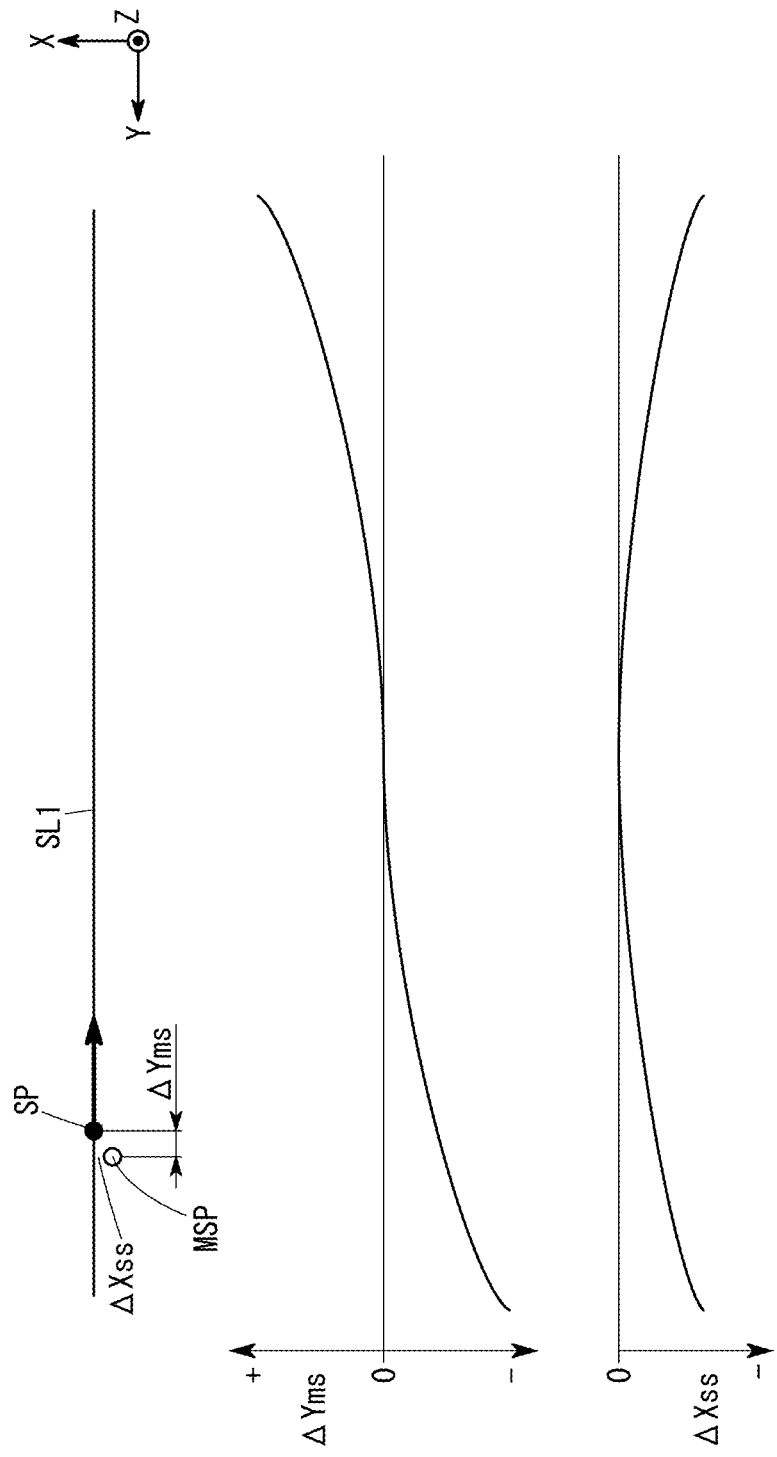
FIG. 16 is a diagram showing an exemplary error of the projection position of the spot light of the measurement light, in a case where the measurement light is incident to the dichroic mirror in a manner such that the optical axis of the measurement light reflected by the dichroic mirror shown in FIG. 14 is coaxial with the beam transparently passed by the dichroic mirror.

FIG. 16 is a diagram showing an exemplary error of the projection position of the spot light MSP of the measurement light ML1 relative to the spot light SP of the beam LB1. In FIG. 16, the central point of the drawing line SL1 is set to match the central point of the maximum scanning length. As described above, due to the effect of chromatic aberration, there are cases where the position on the substrate P where the spot light MSP is projected is shifted relative to the position on the substrate P where the spot light SP is projected. The shift (positional error) in the Y direction (main scanning direction) of the projection position of the spot light MSP relative to the projection position of the spot light SP is expressed as $\Delta Yms$, and the shift (positional error) thereof in the X direction (sub scanning direction) is expressed as $\Delta Xss$. In FIG. 16, a case where the positional error $\Delta Yms$ is a negative (−) value indicates that the projection position of the spot light MSP is located on a directional (+Y directional) side of the projection position of the spot light SP that is opposite the main scanning direction. On the other hand, a case where the positional error $\Delta Yms$ is a positive (+) value indicates that the projection position of the spot light MSP is located on a main scanning direction (−Y direction side) side of the projection position of the spot light SP. Furthermore, in FIG. 16, a case where the positional error $\Delta Xss$ is a negative (−) value indicates that the projection position of the spot light MSP is located on a direction (−X directional) side of the projection position of the spot light SP that is opposite the main transport direction.

With the position of the spot light SP at the central point of the drawing line SL1 (central point of the maximum scanning length), the positional error $\Delta Yms$ is 0. With the central point of the drawing line SL1 (central point of the maximum scanning length) serving as a boundary, when the position of the spot light SP is on the drawing start point (scanning start point) side, i.e. the +Y direction side, the positional error $\Delta Yms$ is a negative value, and when the position of the spot light SP is on the drawing end point (scanning end point) side, i.e. the −Y direction side, the positional error $\Delta Yms$ is a positive value. Furthermore, as the position of the spot light SP moves farther to the drawing start point side from the central point of the drawing line SL1 (central point of the maximum scanning length), the positional error $\Delta Yms$ value becomes gradually smaller (the absolute value of the positional error $\Delta Yms$ becomes larger). On the other hand, as the position of the spot light SP moves farther to the drawing end point side from the central point of the drawing line SL1 (central point of the maximum scanning length), the positional error $\Delta Yms$ value becomes gradually larger. Accordingly, the scanning length of the scanning line (scanning trajectory) of the spot light MSP is longer than the drawing line SL1.

Furthermore, with the position of the spot light SP at the central point of the drawing line SL1 (central point of the maximum scanning length), the positional error ΔXss is 0. As the position of the spot light SP moves away from the central point of the drawing line SL1 (central point of the maximum scanning length), the positional error ΔXss becomes a negative value, for example, and the absolute value of the positional error ΔXss becomes larger as the position of the spot light P becomes farther from the central point of the drawing line SL1 (central point of the maximum scanning length). Accordingly, the scanning line (scanning trajectory) of the spot light MSP traces a slightly arched shape.

The measuring section 116 (see FIG. 13) includes an error map for correcting the positional errors (ΔXss and ΔYms), such as shown in FIG. 16, and can identify the projection position of the spot light MSP of the measurement light ML1 by using the scanning position of the radiated spot light SP on the drawing line SL1 and the error map such as shown in FIG. 16. The measuring section 116 can measure at least one of position information and shape information of the first pattern PT1 or the relative positional relationship (overlap error information) between the first pattern PT1 and the second pattern PT2, using the photoelectric signal (PS1$m$) detected by the light detector DT1$m$ and the identified projection position of the spot light MSP. In this way, the alignment accuracy and overlap accuracy of the second pattern PT2 relative to the first pattern PT1 can be performed with high accuracy. The spot light SP (beam LB1) is emitted according to the clock signal LTC, and therefore the projection position (scanning position) of this spot light SP on the drawing line SL1 can be identified from the rotational speed Vp of the polygon mirror PM and a count value, which is obtained by the measuring section 116 counting the number of clock pulses of the clock signal LTC emitted after the timing at which the serial data DL1 was output to the selection optical element AOM1, i.e. the drawing start timing of the spot light SP.

Furthermore, the spot light SP radiated along the drawing lines SL1 to SL3 is emitted according to the clock signal LTC emitted by the signal generating section 22$a$ of the light source apparatus LSa, and therefore the projection position of the spot light SP projected onto the drawing lines SL1 to SL3 is identified using the clock signal LTC from the light source apparatus LSa. Similarly, the spot light SP projected onto the drawing lines SL4 to SL6 is identified using the clock signal LTC from the light source apparatus LSb. The clock pulse of the clock signal LTC is always emitted, regardless of whether the intensity of the beam LB1 for exposure is in an ON state (a state in which the spot light SP is projected) for pattern drawing or in on OFF state, and therefore, if the spot light MSP of the measurement light ML1 is projected onto the substrate P, the waveform of the signal PS1$m$ output from the light detector DT1$m$ due to the clock signal LTC can be digitally sampled at any time by the analog/digital converter or the like provided within the measuring section 116 (see FIG. 13).

It should be noted that in a case where the measurement light ML1 is incident to the dichroic mirror DM such that the optical axis AXh of the measurement light ML1 reflected by the dichroic mirror DM is eccentric (or inclined) relative to the optical axis AXg of the beam LB1 transparently passed by the dichroic mirror DM, with regard to the transport direction (X direction) of the substrate P, it is possible for the scanning line (scanning trajectory) of the spot light MSP of the measurement light ML1 to be distanced from the drawing line SL1 in the sub scanning direction by a predetermined distance.

Accordingly, by positioning the scanning line of the spot light MSP of the measurement light ML1 on the upstream side (−X direction side) of the drawing line SL1 in the transport direction of the substrate P, it is possible to measure at least one of the position and shape of the pattern PT1 in advance, regardless of the drawing timing of the second pattern PT2, before performing the scanning with the spot light SP.

FIG. 17A is a schematic diagram of the measurement light ML1 from the cylindrical lens CYa to being projected onto the substrate P, as seen from the −Yt direction side parallel to the polarization direction (scanning direction) of the measurement light ML1 (beam LB1), in a case where the optical axis AXh of the measurement light ML1 reflected by the dichroic mirror DM is made eccentric (shifted) in parallel relative to the optical axis AXg of the beam LB1 transparently passed by the dichroic mirror DM. FIG. 17B is a schematic diagram of the measurement light ML1 from the cylindrical lens CYa to being projected onto the substrate P, as seen from a direction side orthogonal to the plane parallel to the polarization direction (scanning direction) of the measurement light ML1 (beam LB1), in a case where the optical axis AXh of the measurement light ML1 reflected by the dichroic mirror DM is made eccentric (shifted) in parallel relative to the optical axis AXg of the beam LB1 transparently passed by the dichroic mirror DM. The optical path and the shape of the measurement light ML1, from the cylindrical lens CYa to being projected onto the substrate P, is described with reference to FIG. 14, FIG. 17A, and FIG. 17B.

In the plane (XtYt plane) parallel to the scanning direction, the measurement light ML1 is incident to the cylindrical lens CYa (see FIG. 17B), such that the optical axis AXh thereof overlaps with the optical axis AXg of the beam LB. Accordingly, in the plane (the XtYt plane until the reflective mirror M25 and the YtZt plane after the reflective mirror M25) parallel to the scanning direction, the optical path and shape of the measurement light ML1 are the same as the optical path and the shape of the beam LB1 described above, and therefore descriptions thereof are omitted.

On the other hand, in the non-scanning direction (Zt direction), the measurement light ML1 incident to the cylindrical lens CYa becomes incident with the optical axis AXh thereof parallel-shifted in the +Zt direction by a very small amount relative to the optical axis AXg of the beam LB1 (see FIG. 17A). Accordingly, the measurement light ML transparently passed by the cylindrical lens CYa is incident to the polygon mirror PM in a state where the optical axis AXh thereof is inclined toward the +Zt direction side from the optical axis AXg of the beam LB1. As described above, in the non-scanning direction (Zt direction), the measurement light ML1 irradiating the polygon mirror PM is converged on a reflective surface RP by the cylindrical lens CYa.

In the non-scanning direction (Zt direction), the measurement light ML1 reflected by the reflective surface RP is incident to the fθ lens FT in a state where the optical axis AXh is positioned on the −Zt direction side of the optical axis AXg of the beam LB1. This fθ lens FT, with regard to the non-scanning direction (Zt direction), causes the measurement light ML1 that is reflected and diverged by the reflective plane RP to be almost parallel light flux. The measurement light ML1 transparently passed by the fθ lens FT becomes the spot light MSP via the cylindrical lens CYb and is projected onto the substrate P, but the projection position thereof is a position on the upstream side (−X direction side) of the spot light SP of the beam LB1, in the transport direction of the substrate P. Accordingly, it is possible to shift the position of the scanning line (scanning trajectory) MSL1 of the spot light MSP of the measurement light ML1 toward the upstream side (−X direction side) in the transport direction of the substrate P, relative to the drawing line SL1. In this case as well, the scanning with the spot light SP and the scanning with the spot light MSP are performed simultaneously. The cylindrical lens CYb converges the measurement light ML1 into the spot light MSP on the substrate P, in the non-scanning direction (Zt direction).

Figure 18:
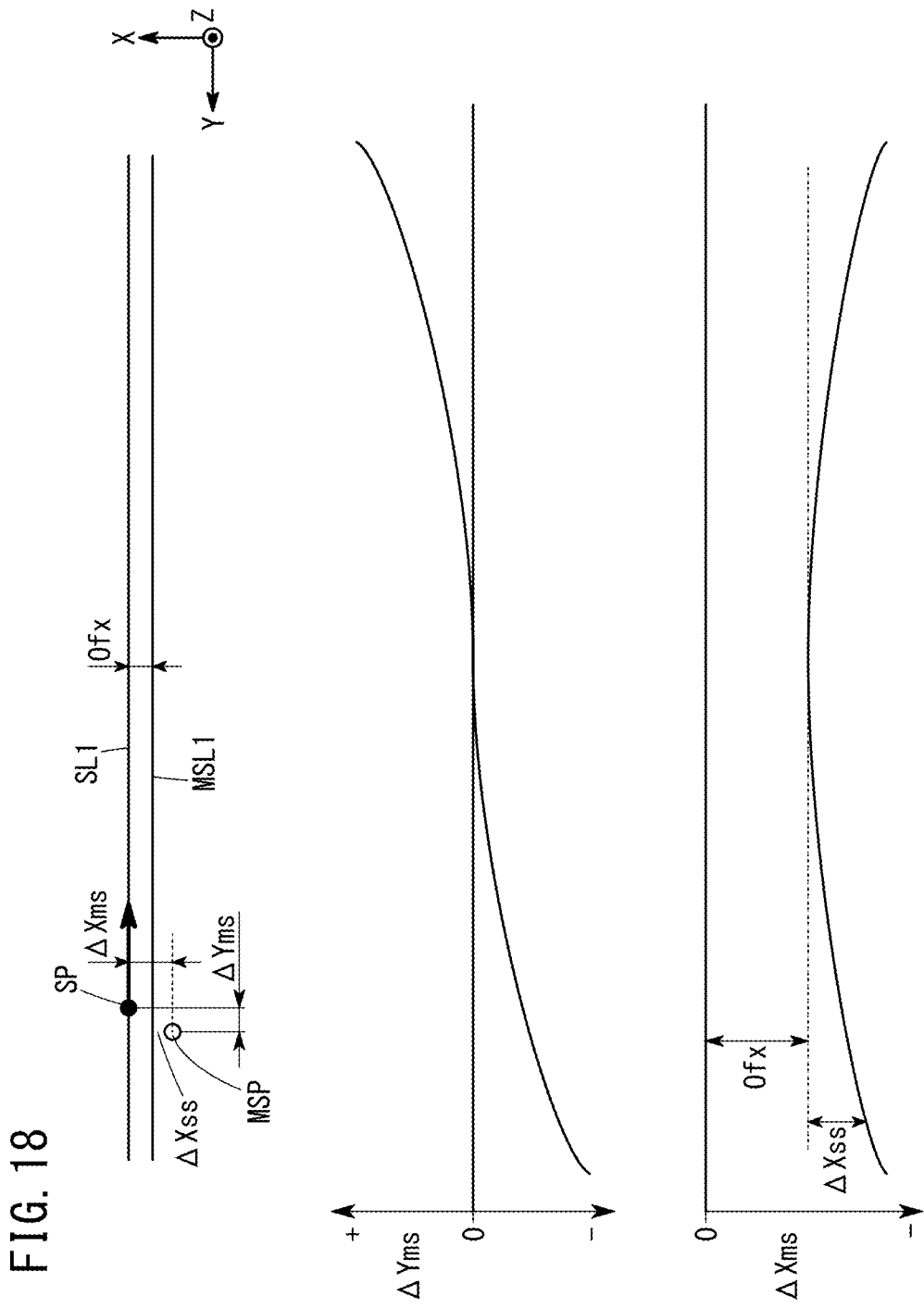
FIG. 18 is a diagram showing an exemplary error in the projection position of the spot light of the measurement light shown in FIG. 17A and FIG. 17B, due to the effect of chromatic aberration.

FIG. 18 is a diagram showing an exemplary error in the projection position of the spot light MSP of the measurement light ML1 shown in FIG. 17A and FIG. 17B, due to the effect of chromatic aberration. MSL1 in FIG. 18 is a scanning line designed to be scanned by the spot light MSP of the measurement light ML1, in a case where the effect of chromatic aberration is not considered. This scanning line MSL1 is positioned on the upstream side (−X direction side) of the scanning line SL1 by an offset distance Ofx, in the transport direction of the substrate P. Accordingly, the Y direction shift (positional error) of the projection position of the spot light MSP relative to the projection direction of the spot light SP is ΔYms, but the X direction shift (positional error) is shifted in the −X direction by the offset distance (predetermined interval) Ofx, and therefore ΔXms=ΔXss+Ofx. In FIG. 18 as well, the central point of the drawing line SL1 (scanning line MSL1) is set to match the central point of the maximum scanning length.

Accordingly, the measuring section 116 (see FIG. 13) includes an error map for correcting the positional errors (ΔXms (=ΔXss+Ofx) and ΔYms), such as shown in FIG. 18, and can identify the projection position of the spot light MSP of the measurement light ML1 by using the scanning position (the count of clock pulses of the clock signal LTC) of the radiated spot light SP on the drawing line SL1 and the error map such as shown in FIG. 18. It is then possible to measure the position and shape of the pattern PT1, using the waveform of the photoelectric signal PS1$m$ detected by the light detector DT1$m$ and the identified projection position of the spot light MSP. In this way, the alignment accuracy and the overlap accuracy of the second pattern PT2 relative to the first pattern PT1 can be measured immediately prior to the drawing exposure with the beam LB1.

In this way, since the scanning with the spot light MSP of the measurement light MLn (ML1 to ML6) is performed using the polygon mirror PM, even in regions where the spot light SP of the beam LBn (LB1 to LB6) is not projected, it is possible to measure at least one of the position or shape of the first pattern PT1 or the relative positional relationship between the first pattern PT1 and the second pattern PT2. Furthermore, by setting the position of the scanning line (scanning trajectory) MSLn (MSL1 to MSL6) of the spot light MSP of the measurement light MLn (ML1 to ML6) to be on the upstream side (−X direction side) in the transport direction of the substrate P relative to the drawing line SLn (SL1 to SL6), it is possible to measure the position and shape of the first pattern PT1 in advance, before performing the scanning with the spot light SP. Therefore, before the second pattern PT2 is exposed, the exposure state of the second pattern PT2 can be adjusted using the information thus measured.

As described above, the exposure apparatus EX of the second embodiment is a device that draws a pattern on the substrate P by projecting the beam LBn onto the substrate P and performing scanning in the main scanning direction while performing intensity modulation on the beam LBn from the light source apparatus LS according to the pattern information, and comprises a scanning unit Una that includes a light source apparatus LS2 emitting measurement light MLn in a wavelength region to which a photosensitive surface of the substrate P has low sensitivity, a beam scanning section having a polygon mirror PM deflecting the beam LBn and the measurement light MLn and scanning with the beam LBN and the measurement light MLn in the main scanning direction, and a light detector DTnm (DT1$m$ to DT6$m$) that photoelectrically detects a reflected beam emitted when the measurement light MLn is projected onto the substrate P, via the polygon mirror PM of the beam scanning section; and a measuring section 116 that measures information concerning at least one of the position and shape on the substrate P of the first pattern PT1 formed in advance of a specified material on the substrate P, or the relative positional relationship between the first pattern PT1 and the second pattern PT2, based on the detection signal PSnm (PS1$m$ to PS6$m$) output from the light detector DTnm. In this way, even when the beam LBn is not being projected onto the substrate P, it is possible to measure, with high accuracy, the information concerning at least one of the position and shape on the substrate P of the first pattern PT1 formed in advance of a specified material on the substrate P, or the relative positional relationship between the first pattern PT1 and the second pattern PT2, by scanning the substrate P with the measurement light MLn.

The exposure control section 114 of the exposure apparatus EX corrects the drawing state (drawing position, drawing magnification, drawing shape, and the like) of the second pattern PT2 being newly drawn, based on the measurement results of the relative positional relationship (including the relative remaining positional error) and the like between the first pattern PT1 and the second pattern PT2 measured by the measuring section 116. In this way, the alignment and overlapping between the first pattern PT1 and the second pattern PT2 can be performed with high accuracy.

The beam scanning section including the polygon mirror PM performs scanning of the substrate P with the beam LBn and the measurement light MLn simultaneously, while projecting the beam LBn and the measurement light MLn in a manner to be shifted from each other by a predetermined interval (offset distance Ofx) on the substrate P in the sub scanning direction. In this way, it is possible to measure the position and shape of the first pattern PT1 formed in advance of a specified material on the substrate P or the relative positional relationship between the first pattern PT1 and the second pattern PT2, prior to the exposure of the second pattern PT2. The offset distance Ofx shown in FIG. 18 is set to be from approximately 1 mm to several millimeters on the substrate P, but may be less than 1 mm.

(Modifications of the First and Second Embodiments Described Above)

The first and second embodiments described above may be modified in the manner described below.

((First Modification)) In the second embodiment described above, the beam LBn and measurement light MLn are incident to the reflective surface RP of the polygon mirror PM from the same direction, via the reflective mirror M24, but in the first modification, the beam LBn and the measurement light MLn are made to have different angles of incidence to the reflective surface RP of the polygon mirror PM.

Figure 19:
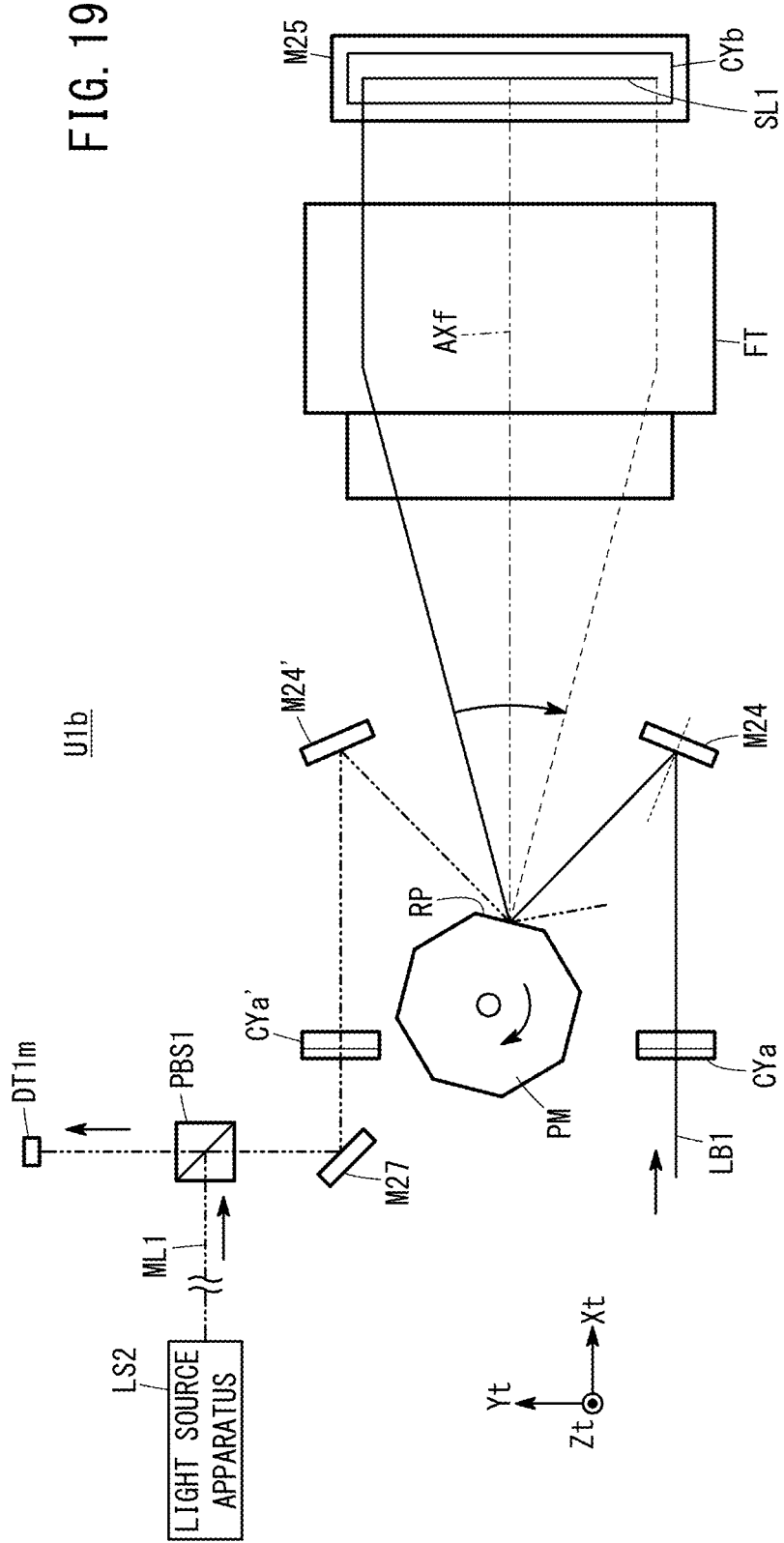
FIG. 19 is a diagram showing a configuration of a scanning unit of the present first modification.

FIG. 19 is a diagram showing the configuration of a scanning unit U1b of the present first modification. Each scanning unit Unb (U1b to U6b) has the same configuration, and therefore the scanning unit (drawing unit) U1b is described, while descriptions of the other scanning units (drawing units) U2b to U6b are omitted. Furthermore, configurations that are the same as in the second embodiment described above are given the same reference numerals, and only portions differing from the second embodiment described above are described. Accordingly, optical components that are not particularly necessary for description are omitted from the drawings. In FIG. 19, the direction parallel to the optical axis AXf of the fθ lens FT is the Xt direction, the direction orthogonal to the Xt direction in a plane passing through the optical axis AXf and parallel to the polarization direction of the polygon mirror PM is the Yt direction, and the direction orthogonal to the XtYt plane is the Zt direction.

In the scanning unit U1b, the dichroic mirror DM and the λ/4 wave plate QW are not provided in the optical path of the beam LB1. Accordingly, the beam LB1 (parallel light flux) for exposure progressing in the +X direction toward the reflective mirror M24 passes transparently through the cylindrical lens CYa as-is, and is then incident to the reflective mirror M24. The optical path and shape of the beam LB1 after becoming incident to the reflective mirror M24 are the same as in the second embodiment described above, and therefore descriptions thereof are omitted.

The polarized beam splitter PBS1 reflects the linearly polarized measurement light ML1 emitted by the light source apparatus (second light source apparatus) LS2, and transparently passes linearly polarized light whose polarization direction is orthogonal to that of the measurement light ML1 emitted by the light source apparatus LS2. In the present second modification, the measurement light ML1 emitted by the light source apparatus LS2 is P-polarized light, and therefore the polarized beam splitter PBS1 is set to be a component that reflects the P-polarized light and transparently passes S-polarized light. The measurement light ML1 reflected by the polarized beam splitter PBS1 progresses via the reflective mirror M27, the cylindrical lens CYa', the reflective mirror M24', and the like to be incident to the reflective surface RP of the polygon mirror PM. At this time, the measurement light ML1 is incident to the reflective surface RP from a direction that is different from the angle of incidence of the beam LB1 to the reflective surface RP. In the present first modification, the cylindrical lens CYa and the reflective mirror M24 are provided on the −Y direction side of the polygon mirror PM, and the cylindrical lens CYa' and the reflective mirror M24' are provided on the +Yt direction side of the polygon mirror PM. Accordingly, the beam LB1 reflected by the reflective mirror M24 is incident to the reflective surface RP of the polygon mirror PM from the −Yt direction side, and the beam LB1 reflected by the reflective mirror M24' is incident to the reflective surface RP of the polygon mirror PM from the +Yt direction side. Although not shown in the drawing in FIG. 19, a ¼ wave plate is provided in the optical path between the polarized beam splitter PBS1 and the cylindrical lens CYa'.

The cylindrical lens CYa' and the reflective mirror M24' have functions equivalent to those of the cylindrical lens CYa and the reflective mirror M24. Accordingly, the measurement light ML1 that is a parallel light flux transparently passed by the cylindrical lens CYa' is converged onto the reflective surface RP of the polygon mirror PM. Furthermore, in the plane (XtYt plane) parallel to the scanning direction, the measurement light ML1 irradiates the reflective surface RP in a state of being a parallel light flux. Accordingly, the measurement light ML1 irradiating the reflective surface RP is formed on the reflective surface RP with a slit shape (elliptical shape) extending in a direction parallel to the XtYt plane, in the same manner as the beam LB1. The optical path and shape of the measurement light ML1 after being reflected by the reflective surface RP are the same as in the second embodiment described above, and therefore descriptions thereof are omitted.

In this way, by causing the beam LB1 and the measurement light ML1 to have different angles of incidence to the reflective surface RP of the polygon mirror PM, the spot light MSP of the measurement light ML1 and the spot light SP of the beam LB1 can be made to have different scanning timings. In other words, it is possible to perform the scanning with the spot light MSP of the measurement light ML1 and the scanning with the spot light SP of the beam LB1 with a certain time difference therebetween, according to the direction of incidence that the measurement light ML1 and the beam LB1 have to the reflective surface.

As described in the second embodiment above, scanning with the spot light MSP of the measurement light ML1 may be performed along the drawing line SL1 of the beam LB1. In this case, although not shown in the drawings, the measurement light ML1 and the beam LB1 incident to the fθ lens FT from the polygon mirror PM are coaxial. Furthermore, the measurement light ML1 may be incident in an inclined manner to the reflective surface RP of the polygon mirror PM in the Zt direction, such that the scanning line MSL1 of the spot light MSP of the measurement light ML1 is distanced by the offset distance Ofx, in the transport direction (X direction) of the substrate P, relative to the drawing line SL1 of the beam LB1. In either case, since the measurement light ML1 is affected by chromatic aberration, the measuring section 116 can precisely measure at least one of the position and the shape of the first pattern PT1 or the relative positional relationship between the first pattern PT1 and the second pattern PT2, based on the waveform of the signal PS1m from the light detector DT1m, by correcting and identifying the projection position of the spot light MSP of the measurement light ML1 using the error map such as shown in FIG. 16 or FIG. 18. At this time, the scanning with the spot light MSP due to the measurement light ML1 and the scanning with the spot light SP due to the beam LB1 have a certain time difference therebetween, and therefore a correspondence should be made between the scanning position of the spot light MSP and the scanning position of the spot light SP, in consideration of the offset (positional shift in the main scanning direction) of a number of clock pulses of the clock signal LTC corresponding to this time difference.

Figure 20:
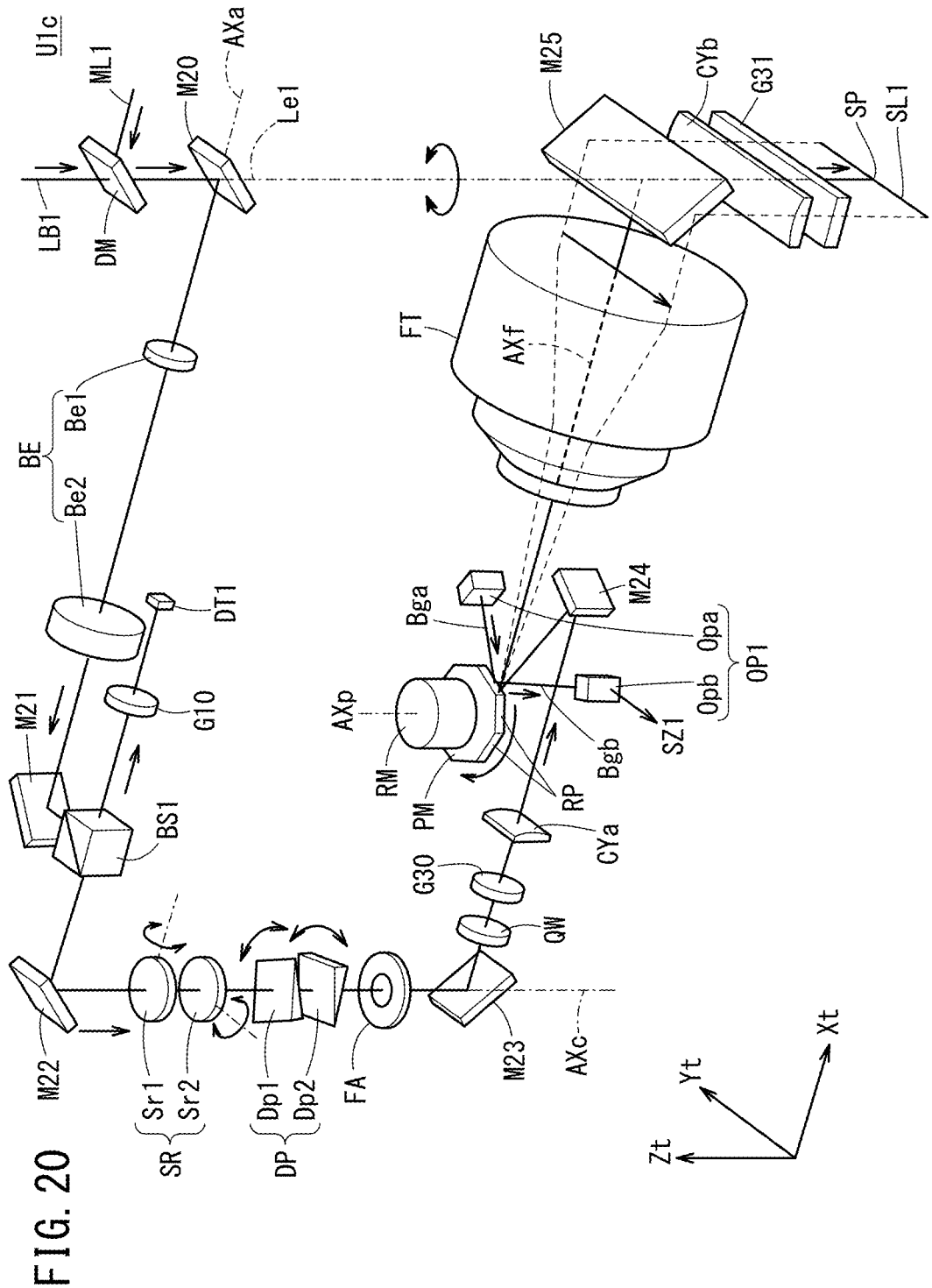
FIG. 20 is a diagram showing a configuration of a scanning unit of the present second modification.

((Second modification)) In the second modification, the measurement light MLn is caused to be incident to a scanning unit Unc during a period when the scanning unit Unc is not drawing and exposing the second pattern PT2. In other words, the scanning with the spot light SP and the scanning with the spot light MSP are performed alternatively. FIG. 20 is a diagram showing the configuration of the scanning unit U1c of the present second modification, and the basic configuration is the same as in FIG. 5 above. Each scanning unit Unc (U1c to U6c) has the same configuration, and therefore the scanning unit (drawing unit) U1c is described, while descriptions of the other scanning units (drawing units) U2c to U6c are omitted. Furthermore, configurations that are the same as in the first and second embodiments described above are given the same reference numerals, and only portions differing from the second embodiment described above are described.

The beam LB1 (parallel light flux) for exposure that is incident to the scanning unit U1c passes transparently through the dichroic mirror DM in the −Zt direction to be incident to the reflective mirror M20. This beam LB1 is incident to the reflective mirror M20 in a manner to be coaxial with the irradiation central axis Le1. Furthermore, the no-photosensitivity measurement light ML1 (parallel light flux) that progresses in the −Xt direction from the light source LS2 is reflected in the −Zt direction by the dichroic mirror DM to be incident to the reflective mirror M20. This measurement light ML1 is also incident to the reflective mirror M20 along the irradiation central axis Le1. Furthermore, correction optical lenses G30 and G31 are provided to be insertable and retractable in the optical path of the beam LB1 (measurement light ML1), between the reflective mirror M23 and the reflective mirror M24 and between the reflective mirror M25 and the substrate P. These correction optical lenses G30 and G31 are lenses for correcting the effect of chromatic aberration caused by the difference between the wavelength (or wavelength band) of the measurement light ML1 and the wavelength (or wavelength band) of the beam LB1. The optical members within the scanning unit U1c are set such that scanning with the spot light SP of the beam LB1 is performed along the linear drawing line SL1, and therefore, as described above, the scanning line MSL1 of the spot light MSP of the measurement light ML1 is deformed relative to the drawing line SL1, and the spot light MSP itself is distorted from its circular shape. Accordingly, by providing the correction optical lenses G30 and G31, deformation of the scanning line MSL1 of the spot light MSP of the measurement light ML1 due to chromatic aberration is corrected. These correction optical lenses G30 and G31 can be withdrawn from the optical path of the beam LB1 (measurement light ML1) by an actuator, not shown in the drawings. The arrangement positions of the correction optical lenses G30 and G31 are not limited to the positions shown in FIG. 20.

The light source LS2 causes the measurement light ML1 to be incident to the scanning unit U1c when the intensity of the beam LB1 incident to the scanning unit U1 is low level. For example, the integrated control section 104 of the control section 16 causes the measurement light ML1 to be incident to the scanning unit U1c by causing the light source apparatus LS2 to emit the measurement light ML1 during the period when the scanning unit U1c is not drawing and exposing the second pattern PT2. Furthermore, the integrated control section 104 causes the correction optical lenses G30 and G31 to withdraw from the optical path of the beam LB1 (measurement light ML1) while the second pattern PT2 is being drawn and exposed by the scanning unit U1c, by controlling the actuator described above. In other words, when the correction optical lenses G30 and G31 are arranged in the optical path of the beam LB1 during the drawing and exposure of the second pattern PT2 by the scanning unit U1c, the drawing line SL1 of the spot light SP is deformed, and therefore, in such a case, the correction optical lenses G30 and G31 are withdrawn. On the other hand, the integrated control section 104 causes the correction optical lenses G30 and G31 to be positioned in the optical path of the beam LB1 (measurement light ML1) during the period when the measurement light ML1 is incident to the scanning unit U1c (the period when the second pattern PT2 is not being drawn and exposed), by controlling the actuator described above. In this way, it is possible to scan with the spot light MSP of the measurement light ML1 along the drawing line SL1. In other words, the scanning with the spot light SP and the scanning with the spot light MSP are performed alternatively.

Accordingly, the reflected light from the substrate P resulting from the measurement light ML1 is detected by the light detector DT1m while the second pattern PT2 is not being drawn and exposed by the scanning unit U1c, and the reflected light from the substrate P resulting from the beam LB1 can be detected by the light detector DT1 while the second pattern PT2 is being drawn and exposed by the scanning unit U1c.

The control apparatus 16 may, with the substrate P is in a state of being transported in the transport direction (+X direction), cause the light source apparatus LS2 to emit the measurement light ML1 and cause the measurement light ML1 to be incident to the scanning unit U1c, without having the scanning unit U1c draw and expose the second pattern PT2. In this way, scanning with the spot light MSP of the measurement light ML1 is performed along the drawing line SL1. The measuring section 116 can measure the position and shape of the first pattern PT1 on the lower layer formed in the exposure region W, based on the detection signal (photoelectric signal) PS1 detected by the light detector DT1m. Then, after the substrate P has been transported in a reverse direction (−X direction) such that a predetermined amount of the substrate P has been wound, the control apparatus 16 again transports the substrate P in the +X direction in a state where the correction optical lenses G30 and G31 are withdrawn. The control apparatus 16 then draws and exposes the second pattern PT2 in a manner to overlap with the first pattern PT1 whose position and shape have been measured. At this time, the position and shape of the first pattern PT1 have already been measured, and therefore the exposure control section 114 of the control apparatus 16 corrects the drawing state (drawing position, drawing magnification, and the like) of the second pattern PT2 to be newly drawn, based on these measurement results. Accordingly, the alignment and overlapping of the second pattern PT2 relative to the first pattern PT1 can be performed with high accuracy.

In a case where the chromatic aberration can be corrected by the fθ lens FT and the cylindrical lens CYb, the scanning unit U1c does not need to include the correction optical lenses G30 and G31. In this case, the measuring section 116 measures the position and shape of the first pattern PT1 using the error map (correction map) such as shown in FIG. 16. In this case, the light source apparatus LS2 may cause the measurement light ML1 to be incident to the scanning unit U1c while the beam LB1 whose intensity is high level is not incident to the scanning unit U1c. In this way, either one of the beam LB1 whose intensity is high level and the measurement light ML1 is incident to the scanning unit U1c. In other words, the integrated control section 104 may control the light source apparatus LS2 to emit the measurement light ML1 during a period in which the logic information of the drawing bit sequence data SBa (SBb) output by the drawing data output section 112 is 0. In this way, even when the scanning unit U1c is currently drawing the second pattern PT2, it is possible to measure the position and shape of the first pattern PT1. In other words, the light detector DT1 detects the reflected light emitted when the spot light SP of the beam LB1 is projected onto the substrate P, and when the spot light SP of the beam LB1 is not being projected onto the substrate P, the reflected light emitted when the spot light MSP of the measurement light ML1 is projected onto the substrate P is detected by the light detector DT1m. Accordingly, even in regions onto which the spot light SP is not projected, it is possible to detect the position and shape of the first pattern PT1. The measurement light ML1 causes no photosensitivity in the substrate P, and therefore may continue to be incident to the scanning unit U1c constantly via the dichroic mirror DM.

Figure 21:
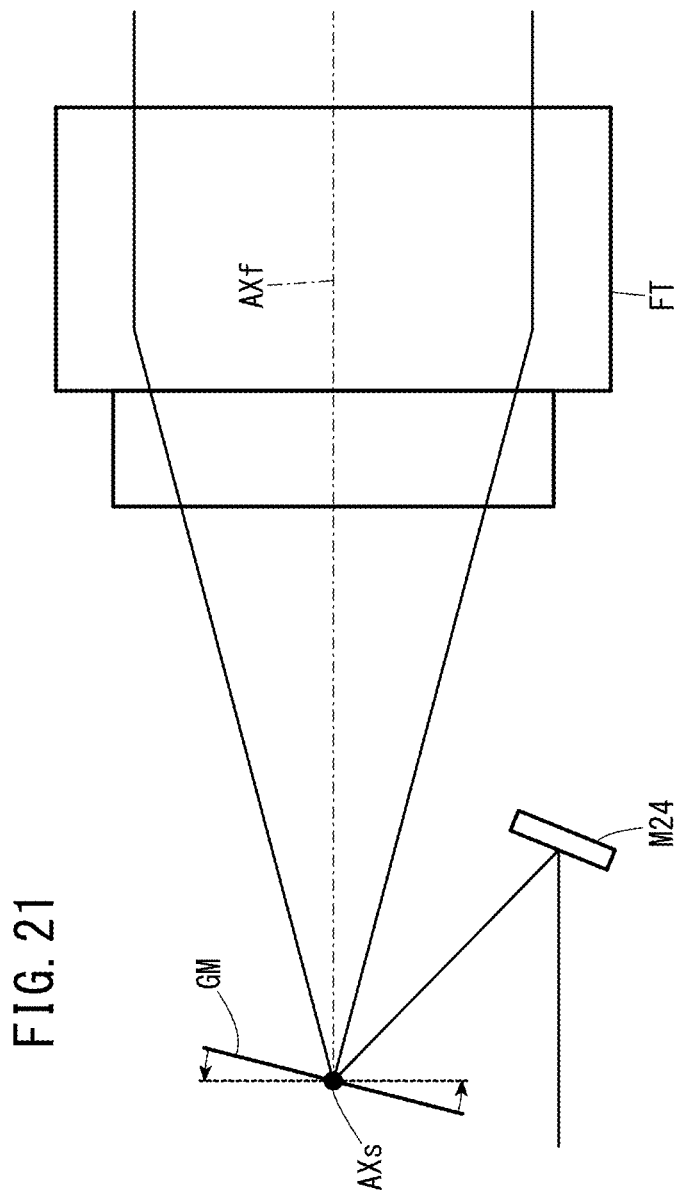
FIG. 21 is a diagram showing a configuration of a scanning unit of a third modification, adopting a rocking member instead of the polygon mirror.

((Third Modification)) In the first and second embodiments (including the modifications) described above, the polygon mirror PM is used as the member that deflects the beam LBn and the measurement light MLn, but a member other than the polygon mirror PM may be used. For example, instead of the polygon mirror PM, a rocking member (Galvano mirror) GM that has a planar reflective surface and reflects light such as shown in FIG. 21 may be adopted. This rocking member (rocking reflective mirror) GM oscillates (rocks) within a predetermined deflection angle range centered on the rotational axis AXs set parallel to the Zt axis, due to a drive member not shown in the drawings. By having the rocking member GM rock (oscillate) centered on the rotational axis AXs, it is possible to deflect the beam LBn (measurement light MLn). In this case as well, the reflective surface of the rocking member GM is provided at a position (front side focal point position) of the incidence pupil of the fθ lens FT, and is arranged such that the rotational axis AXs intersects the optical axis AXf of the fθ lens FT.

((Fourth Modification)) In the first and second embodiments (including the modifications) described above, the reflected light emitted from the substrate P resulting from the projection of each of the spot lights SP and MSP is detected using the light detector DTnm (DT1m to DT6m) or the light detector DTn (DT1 to DT6) via the polygon mirror PM, but the reflected light from the substrate P may be detected without passing through the polygon mirror PM.

Figure 22:
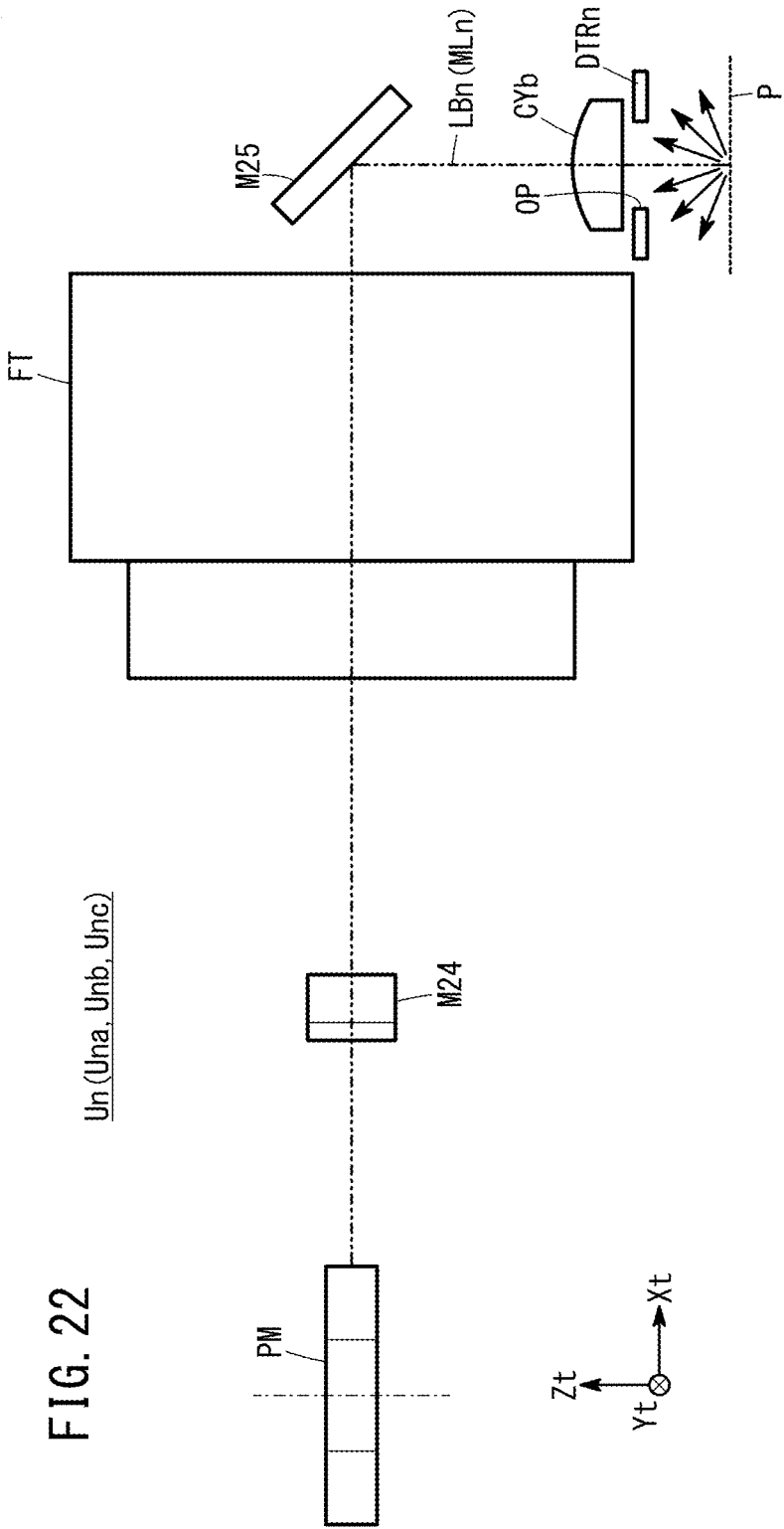
FIG. 22 is a diagram showing an exemplary arrangements of light detectors in the fourth modification.

FIG. 22 is a diagram showing an exemplary arrangement of a light detector DTRn in the fourth modification. A light detector DTRn is provided for every scanning unit Un (Una, Unb, and Unc). The light detector DTRn is provided between the cylindrical lens CYb and the substrate P, and is provided with an opening portion OP such that the spot light SP (or MSP) of the beam LBn (or measurement light MLn) transparently passed by the cylindrical lens CYb is projected onto the substrate P. A plurality of PIN photodiodes (not shown in the drawings) and the like are arranged along the scanning direction of the spot light SP (or MSP), near the opening portion OP of the light detector DTRn. The plurality of PIN photodiodes are provided at constant intervals along the scanning direction (Y direction) of the spot light SP (or MSP).

As described above in FIG. 10A, in a case where the first pattern PT1 formed on the substrate P has a stepped structure, diffused light Ldf is emitted from this stepped edge portion. The PIN photodiodes of the light detector DTRn are sensors that detect such reflected diffused light Ldf (or reflected diffracted light). As described above, the scanning position of the spot light SP (MSP) can be identified according to the number of clock pulses of the oscillated clock signal LTC from the scanning start time of the spot light SP (or MSP) or the time that has passed from the scanning start time of the spot light SP (or MSP). Accordingly, the measuring section 116 can generate the two-dimensional image data using the diffused light corresponding to the scanning position of the spot light SP (or MSP), by digitally sampling the detection signal (photoelectric signal) of the PIN photodiode at a position corresponding to the scanning portion (projection position) of the spot light SP (or MSP) with an A/D converter in response to a clock pulse of the clock signal LTC. Based on this image data, the measuring section 116 measures at least one of the position and the shape of the first pattern PT1 or the relative positional relationship between the first pattern PT1 and the second pattern PT2.

((Fifth Modification)) In the first and second embodiments (including the modifications) described above, the electro-optic elements (intensity modulating sections) 36, serving as the drawing light modulators, provided in the pulsed light generating sections 20 of the light source apparatuses LSa and LSb are switched using the drawing bit sequence data SBa (serial data DL1 to DL3) and SBb (serial data DL4 to DL6). However, in the fifth modification, instead of the electro-optic element 36, a drawing optical element AOM is used as the drawing light modulator. This drawing optical element AOM is an acousto-optic modulator (AOM).

Figure 23:
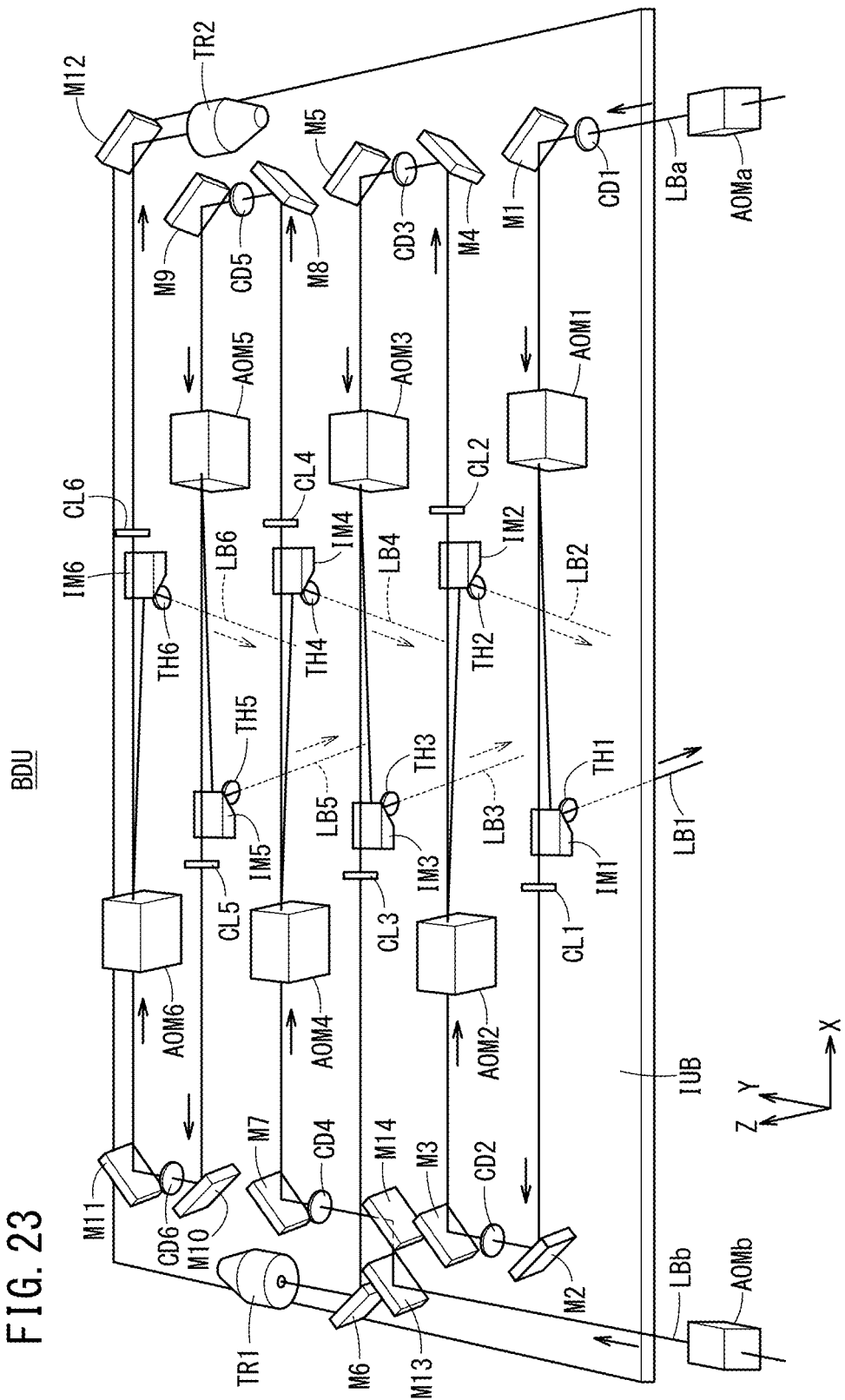
FIG. 23 is a diagram showing an exemplary arrangement of the drawing optical elements in the fifth modification, using the drawing optical elements, instead of the electro-optic elements, to modulate the intensity of the spot light according to the pattern data.

FIG. 23 is a diagram showing an exemplary arrangement of the drawing optical elements AOM in a case where the drawing optical elements AOM, instead of the electro-optic elements 36, are used to modulate the intensity of the spot light according to the pattern data. A drawing optical element (intensity modulating section) AOM (referred to below as AOMa) is arranged between the light source apparatus LSa and the selection optical element AOM1 to which the beam LBa from the light source apparatus LSa is first incident, among the selection optical elements AOM1 to AOM3 of the beam switching section BDU. Similarly, a drawing optical element (intensity modulating section) AOM (referred to below as AOMb) is arranged between the light source apparatus LSb and the selection optical element AOM4 to which the beam LBb from the light source apparatus LSb is first incident, among the selection optical elements AOM4 to AOM6 of the beam switching section BDU. This drawing optical element AOMa is switched according to the drawing bit sequence data SBa (serial data DL1 to DL3), and the drawing optical element AOMb is switched according to the drawing bit sequence data SBb (serial data DL4 to DL6). This drawing optical element AOMa (AOMb) transparently passes the incident beam LBa (LBb) and guides this beam LBa (LBb) to an absorbent body, not shown in the drawings, when the pixel logic information is "0", and emits first-order diffracted light obtained by diffracting the incident beam LBa (LBb) when the pixel logic information is "1". This emitted first-order diffracted light is guided to the selection optical element AOM1 (AOM4). Accordingly, when the pixel logic information is "0", the spot light SP is not projected onto the surface to be irradiated of the substrate P, and therefore the intensity of the spot light SP is low level (zero), and when the pixel logic information is "1", the intensity of the spot light SP is high level. In this way, it is possible to modulate the intensity of the spot light SP used for the scanning by the scanning units U1 to U3 (U4 to U6), according to the serial data DL1 to DL3 (DL4 to DL6).

Furthermore, a drawing optical element (intensity modulating section) AOMcn (AOMc1 to AOMc6) may be provided to every scanning unit Un (Una, Unb, or Unc). In this case, the drawing optical element AOMcn is arranged in front of the polygon mirror PM (or rocking member GM) as seen from the progression direction of the beam LBn. The drawing optical element AOMcn of each scanning unit Un (Una, Unb, or Unc) is switched according to each piece of serial data DLn. For example, the drawing optical element AOMc1 provided in the scanning unit U1 (U1a, U1b, or U1c) is switched according to the serial data DL1. The drawing optical element AOMcn of each scanning unit Un (Una, Unb, or Unc) guides the incident beam LBn to an absorbent body, not shown in the drawing, when the pixel logic information is "0", and emits first-order diffracted light obtained by diffracting the incident beam LBn when the pixel logic information is "1". This emitted first-order diffracted light (beam LBn) is projected onto the substrate P as the spot light SP guided to the polygon mirror PM (or the rocking member GM).

((Sixth Modification)) Furthermore, the scanning with the spot light SP (or MSP) of the beam LBn (or measurement light MLn) may be performed on regions where the marks MKm are formed. In this way, by having the light detector DTn (DTnm, DTRn) detect the reflected light (normal reflected light or diffused light) emitted by the marks MKm when the marks MKm are scanned by the beam LBn (or measurement light MLn), the measuring section 116 can measure the positions of the marks MKm. In this way, it is possible to detect shape distortion and the like of the exposure region W (first pattern PT1).

Figure 24:
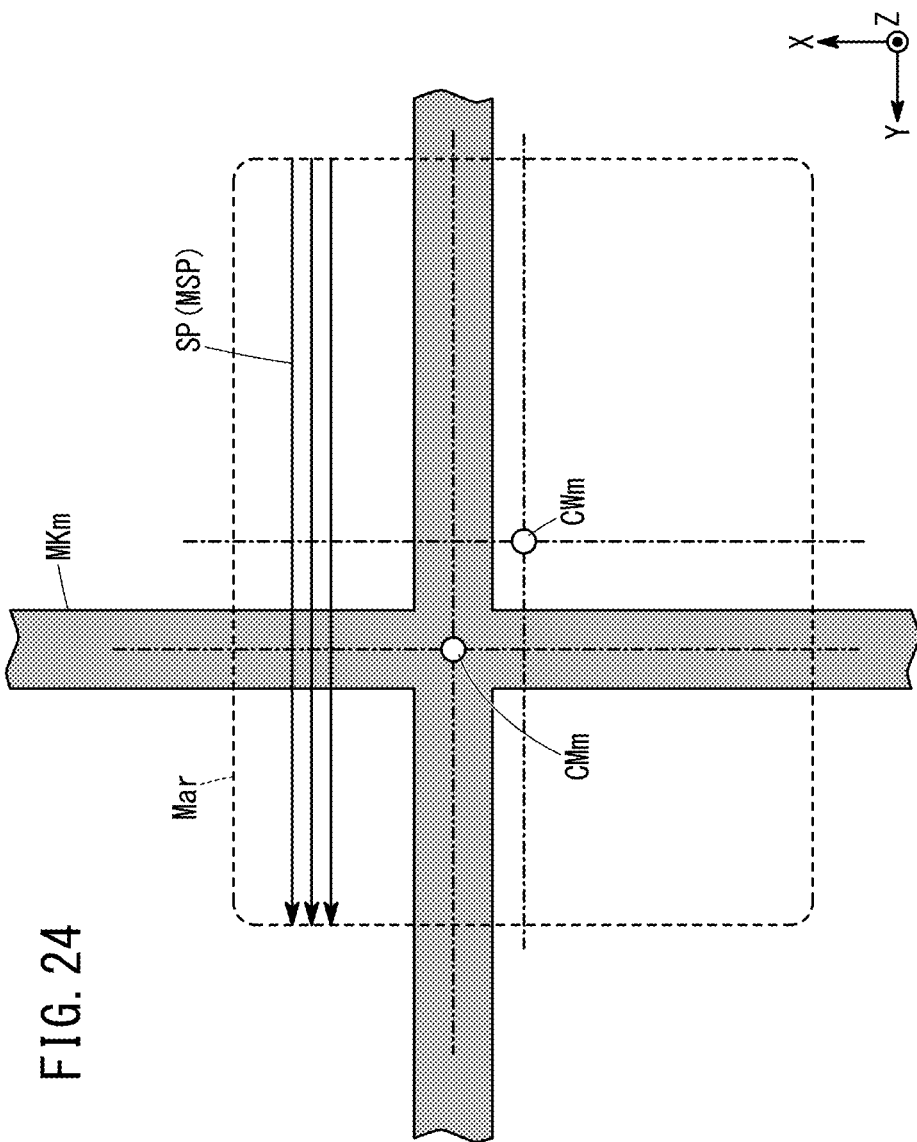
FIG. 24 is a drawing for describing the measurement of the positions of the marks for alignment using the measurement light.

FIG. 24 shows a state in which a cross-shaped mark MKm on the substrate P is scanned with the spot light SP (MSP). In the case where the mark is cross-shaped, as shown in FIG. 24, it is necessary to detect the cross-point CMm as the position of the mark MKm. Therefore, the beam LBn (or measurement light MLn) is set to the high level (ON state and scanning with the beam LBn (or measurement light MLn) is performed on a two-dimensional measurement region Mar centered on a predicted position CWm of the mark MKm on the substrate P determined in advance according to the design or on a predicted position CWm of the mark MKm determined by an immediately prior measurement by the alignment system (alignment microscopes AM11 to AM14). In other words, in a case where the measurement region Mar is two-dimensionally scanned with the spot light SP of the beam LBn for drawing, the rectangular measurement region Mar is a region corresponding to the dummy pattern PT2b described above in FIG. 11. Usually, the mark MKm is an unrelated pattern that does not function as a circuit pattern (first pattern PT1) for an electronic device, and it is not a problem for the resist layer of the measurement region Mar to be exposed by the scanning with the spot light SP for drawing.

The measuring section 116 analyzes the two-dimensional image data generated by the waveform of the photoelectric signal output from the light detector DTn (or DTnm or DTRn) as a result of the scanning with the spot light SP (MSP), obtains the position of the cross-point CMm of the mark MKm inside the measurement region Mar, and obtains the deviation (shift amount in each of the X and Y directions) thereof with respect to the predicted position CWm that is the center of the measurement region Mar. In this way, it is possible to confirm the shift amount of the predicted position CWm of the mark MKm measured by the alignment system (alignment microscopes AM11 to AM14). Usually, the alignment system (alignment microscopes AM11 to AM14) and each scanning unit Un (Una, Unb, and Unc) are adjusted precisely when arranged, such that the deviation between the predicted position CWm and the cross-point position CMm is within an allowable range. Therefore, in a case where a deviation occurs between the predicted position CWm and the cross-point position CMm that is outside the allowable range, it is predicted that drifting has occurred in the mechanical arrangement relationship due to expansion or contraction of the metal components caused by temperature change within the exposure apparatus EX. Alternatively, it is predicted that the substrate P supported on the outer circumferential surface of the rotating drum DR has experienced a micro-slipping phenomenon of slipping on the outer circumferential surface by an order of microns, while the mark MKm on the substrate P was moving from the position detected by the alignment system (alignment microscopes AM11 to AM14) to the position of the measurement region Mar scanned with the spot light SP or MSP.

Since the drifting caused by the temperature change in the exposure apparatus EX occurs gradually over time, if the deviation between the predicted position CWm and the position of the cross-point CMm is consecutively obtained using the marks MK1 and MK4 (see FIG. 4) lined up at constant intervals in the long dimension direction on the substrate P, it is possible to predict in advance whether the deviation is outside the allowable range based on the trend and amount of the change in this drifting, and to make a correction. Furthermore, for the micro-slipping phenomenon, it is possible to predict the position at which the micro-slipping occurred and the slippage amount of the micro-slipping in advance immediately prior to the pattern drawing with the spot light SP for drawing, and also to correct the drawing depending on the slippage amount, by arranging the scanning line MSL1 of the spot light MSP resulting from the measurement light ML1 on the upstream side (−X direction), in the transport direction of the substrate P, an offset distance Ofx away from the drawing line SL1 of the spot light SP for drawing, and quickly analyzing the image data generated by the waveform of the photoelectric signal output from the light detector DTnm or DTRn, as shown in FIGS. 17A, 17B, and 18 relating to the second embodiment described above.

In a case where the deformation (expansion, contraction, and the like) of the substrate P is small, a case where the positional shift of the substrate P on the rotating drum DR in the transport direction (X direction) and width direction (Y direction) is small, or a case where the micro-slipping phenomenon is not observed, it is possible to measure the position of the cross-point CMm of the mark MKm with high accuracy using the light detector DTn (or DTnm or DTRn), even without using the alignment system (alignment microscopes AM11 to AM14). The micro-slipping phenomenon can also occur when the substrate P moves in the transport direction (sub scanning direction) from the position of the odd-numbered drawing lines SL1, SL3, and SL5 to the position of the even-numbered drawing lines SL2, SL4, and SL6, as shown in FIG. 3 and FIG. 4 above. In this case, for example, it is only necessary to compare the position in the sub scanning direction of the first pattern PT1 on the substrate P measured based on the waveform of the photoelectric signal from the light detector DT1 (or DT1m or DTR1) of the odd-numbered scanning unit U1 to the position in the sub scanning direction of the first pattern PT1 on the substrate P measured based on the waveform of the photoelectric signal from the light detector DT2 (or DT2m or DTR2) of the even-numbered scanning unit U2, and judge whether the difference between these positions matches a predetermined distance determined according to the design in the sub scanning direction. In this way, by comparing the position information in the sub scanning direction of the first pattern TP1 (main pattern TP1a or dummy pattern TP1b) measured based on the photoelectric signal from the light detector DTn (or DTnm or DTRn) of each odd-numbered scanning unit U1, U3, and U5 to the position information in the sub scanning direction of the first pattern TP1 (main pattern TP1a or dummy pattern TP1b) measured based on the photoelectric signal from the light detector DTn (or DTnm or DTRn) of each even-numbered scanning unit U2, U4, and U6, it is also possible to confirm the joining accuracy in the sub scanning direction or the joining accuracy in the main scanning direction for the second pattern TP2 (main pattern TP2a and dummy pattern TP2b) exposed by each of the odd-numbered scanning units Un and even-numbered scanning units Un.

Third Embodiment

In the first and second embodiments (including the modifications) described above, the scanning unit Un (Una, Unb, and Unc) draws the second pattern PT2 by performing scanning with the spot light SP using the polygon mirror PM, but in the third embodiment, the second pattern PT2 is drawn using a so-called DMD (digital micromirror device).

In the third embodiment, a drawing unit DUn having a DMD (spatial light modulating element) is included, instead of the scanning unit Un (Una, Unb, and Unc) including a polygon mirror PM. In this third embodiment as well, the drawing units DUn (DU1 to DU6) are arranged in a staggered arrangement in two rows in the transport direction (X direction) of the substrate P, and the drawing range is shared in the main scanning direction (Y direction) as well.

Figure 25:
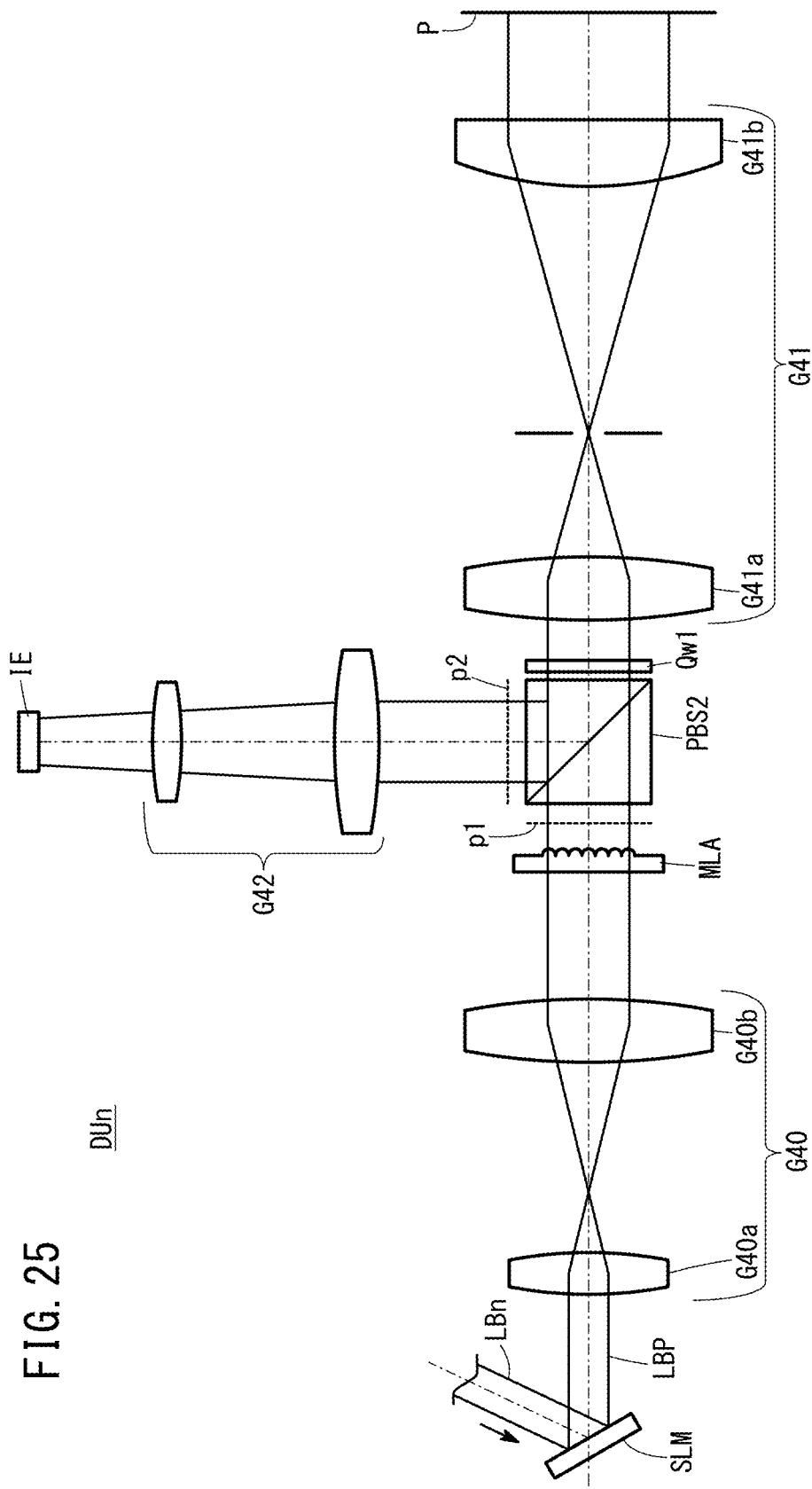
FIG. 25 is a diagram showing a configuration of a scanning unit of a third embodiment.

FIG. 25 is a diagram showing the configuration of the drawing unit DUn. The P-polarized beam (parallel light flux) LBn incident to the scanning unit DUn is incident to the drawing pattern shaping unit SLM formed by the DMD. The drawing pattern shaping unit SLM includes a plurality of micromirrors, not shown in the drawings, arranged in a matrix shape. The beam LBn that is a parallel light flux incident to the drawing pattern shaping unit SLM has a cross-sectional shape with a size matching the size of the region where the plurality of micromirrors of the drawing pattern shaping unit SLM are formed. By changing the inclination angle of each of these micromirrors, it is possible to switch whether the incident light is reflected toward a microlens array MLA, in micromirror units. Under the control of the control apparatus 16, the plurality of micromirrors have their inclination angles changed by a DMD drive section, not shown in the drawings. Specifically, the control section 16 turns the plurality of micromirrors ON/OFF according to the pattern data. A micromirror that is ON reflects the incident light toward the microlens array MLA, and a micromirror that is OFF reflects the incident light toward an absorbent body, not shown in the drawings. Accordingly, only the light reflected by micromirrors that are ON is guided to the microlens array MLA. Therefore, within the beam LBn reflected by the drawing pattern shaping unit SLM, the beam LBP guided to the microlens array MLA has a light pattern corresponding to the pattern data.

The beam LBP reflected by the drawing pattern shaping unit SLM is incident to the microlens array MLA, via a relay lens system G40 (condensing lens G40a and collimating lens G40b) that has an enlarging magnification factor. The condensing lens G40a condenses the beam LBP reflected by the drawing pattern shaping unit SLM, and the collimating lens G40b causes the diffused beam LBP, after being condensed by the condensing lens G40a, to be a parallel light flux. With the condensing lens G40a and the collimating lens G40b, it is possible to enlarge the beam LBP reflected to the microlens array MLA side. The microlens array MLA includes a plurality of microlenses (convex lenses) arranged in a matrix shape, and the microlenses are formed correspondingly to the plurality of micromirrors of the drawing pattern shaping unit SLM. The region where the plurality of microlenses of the microlens array MLA are formed is larger than the region where the plurality of micromirrors of the drawing pattern shaping unit SLM are formed. Accordingly, the relay lens system G40 enlarges the beam LBP such that the light reflected to the microlens array MLA by a micromirror of the drawing pattern shaping unit SLM is incident to the corresponding microlens.

The beam LBP transparently passed by the microlens array MLA, after being condensed to spot light at the focal point plane p1 of each microlens, diverges and is incident to a polarized beam splitter PBS2. The polarized beam splitter PBS2 transparently passes P-polarized light and reflects S-polarized light. Since the beam LBP is P-polarized light, the polarized beam splitter PBS2 transparently passes the beam LBP that has been transparently passed by each of the microlenses of the microlens array MLA. The beam LBP transparently passed by the polarized beam splitter PBS is projected onto the substrate P via a λ/4 wave plate QW1 and an imaging lens system G41 (including a first lens group G41 and a second lens group G41b). The imaging lens group G41 causes the focal point plane p1 on the emission side of the microlens array MLA and the surface of the substrate P to have an optically conjugate relationship (imaging relationship), and images and projects the spot light formed on the focal point plane p1 onto the substrate P.

Figure 26:
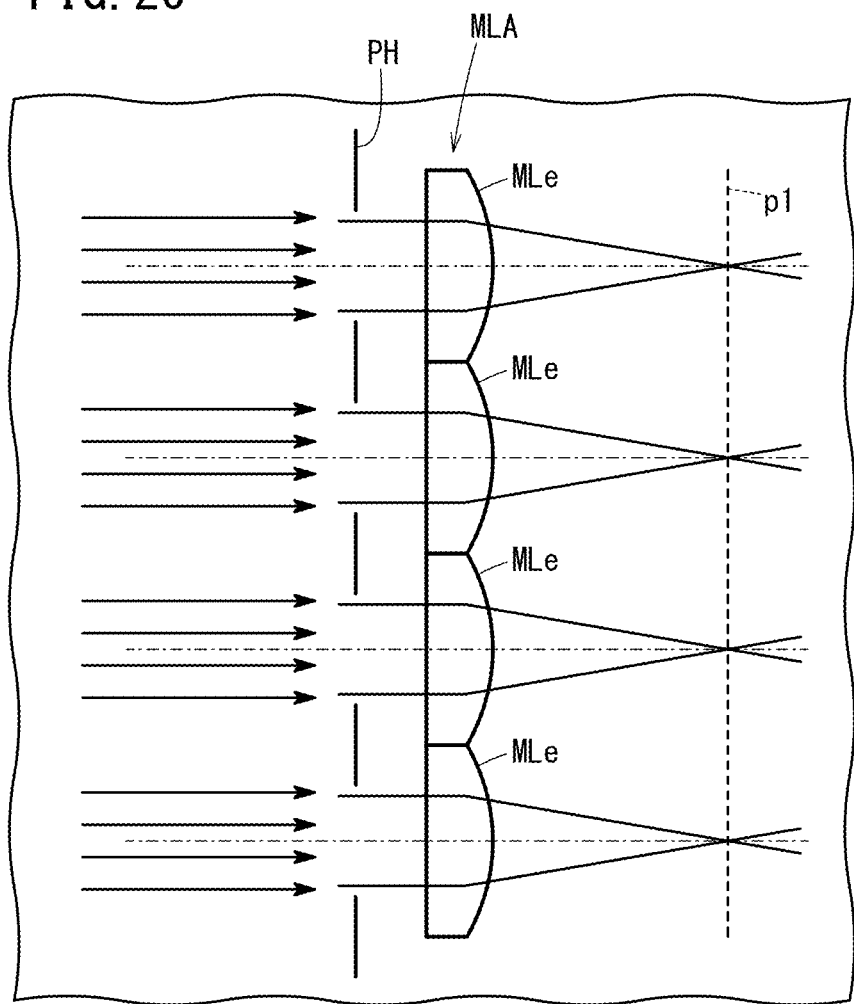
FIG. 26 is a diagram showing microlenses of the microlens array of FIG. 25.

Here, as shown in FIG. 26, the plurality of microlenses MLe of the microlens array MLA each condense the light reflected from the corresponding micromirror of the drawing pattern shaping section SLM toward the microlens array MLA on the focal point plane p1 at a position between the microlens array MLA and the polarized beam splitter PB2. The light incident to a corresponding microlens MLe from a micromirror is incident to the microlens MLe via a pin hole PH that functions as a diaphragm. The imaging lens system G41 is designed to cause the focal point plane p1 and the surface to be irradiated of the substrate P to have a conjugate relationship. Accordingly, the plurality of lights reflected from the plurality of micromirrors of the drawing pattern shaping section SLM toward the microlens array MLA become spot lights and are projected onto the substrate P. The pin hole PH may be arranged in the focal point plane p1, with a size corresponding to the diameter of the spot light (beam waist) formed at the focal point plane p1.

Furthermore, the reflected light resulting from the beam LBP (the spot light resulting from the beam emitted from each microlens MLe) projected onto the substrate P being reflected by the substrate P transparently passes through the imaging lens system G41 and the λ/4 wave plate QW1 to be incident to the polarized beam splitter PBS2. The reflected light from the substrate P incident to the polarized beam splitter PBS2 becomes S-polarized light due to the λ/4 wave plate QW1, and is therefore reflected by the polarized beam splitter PBS2. The reflected light resulting from the beam LBP being reflected by the polarized beam splitter PBS2 is incident to the light receiving surface of an image capturing element IE via the imaging lens system G42. The plane p2, positioned between the polarized beam splitter PBS2 and the lens system G42, and the surface to be irradiated of the substrate P have a conjugate relationship (imaging relationship). Accordingly, the reflected light, which is light that has been reflected toward the microlens array MLA by the plurality of micromirrors of the drawing pattern shaping section SLM to become spot light on the substrate P, becomes spot light whose intensity changes according to the reflective characteristics (reflectance and diffusion property) of the surface of the substrate P, in the plane p2. The imaging lens system G42 images each of the spot lights, distributed two-dimensionally on the plane p2 by the reflected light from the substrate P, on the light receiving surface of the image capturing element IE. The measuring section 116 can measure the position and shape of the first pattern PT1 or the relative positional relationship between the first pattern PT1 and the second pattern PT2, based on a video signal obtained by capturing the distribution of spot lights resulting from the reflected light captured by this image capturing element IE.

Fourth Embodiment

Figure 27:
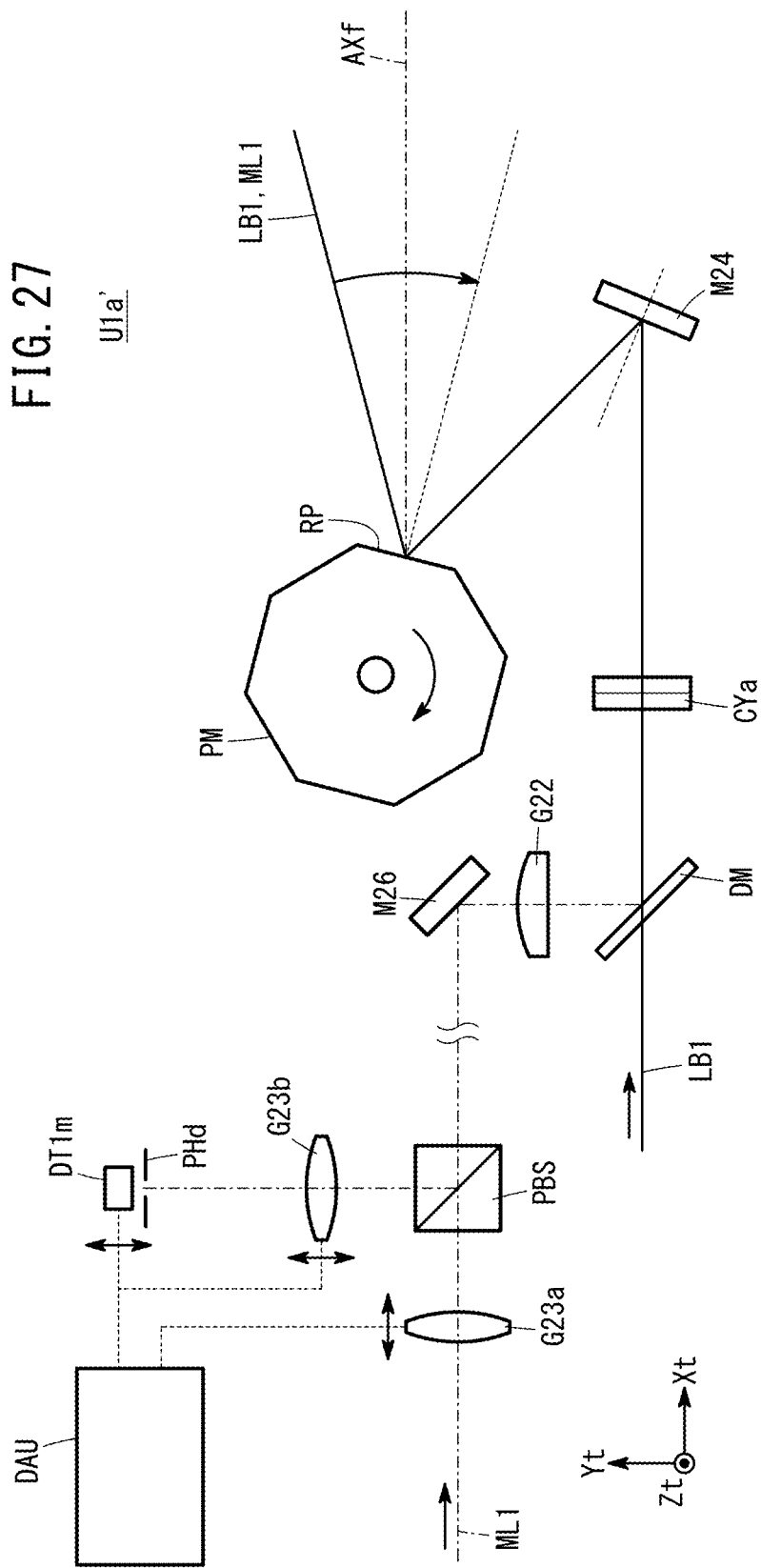
FIG. 27 is a diagram showing a portion of the configuration of a scanning unit of the fourth embodiment.

In each embodiment and the modifications thereof described above, the positional shift and overlap error of the first pattern PT1 formed on the substrate P are obtained based on the photoelectric signal from the light detector DTn (or DTnm or DTrn) provided to the scanning unit Un (or Una, Unb, or Unc), but the present embodiment has a function to check whether or not the spot light SP caused by the beam LBn for drawing and the spot light MSP caused by the no-photosensitivity measurement light MLn are set to be correctly focused on the surface of the substrate P and, when a focus shift occurs, to adjust this shift. FIG. 27 shows a portion of the configuration of a scanning unit U1a' according to the present embodiment, the basic configuration is the same as that of the scanning unit U1a shown in FIG. 14, and the differences are that lens systems G23a and G23b for correcting particularly the axial chromatic aberration (focal position shift) are provided, and that at least one of the light detector DT1m, the lens system G23a, and the lens system G23b can be adjusted in the optical axis direction or can be moved quickly back and forth.

In the configuration of FIG. 14, the no-photosensitivity measurement light ML1 from the light source apparatus LS2 for measurement is caused to be incident to the polarized beam splitter PBS as a parallel light flux, but in the present embodiment of FIG. 27, an adjustment is performed using the lens system G23a such that the measurement light ML1 incident to the polarized beam splitter PBS is slightly converged (or diverged) to correct the chromatic aberration. The measurement light ML1 that has been transparently passed by the polarized beam splitter PBS, as described in FIG. 14, is reflected by the dichroic mirror DM, passes through the first cylindrical lens CYa, and reaches one reflective surface RP of the polygon mirror PM where it is deflected within a plane parallel to the XtYt plane to be incident to the fθ lens FT. By adjusting the position of the lens system G23a in the optical axis direction, it is possible to adjust the size of the spot light MSP of the measurement light ML1 projected onto the substrate P. This means that the position of the beam waist of the measurement light ML1 converging on the substrate P side is shifted in the direction of the optical axis AXf of the fθ lens FT, i.e. a focus adjustment on the light transmission system side that adjusts the focal position of the measurement light ML1 in the optical axis direction. Furthermore, the normal reflected light from the substrate P resulting from the measurement light ML1 projected onto the substrate P is reflected by the polarized beam splitter PBS toward the light detector DT1m, but in the present embodiment, the lens system G23b for correcting the chromatic aberration is provided between the polarized beam splitter PBS and the light detector DT1m, and therefore the normal polarized light from the substrate P heading toward the light detector DT1m becomes a converged beam. A pin hole board PHd is arranged in front of the light detector DT1m.

The lens system G23b is a component that performs a correction such that the pin hole (miniature opening) of the pin hole board PHd and the surface of the substrate P have an optically conjugate relationship, in the wavelength region of the measurement light ML1, and can adjust the size of the spot light of the normal reflected light generated on the pin hole board PHd by adjusting the position of the lens system G23b in the optical axis direction. This means that the focus adjustment can be made on the light receiving system side as well. In such a configuration, when the light detector DT1m and the pin hole board PHd are a single body and moved in the optical axis direction, the amount of the normal reflected light transparently passing through the pin hole of the pin hole board PHd and reaching the light detector DT1m changes. When the position in the optical axis direction of the pin hole board PHd is set at a suitable position (best focus position), the amount of normal reflected light transparently passing through the pin hole becomes the maximum, and the amount of normal reflected light transparently passing through the pin hole decreases as the position is shifted away from this suitable position. Therefore, with a drive mechanism DAU, it is possible to quickly move at least one of the light detector DT1m with the attached pin hole board PHd and the lens system G23b, using a servo control in the optical axis direction or the like. Then, in a state where there is no stepped edge of the first pattern PT1 or the like in the scanning line MSL1 on the substrate P, the light detector DT1m with the attached pin hole board PHd or the lens system G23b is moved in a sweeping manner across a predetermined stroke range in the optical axis direction, while using the light detector DT1m to detect the change in the amount of normal reflected light emitted from the substrate P when scanned with the spot light MSP of the measurement light ML1. At this time, the photoelectric signal output from the light detector DT1 it a waveform having a maximum value when in a defocused state. By monitoring the position in the optical axis direction of the light detector DT1m with the attached pin hole board PHd or the lens system G23b at the time when this maximum value is reached, the position in the focusing direction of the substrate P at which the best focus state is realized is identified.

In this way, when measuring the position (focus position) in the optical axis (optical axis AXf of the fθ lens FT) direction of the surface of the substrate P using the measurement light ML1, the beam waist position of the beam LB1 for drawing projected from the fθ lens FT and the beam waist position of the measurement light ML1 should be aligned in the optical axis direction. In order to achieve this, the position in the optical axis direction of the lens system G23a is adjusted by the drive mechanism DAU, and the beam waist position of the measurement light ML1 is shifted in the optical axis direction. In such a state, when the shift amount from the focus position of the substrate P measured using the measurement light ML1 is greater than or equal to an allowable value, the beam waist position of the beam LB1 for drawing is also shifted in the optical axis direction from the surface of the substrate P. Therefore, for example, a configuration (focus adjustment configuration) is used by which it is possible to adjust, in the optical axis direction, the position of at least one of the two condensing lenses Be1 and Be2 of the beam expander BE shown in the scanning unit Un of FIG. 5 and the scanning unit Unc of FIG. 20, and the beam waist position of the beam LB1 for drawing that is projected from the fθ lens FT can be displaced in the direction of the optical axis AXf of the fθ lens FT. In this way, the focus adjustment mechanism that condenses the spot light SP of the of the beam LBn for drawing to be sharpest on the substrate P can be provided to each of the scanning units Un, Una, Unb, and Unc.

(Modifications of the Fourth Embodiment Described Above)

(First Modification) In the fourth embodiment described above, the spot light MSP of the measurement light ML1 is projected onto the substrate P, the reflected light from the substrate P is re-imaged as spot light on the pin hole board PHd, and the focus position of the substrate P can be confirmed based on the change in the amount of light transparently passing through the pin hole. In order to measure the change in the amount of light transparently passing through the pin hole, in the fourth embodiment, the light detector DT1m with the attached pin hole board PHd or the lens system G23b is moved in a sweeping manner in the optical axis direction. In other words, the drive mechanism DAU, a guide mechanism, or the like is necessary to move the light detector DT1m or the lens system G23b with mechanical precision, and so there is a concern that the scanning unit Una' (U1a' to U1b') will become larger. Therefore, in the present first modification, three light detectors DT1m with attached pin hole boards PHd are provided, such that the light detectors DT1m or the lens system G23b are not mechanically moved.

Figure 28:
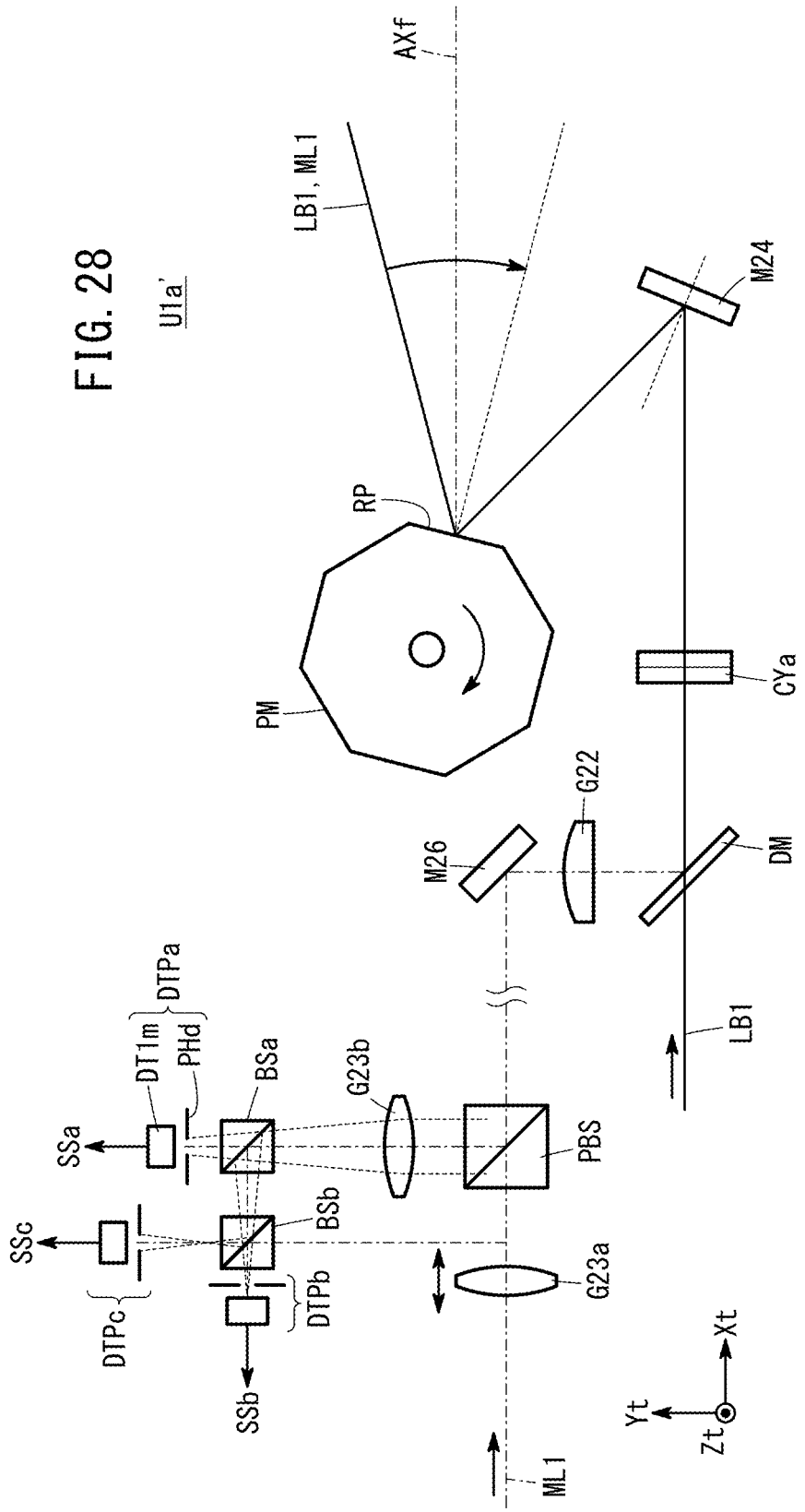
FIG. 28 shows a configuration of a scanning unit according to the first modification of the fourth embodiment.

FIG. 28 shows the configuration of a scanning unit U1a' according to the first modification of the fourth embodiment, the basic configuration is the same as that of the scanning unit U1a' shown in FIG. 27, and the difference is that two beam splitters BSa and BSb and three photoelectric sensor sections DTPa, DTPb, and DTPc are provided as a light receiving system following the lens system G23b that photoelectrically detects the reflected light of the measurement light ML1 emitted from the substrate P. Each of the photoelectric sensor sections DTPa, DTPb, and DTPc is formed by a light detector DT1m with an attached pin hole board PHd that is the same is in the fourth embodiment (FIG. 27). The reflected light of the measurement light ML1 that has been emitted from the polarized beam splitter PBS and passed through the lens system G23b becomes a converged light flux and is incident to the beam splitter BSa, to be split into a transparently passed component and a reflected component. The reflected light of the measurement light ML1 transparently passed through the beam splitter BSa reaches the photoelectric sensor section DTPa, and the reflected light of the measurement light ML1 that has been reflected by the beam splitter BSa is incident to the beam splitter BSb. The reflected light of the measurement light ML1 that has transparently passed through the beam splitter BSb reaches the photoelectric sensor section DTPb, and the reflected light of the measurement light ML1 that has been reflected by the beam splitter BSb reaches the photoelectric sensor section DTPc. The photoelectric signals output from the light detectors DT1m of the respective photoelectric sensor sections DTPa, DTPb, and DTPc are SSa, SSb, and SSc.

In FIG. 28, the reflected light (normal reflected light) emitted from the polarized beam splitter PBS and incident to the lens system G23b is indicated by a broken line, but here, the beam diameter of the reflected light is enlarged and exaggerated. When the surface of the substrate P is at the predetermined best focus position, the reflected light converged by the lens system G23b passes through the beam splitters BSa and BSb, and is condensed on the pin hole board PHd of the photoelectric sensor section DTPb. At this time, the reflected light that passes through only the beam splitter BSa and heads toward the photoelectric sensor section DTPa reaches the pin hole board PHd of the photoelectric sensor section DTPa at a position in front of the point where the reflected light condenses, and the reflected light that passes through the beam splitters BSa and BSb and heads toward the photoelectric sensor section DTPc reaches the pin hole board PHd of the photoelectric sensor section DTPc at a position behind the point where the reflected light condenses. In other words, the pin hole board PHd of the photoelectric sensor section DTPa is arranged at a front focal position that is in front of the condensing point of the beam of the converged normal reflected light, the pin hole board PHd of the photoelectric sensor section DTPb is arranged at a focal position that is the condensing point of the beam of the converged normal reflected light, and the pin hole board PHd of the photoelectric sensor section DTPc is arranged at a back focal position that is behind the condensing point of the beam of the converged normal reflected light.

Figure 29:
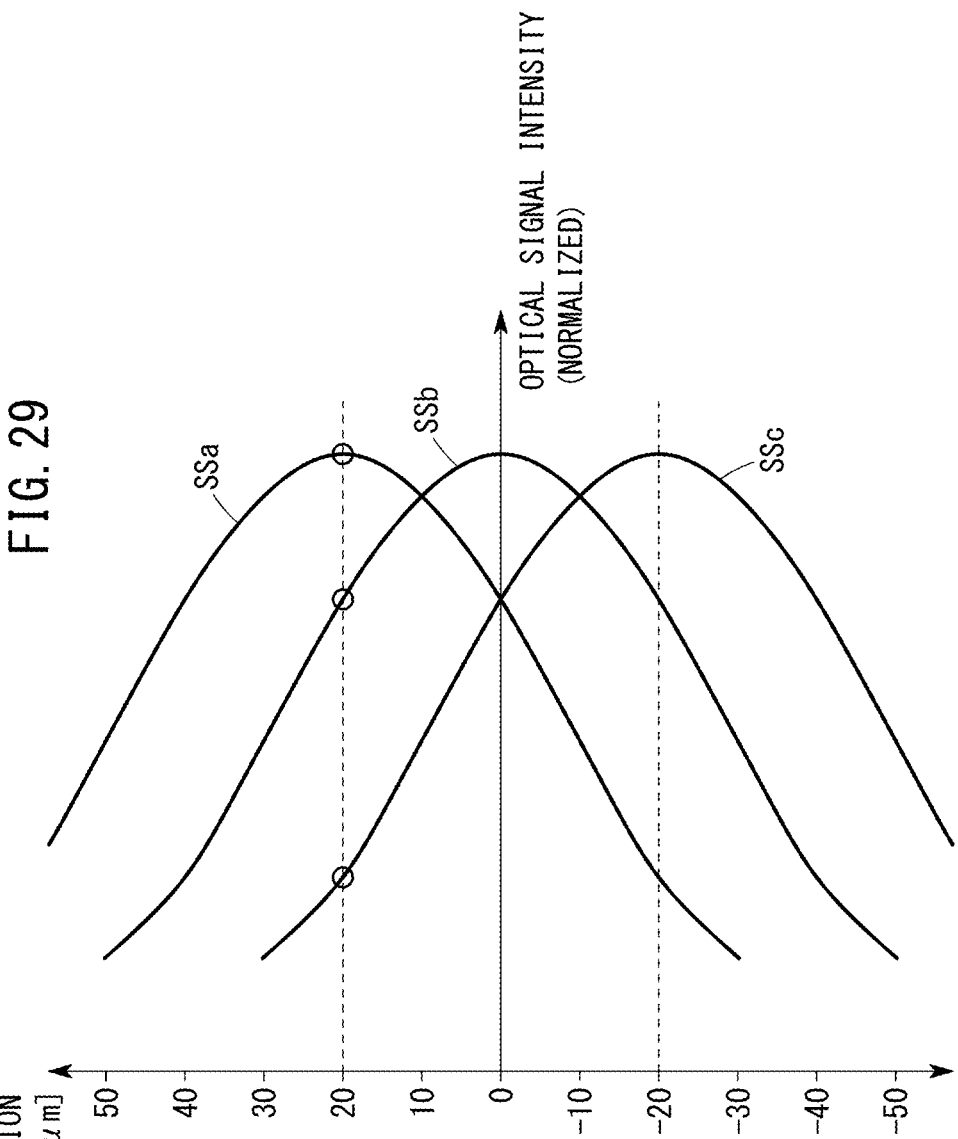
FIG. 29 shows a relationship between the focus position of the substrate and the intensity of the photoelectric signal from each of the three photoelectric sensor sections shown in FIG. 28.

The photoelectric signals SSa, SSb, and SSc output from the respective photoelectric sensor sections DTPa, DTPb, and DTPc have intensities that change according to characteristics such as shown in FIG. 29, for example, with respect to the change in the focus position of the substrate P. In FIG. 29, the vertical axis indicates the focus position (±50 µm range) of the substrate P, and the horizontal axis indicates the normalized value of the intensity of the photoelectric signals SSa, SSB, and SSc. A state in which the surface of the substrate P matches the best focus position is set as focus position zero. When the surface of the substrate P is displaced in the +Zt direction and reaches the position of +20 µm in FIG. 29, for example, the intensities of the normalized photoelectric signals SSa, SSb, and SSc have a magnitude relationship of SSa>SSb>SSc. Furthermore, when the surface of the substrate P is at the best focus position (position of 0 µm in FIG. 29), the normalized photoelectric signal SSb is largest and the intensities of the photoelectric signals SSa and SSc are almost the same intensity, which is less than the photoelectric signal SSb. Furthermore, when the surface of the substrate P is displaced in the −Zt direction and reaches the position of −20 µm in FIG. 29, for example, the intensities of the normalized photoelectric signals SSa, SSb, and SSc have a magnitude relationship of SSc>SSb>SSa.

In this way, it is possible to measure the change in the focus position of the surface of the substrate P in real time by monitoring the magnitude relationship among the photoelectric signals SSa, SSb, and SSc, based on the characteristics (change curve in FIG. 29) of the intensity change of the normalized photoelectric signals SSa, SSb, and SSc. In order to perform an initial adjustment, the lens system G23a should be able to perform a position adjustment manually in the optical axis direction. According to the modification such as in FIG. 28 and FIG. 29 above, the drive mechanism DAU or the like that mechanically linearly moves the light detector DT1m with the attached pin hole board PHd and the lens system G23b is unnecessary, and therefore vibration that accompanies driving no longer occurs, and it is possible to prevent a decrease in the measurement accuracy of not only the measurement of the focus position, but also of the position measurement of the first pattern PT1 on the substrate P using the beam LB1 for drawing and the like.

Figure 30:
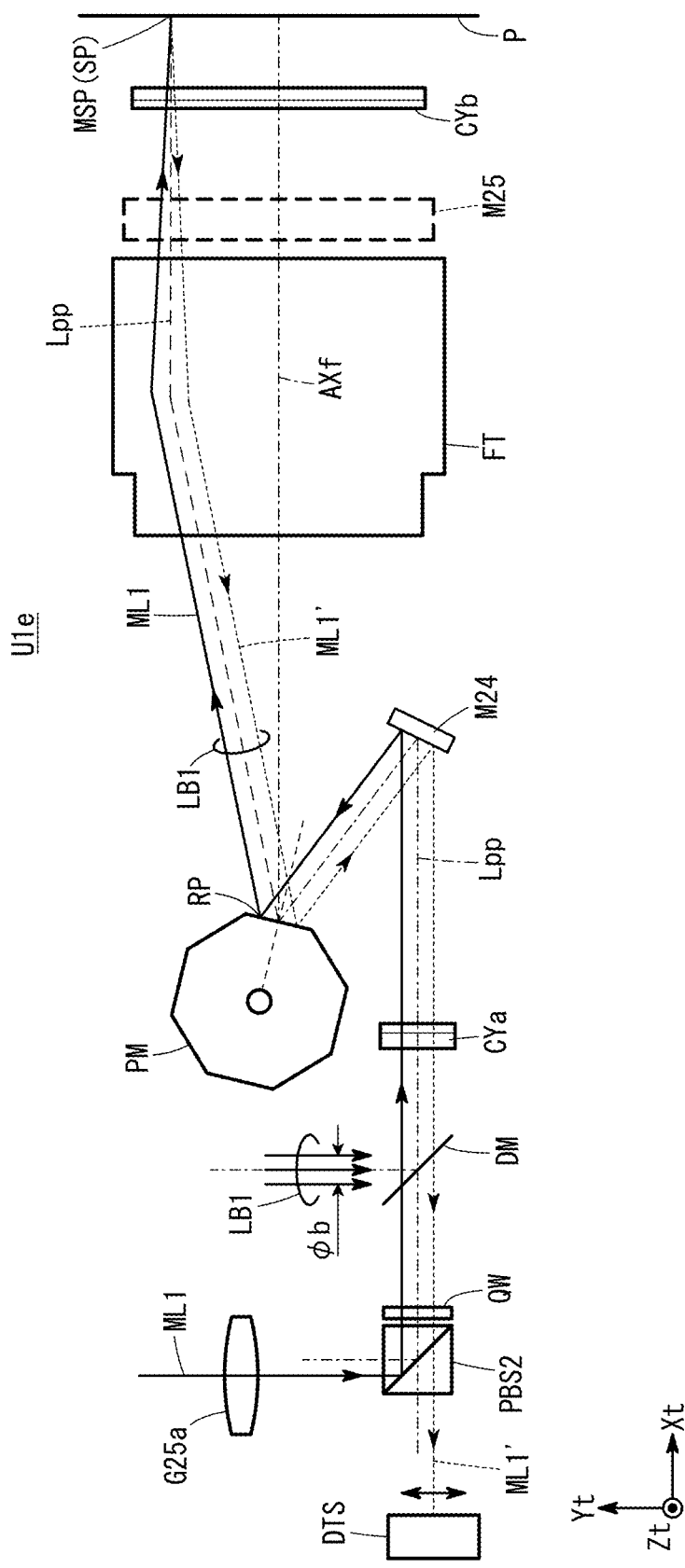
FIG. 30 shows a configuration of a scanning unit according to the second modification of the fourth embodiment.

(Second Modification) In the first modification above, a light receiving system was used in which the photoelectric sensor sections DTPa, DTPb, and DTPc are arranged respectively for three focal positions, but in the second modification, the change of the focus position (Zt direction position) of the surface of the substrate P is measured using a so-called pupil division method. One type of pupil division method includes limiting the beam LBn that passes through a telecentric projection lens system (here, the fθ lens FT) and irradiates the substrate P in a manner to pass through a region eccentric to one side from the optical axis within the incidence pupil of the projection lens system, setting a principal light ray of the beam reaching the substrate P as inclined illumination that is inclined to one side from the telecentric state, and, when the normal reflected light from the substrate P passes through the projection lens system and passes through the inside of the incidence pupil, measuring the amount of horizontal shift indicating how much shift there is from the original position where the normal reflected light was supposed to pass through the incidence pupil. FIG. 30 shows the configuration of a scanning unit U1e (Une) incorporating a focus position monitor using such a pupil division method, and the optical configuration from the dichroic mirror DM to the substrate P is the same as in FIG. 14, FIG. 27, and FIG. 28 above.

In FIG. 30, the measurement light ML1 (linearly polarized light) with a separate wavelength from the light source apparatus LS2, not shown in the drawing, is reflected by the polarized beam splitter PBS2 via the lens system G25a, passes through the ¼ wave plate QW to become circularly polarized light, and transparently passes through the dichroic mirror DM. From the dichroic mirror DM, the measurement light ML1 and the beam LB1 for exposure head toward the cylindrical lens CYa with the principal rays thereof in a parallel state. At this time, the beam LB1 has a constant thickness φb corresponding to the number of openings (NA) of the spot light SP projected onto the substrate P in the paper plane (XtYt plane) of FIG. 30. The beam LB1 is reflected by the reflective surface RP of the polygon mirror PM while maintaining the thickness φb in the XtYt plane, to be incident to the fθ lens FT. Accordingly, the beam LB1 is condensed as the spot light SP on the substrate P by the refractive power of the fθ lens FT in the XtYt plane (main scanning direction). With the principal light ray (center line of the beam) of the beam LB1 emitted from the fθ lens FT being Lpp, the principal light ray Lpp is in a telecentric state perpendicular to the surface of the substrate P.

On the other hand, the measurement light ML1 that has passed through the polarized beam splitter PBS2 (and ¼ wave plate QW) and transparently passed through the dichroic mirror DM is made into a parallel light flux narrower than the thickness φb of the beam LB1 for exposure by the lens system G25a and, in a state (here, a state shifted in the −Yt direction) of being eccentric relative to the principal ray Lpp of the beam LB1, progresses in parallel with the beam LB1 to pass through the cylindrical lens CYa and the reflective mirror M24 to reach the reflective surface of the polygon mirror PM. The measurement light ML1 is converged in the Zt direction by the effect of the cylindrical lens CYa and, on the reflective surface RP of the polygon mirror PM becomes slit-shaped spot light compressed in the Zt direction and condenses. The measurement light ML1 reflected by the reflective surface RP of the polygon mirror PM is incident to the fθ lens FT in parallel with the principal light ray Lpp of the beam LB1, and reaches the substrate P via the reflective mirror M25 and the cylindrical lens CYb. The measurement light ML1 passes through the position of the reflective surface RP of the polygon mirror PM, i.e. a position in the plane of the incidence pupil (front side focal point) of the fθ lens FT that is eccentric in the main scanning direction (Yt direction) relative to the principal light ray Lpp of the beam LB1, and therefore the measurement light ML1 projected onto the substrate P is in a state of being inclined at a certain angle in the main scanning direction relative to the principal light ray Lpp. In other words, the measurement light ML1 is in a non-telecentric state in the main scanning direction (Yt direction) on the substrate P. The measurement light ML1 is also condensed as the spot light MSP on the substrate P, without being affected by the surface tilt error of the reflective surface RP of the polygon mirror PM due to the effect of the two cylindrical Lenses CYa and CYb arranged in front of and behind the fθ lens FT.

The normal reflected light ML1' emitted from the surface of the substrate P due to the projection of the measurement light ML1 (spot light MSP) onto the substrate P is incident, inclined in the main scanning direction with an angle almost symmetrical with the measurement light ML1 relative to the principal light ray Lpp of the beam LB1, to the fθ lens FT. The normal reflected light ML1' that has passed through the fθ lens FT passes in an approximately parallel manner through the optical path on a side of the principal light ray Lpp opposite the optical path of the measurement light ML1 in a manner to sandwich the principal light ray Lpp, and transparently passes through the reflective surface RP of the polygon mirror PM, the reflective mirror M24, the cylindrical lens CYa, and the dichroic mirror DM to arrive at the polarized beam splitter PBS2 (and the ¼ wave plate QW).

Figure 31:
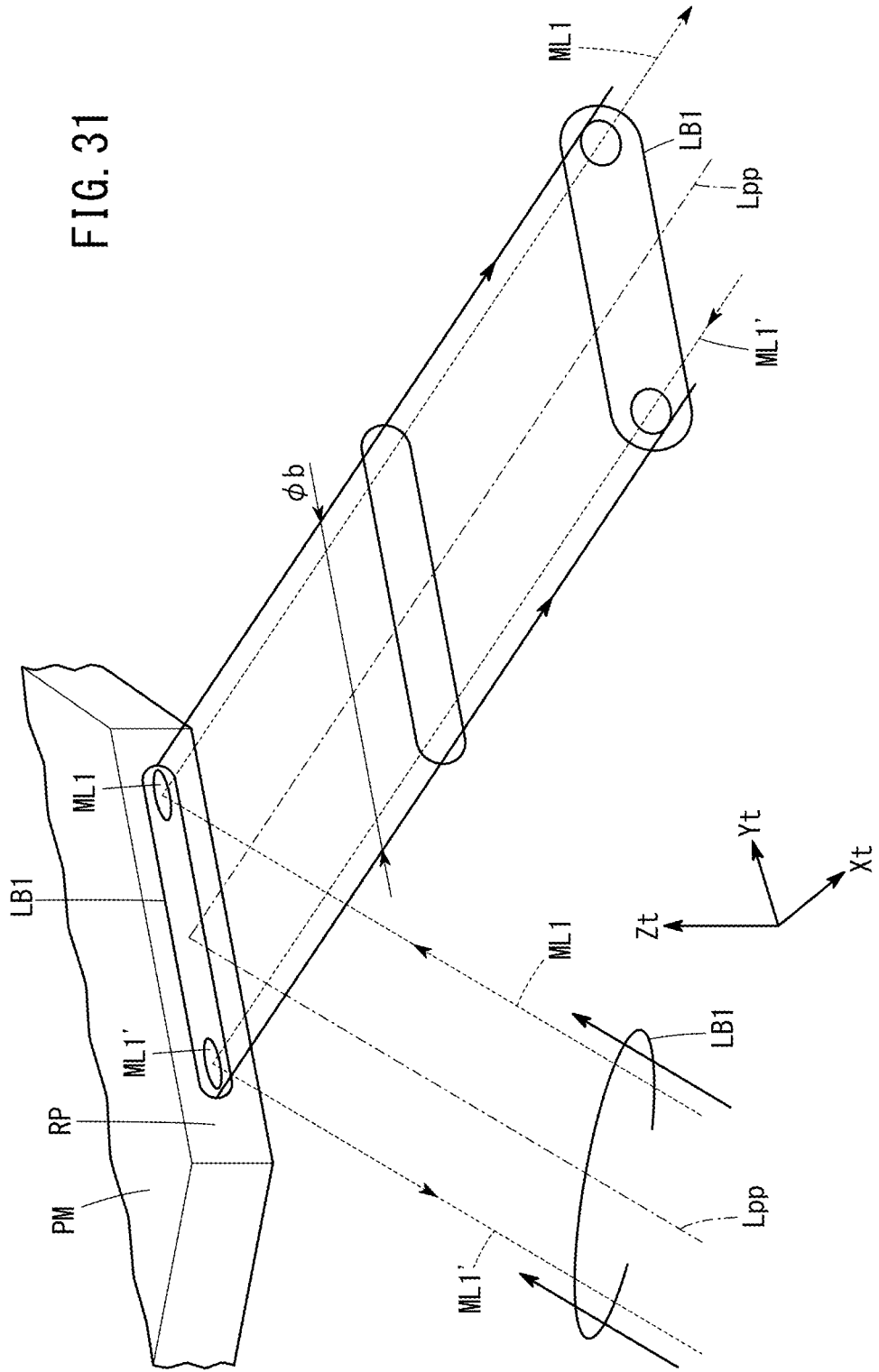
FIG. 31 schematically shows the state of the beam LB1, the measurement light ML1, and the normal reflected light ML1' near the reflective surface RP of the polygon mirror shown in FIG. 30.

Here, the states of the beam LB1, the measurement light ML1, and the normal reflected light ML1' near the reflective surface RP (position of the incidence pupil of the fθ lens FT) of the polygon mirror PM are described schematically with FIG. 31. The beam LB1 for exposure, on the reflective surface RP of the polygon mirror PM, is compressed in only the Zt direction due to the effect of the cylindrical lens CYa to have a slit shape extending thinly in the main scanning direction (deflection direction). Accordingly, the beam LB1 reflected by the reflective surface RP maintains the original thickness φb in the main scanning direction (deflection direction), becomes diverged light in the Zt direction (sub scanning direction), and becomes incident to the fθ lens FT. On the other hand, the measurement light ML1, due to the effect of the cylindrical lens CYa, has a slit shape compressed only in the Zt direction near the end portion in the main scanning direction (deflection direction) on the reflective surface RP of the polygon mirror PM, i.e. near the end portion of the beam LB1 compressed into a slit shape. Accordingly, the measurement light ML1 reflected by the reflective surface RP maintains the original thickness in the main scanning direction (deflection direction), becomes diverged light in the Zt direction (sub scanning direction), and becomes incident to the fθ lens FT.

The normal reflected light ML1' emitted from the substrate P passes in an approximately parallel manner through the optical path on a side of the principal light ray Lpp opposite the optical path of the measurement light ML1 in a manner to sandwich the principal light ray Lpp, and reaches the reflective surface RP of the polygon mirror PM, but the normal reflected light ML1' has a slit shape compressed only in the Zt direction near the end portion in the main scanning direction (deflection direction) on the reflective surface RP of the polygon mirror PM, i.e. near the end portion of the beam LB1 compressed into a slit shape on the side opposite the position of the measurement light ML1.

In a state where the surface of the substrate P is at the best focus position (predetermined position in the Zt direction), the optical path of the normal reflected light ML1' heading toward the reflective surface RP of the polygon mirror PM is parallel to the principal light ray Lpp and at a position symmetrical with the optical path of the measurement light ML1 relative to the principal light ray Lpp. However, when the surface of the substrate P is defocused in the Zt direction from the best focus position, the position of the normal reflected light ML1' on the reflective surface RP of the polygon mirror PM changes in the longitudinal direction (deflection direction) of the slit-shaped distribution of the beam LB1. The degree of this change corresponds to the amount of defocus (focal shift amount) from the best focus position of the substrate P. Therefore, as shown in FIG. 30, the normal reflected light ML1' that has transparently passed through the ¼ wave plate QW and the polarized beam splitter PBS2 is received by the photoelectric sensor section formed by the image capturing element such as a CCD or CMOS, and the positional change of the spot of the normal reflected light ML1' projected onto the image capturing surface is monitored. Although not shown in FIG. 30, a lens system may be provided between the polarized beam splitter PBS2 and the photoelectric sensor section DTS, such that the reflective surface RP of the polygon mirror PM and the image capturing surface of the photoelectric sensor section DTS have an imaging relationship in the main scanning direction (Yt direction in FIG. 30). Furthermore, as the position of the measurement light ML1 projected onto the reflective surface RP of the polygon mirror PM becomes farther from the position of the principal light ray Lpp of the beam LB1, the inclination angle in the main scanning direction of the measurement light ML1 projected onto the substrate P relative to the principal light ray Lpp becomes larger, and the ratio of the positional change amount of the spot of the normal reflected light ML1' on the image capturing surface of the photoelectric sensor section DTS to the defocus amount, i.e. the focus change measurement sensitivity, becomes larger.

As described above, with the present second modification as well, in the same manner as the first modification of FIG. 28, it is possible to measure the change of the defocus amount of the surface of the substrate P in real time. Furthermore, the drive mechanism DAU or the like that mechanically linearly moves the photoelectric sensor section including the light detector DT1m with the attached pin hole board PHd, the lens system, and the like is unnecessary, and therefore vibration that accompanies driving no longer occurs, and it is possible to prevent a decrease in the measurement accuracy of not only the measurement of the focus position, but also of the position measurement of the first pattern PT1 on the substrate P using the beam LB1 for drawing or the measurement light ML1. Furthermore, in the scanning units Una' and Une as well, shown in each of the fourth embodiment of FIG. 27, the first modification of FIG. 28, and the second modification of FIG. 30 above, in order to correct the chromatic aberration caused by the wavelength difference between the beam LB1 for drawing and the measurement light ML1, it is good to use a device optically designed for achromatic correction as the fθ lens FT or to provide a lens for chromatic error correction of the optical path of the measurement light ML1 and the reflected light thereof (normal reflected light ML1').

In the first to fourth embodiments and each of the modifications thereof described above, the light source apparatuses LSa and LSb that generate the beams LBn (LB1 to LB6) for exposure are components that generate beams with a single specified wavelength (e.g. 355 nm in the ultraviolet wavelength region), but one or more beams in the ultraviolet wavelength region whose wavelengths are slightly different from a specified wavelength may be coaxially combined and used as the beam LBn for exposure. Furthermore, the measurement lights MLn (ML1 to ML6) are also emitted from the light source apparatus LS2 that emits a single beam in a wavelength band longer than the ultraviolet wavelength region, but the light source apparatus LS2 may be a light source apparatus that emits a plurality of beams with different wavelengths and, according to the difference of the materials of the first pattern PT1 on the substrate P and the reflective characteristics corresponding to the photosensitive layer (resist layer) applied to the surface of the substrate P, the wavelength of the measurement light MLn being used may be switched and the position and shape of the same first pattern PT1 may be measured with a plurality of wavelengths. The measurement light MLn (ML1 to ML6) is preferably in a wavelength region to which the photosensitive layer on the substrate P has almost no sensitivity, and if this wavelength differs from the wavelength of the beam LBn (LB1 to LB6) for exposure, this may be a wavelength to which the photosensitive layer has a fair amount of sensitivity.

Fifth Embodiment

Figure 32:
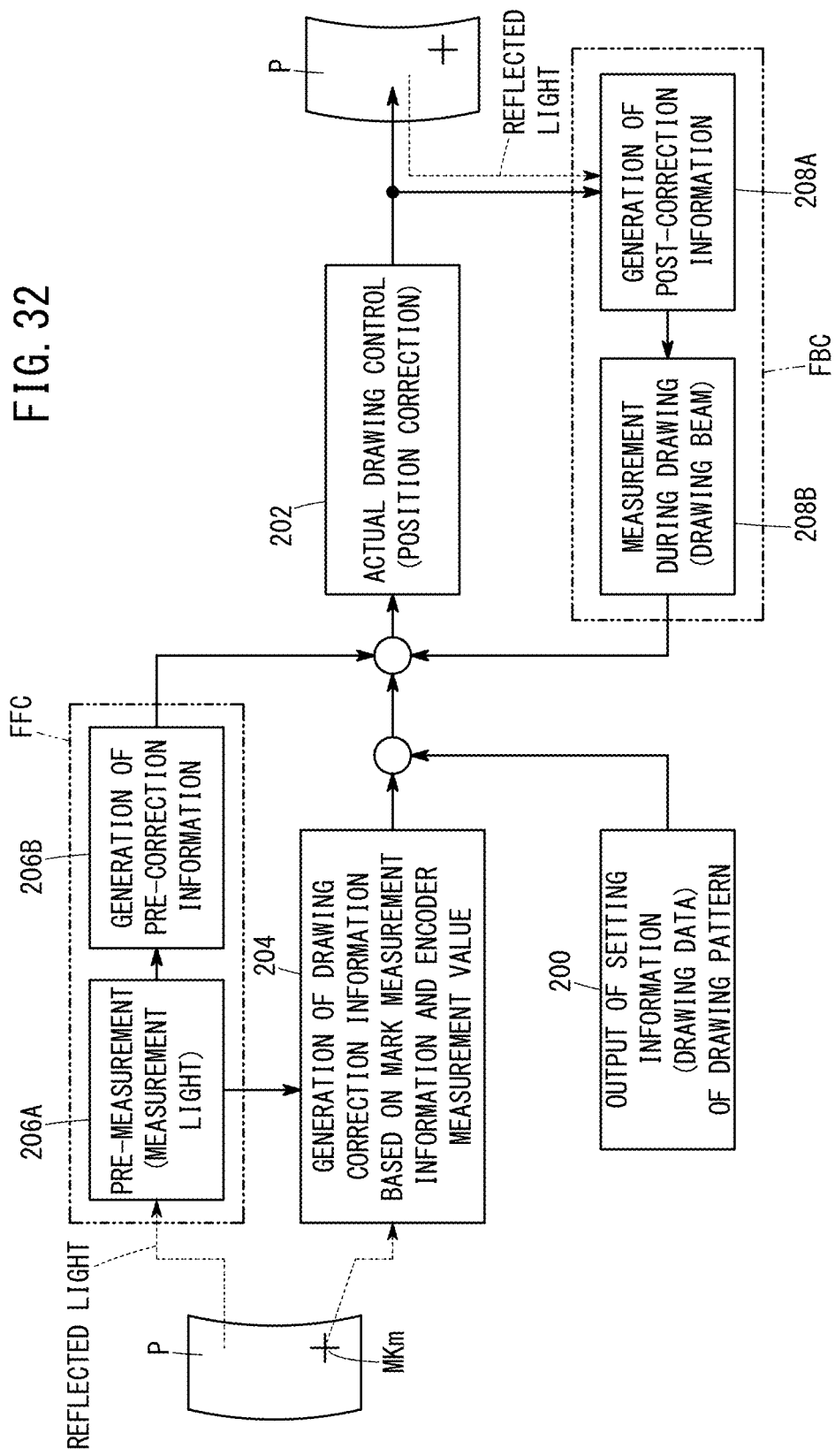
FIG. 32 is a diagram showing sequences, operations, and the like performed during the pattern drawing control according to the fifth embodiment, as function blocks.

FIG. 32 is a diagram showing sequences, operations, and the like performed during the pattern drawing control according to the fifth embodiment, as function blocks. In the present embodiment, as shown in FIG. 17A, FIG. 17B, and FIG. 18 in particular, it is assumed that a scanning line MSLn (MSL1 to MSL6) caused by the spot light MSP of the measurement light MLn (ML1 to ML6) draws a pattern on the substrate P using a scanning unit Una (U1a to U6a) positioned at a distance of the offset distance Ofx on the upstream side in the transport direction (sub scanning direction) of the substrate P from the drawing line SLn (SL1 to SL6) caused by the spot light SP of the beam LBn (LB1 to LB6) for drawing. However, the scanning unit capable of being used in the present embodiment may be any one of the scanning units in FIG. 19, FIG. 20, FIG. 22, FIG. 27, FIG. 28, and FIG. 30.

In FIG. 32, in a first exposure mode for initially drawing the first pattern TP1 (main pattern TP1a and dummy pattern TP1b) and the mark MKm on the substrate P, as shown in function (process) 200, the drawing data (first pattern TP1 design information and CAD information) stored in the drawing data output section 112 of the integrated control section 104 shown in FIG. 13 is sent to function (process) 202 for performing the actual drawing control In the first exposure mode, the mark MKm is also exposed on the substrate P, and therefore data for drawing the mark MKm is also included in the drawing data sent out from the function (process) 200. Furthermore, function (process) 204 generates the correction information for correcting the drawing state (drawing position, drawing shape, drawing magnification, and the like) based on the mark measurement information and encoder measurement values), but in the first exposure mode, the mark MKm is not yet formed on the substrate P, and therefore only the correction information based on the encoder count values is generated.

Function (process) 206A of pre-measurement for detecting the reflected light emitted when the measurement light MLn is projected onto the first pattern PT1 (or mark MKm) formed on the substrate P and function (process) 206B for generating pre-measurement correction information for correcting the drawing state immediately prior, based on the pre-measured information (photoelectric signal and the like) cannot be used during the first exposure mode. Accordingly, in function (process) 202, the first pattern TP1 and the mark MKm are drawn while positionally correcting the drawing data sent out from function (process) 200 according to correction information based on the encoder measurement values sent out from the function (process) 204.

In the case of overlapping exposure on the substrate P where the first pattern TP1 and the mark MKm have been formed in the first exposure mode, i.e. a case of applying the second exposure mode, the basic control sequence is that when exposing the second pattern TP2 on the substrate P during the actual drawing control of function (process) 202 based on the drawing data of the second pattern TP2 (main pattern TP2a and dummy pattern TP2b) sent out from the function (process) 200, the position correction is performed according to the correction information generated by function (process) 204. However, in the second exposure mode, information for correcting shape deformation and the like of the exposure region W including the first pattern TP1 identified based on the measurement information of the mark MKm on the substrate P is included in the correction information generated in function (process) 204. Furthermore, in the second exposure mode, function (process) 206A of pre-measurement using the measurement light MLn and function (process) 206B for generating the pre-measurement correction information are used, and in function (process) 202 for performing the actual drawing control, the pre-measurement correction information generated by function (process) 206B is also taken into consideration to perform, immediately prior to the actual drawing, a correction such as improving the overlap accuracy on average in the overall exposure region W (region exposed by each scanning unit Una). Of course, in function (process) 206A, if the pre-measured position of the first pattern TP1 is within an allowable range relative to a predetermined position, the pre-measurement correction information is not generated. In this way, function (process) 206A of pre-measurement using the measurement light MLn and function (process) 206B for generating the pre-measurement correction information function as a feed forward control section FFC for realizing favorable overlap accuracy in the alignment control during the second exposure mode.

When performing overlapping exposure in the second exposure mode, the reflected light of the beam LBn for drawing projected onto the substrate P is detected by the light detector DTn (FIG. 5 and FIG. 13) or the like, and the relative positional shift (overlap error) between the second pattern TP2 exposed overlapping with the first pattern PT1 on the substrate can be measured in real time by the measuring section 116 in FIG. 13. Therefore, while the overlapping exposure is being performed, function (process) 208A of measurement during drawing of the overlap error using the beam LBn for drawing and function (process) 208B for generating the post-correction information for correcting the overlap error measured based on the photo-sensitive signal and the like output from the light detector DTn during drawing are used, and in function (process) 202 for performing actual drawing control, the post-correction information generated by function (process) 208B is also taken into consideration to perform a correction of the drawing position such as decreasing the overlap accuracy on average in the overall exposure region W (e.g. region exposed by each scanning unit Una). Of course, in function (process) 208A, if the overlap error measured in real time during drawing is within an allowable range, the post-correction information is not generated. In this way, function (process) 208A of measurement during drawing and function (process) 208B for generating the post-measurement correction information function as a feedback control section FBC for realizing favorable overlap accuracy in the alignment control during the second exposure mode.

As described above, in the alignment (positioning) control during the second exposure mode (overlapping exposure), by using both the feed forward section FFC and the feedback section FBC, even when a large amount of distortion occurs in the substrate P and the exposure region W is greatly deformed, it is possible to very finely correct the drawing state (drawing position, drawing magnification, drawing line inclination, and the like) in accordance with this deformation, and therefore good overlap accuracy can be maintained for the entire exposure region W. In a case where the substrate P has little distortion (expansion, contraction, and the like) and the exposure region W has little deformation, even in the second exposure mode a control method employing only one of the feed forward control section FFC and the feedback control section FBC may be used. Alternatively, during the exposure of one exposure region W, suitable switching may be performed between control using either one of the feed forward control section FFC and the feedback control section FBC and control using both the feed forward control section FFC and the feedback control section FBC, according to the positional change in the sub scanning direction of the drawing line SLn on the exposure region W.

In this way, the exposure apparatus EX of the present embodiment is an apparatus that projects the drawing beam LBn whose intensity has been changed according to the pattern data onto the substrate P, to newly draw the second pattern PT2 on the substrate P. The exposure apparatus EX comprises a beam scanning section that scans the substrate P with a drawing beam LBn using a defecting member (PM and GM) that deflects the drawing beam LBn; a light detector (first light detecting section) DTn (DTRn) that photoelectrically detects the reflected light emitted when the drawing beam LBn is projected onto at least a portion of the first pattern PT1 formed in advance of a specified material on the substrate P; a measurement beam transmission system (PBS, M26, and the like) that guides the measurement MLn to the deflecting member (PM and GM) such that the substrate is scanned with the measurement light MLn whose waveform is different from that of the drawing beam LBn via the beam scanning section; a light detector (second light detecting section) DTnm (DTRn) that photoelectrically detects the reflected light emitted when the measurement light MLn is projected onto at least a portion of the first pattern PT1 on the substrate P; and a control apparatus 16 (control section) that controls the position of the new second pattern PT2 drawn on the substrate P by the drawing beam LBn, based on the signal output from at least one of the light detector DTn (DTRn) and the light detector DTnm (DTRn).

The control method for performing alignment using the feed forward control section FFC and the feedback control section FBC such as shown in FIG. 32 can be applied in a similar manner to a pattern drawing apparatus that uses information of the reflected light emitted from the substrate P as the result of the projection of the beam LBn for drawing, as shown in the first embodiment (FIG. 2 to FIG. 13) above. However, in such a case, as disclosed in Japanese Laid-Open Patent Publication No. 2009-093196, for example, the scanning unit Un is configured as a drawing unit using a multi-spot scanning method to simultaneously deflect a plurality of beams for drawing resulting from one polygon mirror and simultaneously scan in the main scanning direction with at least two spot lights at positions shifted from each other in the sub scanning direction on the substrate. Then, the information (photoelectric signal) of the reflected light obtained when drawing the pattern with the first spot light positioned on the upstream side in the movement direction (+X direction) of the substrate P can be used in the feed forward control section FFC in FIG. 32, and the information (photoelectric signal) of the reflected light obtained when drawing the pattern with the second spot light positioned on the downstream side of the first spot light in the sub scanning direction of the substrate P can be used in the feedback control section FBC in FIG. 32. In this way, in the present embodiment, by using the information of the reflected light emitted when the base pattern (or dummy pattern) of the substrate P is scanned by the spot light caused by the drawing beam LBn or the spot light caused by the measurement beam MLn in one or both of the feed forward control section FFC and the feedback control section FBC, it is possible to accurately control the alignment of the second pattern to be drawn overlapping on the substrate P, even when the substrate P has a large amount of deformation.

The invention claimed is:

1. A pattern drawing apparatus that draws a pattern on a substrate, by projecting a beam from a light source apparatus onto the substrate and scanning in a main scanning direction while performing intensity modulation of the beam according to pattern information, the pattern drawing apparatus comprising:
 a drawing unit including a beam scanning section that has a deflecting member configured to deflect the beam from the light source apparatus to scan with the beam in the main scanning direction, and a reflected light detecting section configured to photoelectrically detect, via the deflecting member of the beam scanning section, reflected light emitted when the beam is projected onto the substrate;
 a beam intensity modulating section configured to control an intensity modulation of the beam according to the pattern information, such that at least a portion of a second pattern to be newly drawn is drawn overlapping with at least a portion of a first pattern formed in advance of a specified material on the substrate; and
 a measuring section configured, while the second pattern is being drawn on the substrate, to measure a relative positional relationship between the first pattern and the second pattern, based on a detection signal output from the reflected light detecting section.

2. The pattern drawing apparatus according to claim 1, further comprising:
 an alignment system configured to detect a mark for alignment that is formed on the substrate and has a certain positional relationship with the first pattern formed on the substrate and, prior to drawing the second pattern due to the scanning with the beam, estimates a relative positional error between the first pattern and the second pattern that is to be drawn, based on a detected position of the mark.

3. The pattern drawing apparatus according to claim 2, wherein
 the beam intensity modulating section corrects a drawing position of the beam based on the pattern information of the second pattern, such that the relative positional error estimated by the alignment system is reduced, and
 the measuring section compares information relating to the measured position of the first pattern to a position of the second pattern being drawn whose drawing position has been corrected by the beam intensity modulating section, to obtain a relative remaining positional error between the first pattern and the second pattern.

4. The pattern drawing apparatus according to claim 1, further comprising:
 a correcting section that corrects a drawing state of the second pattern being drawn, based on the relative positional relationship measured by the measuring section.

5. The pattern drawing apparatus according to claim 4, wherein
 the correcting section performs at least one of a correction of the pattern information, a correction of drawing positioning of the beam by the beam intensity modulating section, a magnification correction of the second pattern, and a shape correction of the second pattern.

6. The pattern drawing apparatus according to claim 1, wherein
 the deflecting member is a rotating multi-surfaced mirror or a rocking reflective mirror to which the beam that has been intensity-modulated by the beam intensity modulating section is incident, and
 the beam scanning section includes a scanning lens system that has the beam deflected by the rotating multi-surfaced mirror or the rocking reflective mirror incident thereto, and projects the beam in a telecentric state onto the substrate.

7. The pattern drawing apparatus according to claim 1, wherein
 the first pattern includes a dummy pattern provided in a manner to overlap with at least a portion of the second pattern.

8. The pattern drawing apparatus according to claim 1, wherein
 the pattern information for drawing the second pattern includes information of a dummy pattern to be drawn overlapping with at least a portion of the first pattern.

9. The pattern drawing apparatus according to claim 1, wherein
 the first pattern includes a main pattern for forming an electronic device and a dummy pattern, and
 the pattern information for drawing the second pattern includes information of a dummy pattern to be drawn overlapping with at least a portion of the dummy pattern of the first pattern.

10. A pattern drawing method for drawing a pattern on a substrate, by projecting a beam from a light source apparatus onto the substrate and scanning in a main scanning direction while performing intensity modulation of the beam according to pattern information, the pattern drawing method comprising:
 deflecting the beam from the light source apparatus to scan with the beam in the main scanning direction;
 projecting the deflected beam onto the substrate in a telecentric state;
 intensity-modulating the beam according to the pattern information, such that at least a portion of a second pattern to be newly drawn is drawn overlapping with at least a portion of a first pattern formed in advance of a specified material on the substrate;
 photoelectrically detecting reflected light of the beam projected onto the substrate; and
 while the second pattern is being drawn on the substrate, measuring a relative positional relationship between the first pattern and the second pattern, based on a photoelectrically detected detection signal.

11. The pattern drawing method according to claim 10, further comprising:
 correcting at least one of a drawing position and a drawing magnification of the second pattern that is to be drawn following the measurement, based on the measured relative positional relationship.

12. The pattern drawing method according to claim 10, wherein the first pattern includes a dummy pattern provided in a manner to overlap with at least a portion of the second pattern.

13. The pattern drawing method according to claim 10, wherein the pattern information for drawing the second pattern includes information of a dummy pattern to be drawn overlapping with at least a portion of the first pattern.

14. A device manufacturing method for manufacturing an electronic device by drawing a pattern on a substrate, by projecting a beam from a light source apparatus onto the substrate and scanning in a main scanning direction while performing intensity modulation of the beam according to pattern information, the device manufacturing method comprising:

deflecting the beam from the light source apparatus to scan with the beam in the main scanning direction;

projecting the deflected beam onto the substrate in a telecentric state;

intensity-modulating the beam according to the pattern information, such that at least a portion of a second pattern to be newly drawn is drawn overlapping with at least a portion of a first pattern formed in advance of a specified material on the substrate; and while the second pattern is being drawn on the substrate, measuring at least one of position information of the first pattern, shape information, and information of a relative positional relationship between the first pattern and the second pattern, based on a detection signal obtained by photoelectrically detecting reflected light of the beam projected onto the substrate.

15. The device manufacturing method according to claim 14, comprising:

correcting at least one of the drawing position and a drawing magnification of the second pattern that is to be drawn following the measurement, based on at least one of the measured position information, shape information, and relative positional relationship information.

16. A pattern drawing apparatus that draws a pattern on a substrate, by projecting a beam from a first light source apparatus onto the substrate and performing relative scanning while performing intensity modulation of the beam according to pattern information, the pattern drawing apparatus comprising:

a second light source apparatus configured to emit measurement light having a wavelength differing from that of the beam from the first light source apparatus;

a drawing unit including a beam scanning section that has a deflecting member configured to deflect the beam and the measurement light to scan the substrate with the beam and the measurement light, and a reflected light detecting section configured to photoelectrically detect, via the deflecting member of the beam scanning section, reflected light emitted when the measurement light is projected onto the substrate; and a measuring section configured to measure information relating to at least one of a position and a shape on the substrate of a first pattern formed in advance of a specified material on the substrate, based on a detection signal output from the reflected light detecting section.

17. The pattern drawing apparatus according to claim 16, further comprising:

an alignment system configured to detect a mark for alignment that is formed on the substrate and has a certain positional relationship with the first pattern formed on the substrate and, prior to the drawing of a second pattern due to the scanning with the beam, estimates a relative positional error between the first pattern and the second pattern to be newly drawn, based on a detected position of the mark.

18. The pattern drawing apparatus according to claim 17, further comprising:

a beam intensity modulating section configured, while scanning with the beam is being performed by the beam scanning section, to control the intensity modulation of the beam according to the pattern information of the second pattern, such that the second pattern is drawn on the substrate on which the first pattern has been formed, wherein the beam intensity modulating section corrects a drawing position of the beam based on the pattern information of the second pattern, such that the relative positional error estimated by the alignment system is reduced, and the measuring section compares information relating to the measured position of the first pattern to a position of the second pattern being drawn whose drawing position has been corrected by the beam intensity modulating section, to obtain a relative remaining positional error between the first pattern and the second pattern.

19. The pattern drawing apparatus according to claim 16, further comprising:

a beam intensity modulating section that, while scanning with the beam is being performed by the beam scanning section, controls the intensity modulation of the beam according to the pattern information of the second pattern, such that the second pattern to be newly drawn is drawn on the substrate on which the first pattern has been formed; and a correcting section that corrects a drawing state of the second pattern to be drawn, based on measurement results of the measuring section.

20. The pattern drawing apparatus according to claim 16, wherein the beam scanning section alternatively performs scanning with the beam and scanning with the measurement light.

21. The pattern drawing apparatus according to claim 16, comprising:

a substrate transporting mechanism that transports the substrate, which has a long dimension in a direction intersecting a main scanning direction, at a predetermined speed in a sub scanning direction along the long dimension direction, wherein the beam scanning section performs scanning of the substrate with the beam and the measurement light, simultaneously or with a certain time difference therebetween, while projecting the beam and the measurement light in a manner to be shifted from each other by a predetermined interval on the substrate in the sub scanning direction.

22. The pattern drawing apparatus according to claim 16, wherein the deflecting member is a multi-surfaced mirror or a rocking reflective minor, and the beam scanning section includes a scanning lens system that has the beam and the measurement light deflected by the rotating multi-surfaced mirror or the rocking reflective minor incident thereto, and projects the beam in a telecentric state onto the substrate.

23. The pattern drawing apparatus according to claim 16, wherein in order to draw the pattern on a photosensitive layer formed on a surface of the substrate, the beam from the first light source apparatus is set to have a wavelength to which the photosensitive layer has a predetermined sensitivity and the measurement light from the second light source is set to a wavelength to which the photosensitive layer has no photosensitivity or low sensitivity.

24. A pattern drawing method for drawing a pattern on a substrate, by projecting a beam from a first light source apparatus onto the substrate and performing relative scanning while performing intensity modulation of the beam according to pattern information, the pattern drawing method comprising:

deflecting the beam and measurement light having a wavelength differing from that of the beam, to relatively scan the substrate with the beam and the measurement light;

projecting the deflected beam and measurement light onto the substrate in a telecentric state;

photoelectrically detecting reflected light of the measurement light projected onto the substrate; and measuring at least one of a position and a shape on the substrate of a first pattern formed in advance of a specified material on the substrate, based on a photoelectrically detected detection signal.

25. The pattern drawing method according to claim 24, comprising:

while scanning with the beam is being performed, intensity-modulating the beam according to pattern information of a second pattern, such that the second pattern to be newly drawn is drawn on the substrate on which the first pattern has been formed; and correcting a drawing state of the second pattern to be drawn, based on measurement results of at least one of a position and a shape on the substrate of the first pattern.

26. The pattern drawing method according to claim 24, wherein with a direction in which the substrate is transported being a sub scanning direction and a direction intersecting the sub scanning direction being a main scanning direction, the relative scanning with the beam and the measurement light includes deflecting the beam and the measurement light in the main scanning direction while transporting the substrate having a sheet shape in the sub scanning direction, and a position in the sub scanning direction where the beam is deflected in the main scanning direction and a position in the sub scanning direction where the measurement light is deflected in the main scanning direction are arranged distanced from each other by a predetermined interval in the sub scanning direction.

27. The pattern drawing method according to claim 24, wherein a photosensitive layer is formed on the substrate, and the beam is set to have a wavelength to which the photosensitive layer has a predetermined sensitivity and the measurement light is set to a wavelength to which the photosensitive layer has no photosensitivity or low sensitivity.

28. A pattern drawing apparatus that draws a new pattern on a substrate by projecting onto the substrate a drawing beam intensity-modulated according to pattern information, the pattern drawing apparatus comprising:

a beam scanning section that scans the substrate with the drawing beam, using a deflecting member that deflects the drawing beam;

a first light detecting section that photoelectrically detects reflected light emitted when the drawing beam is projected in at least a portion of the first pattern formed in advance of a specified material on the substrate;

a measurement beam transmission system that guides a measurement beam having a wavelength differing from that of the drawing beam to the deflecting section, such that the substrate is scanned with the measurement beam via the beam scanning section;

a second light detecting section that photoelectrically detects reflected light emitted when the measurement beam is projected in at least a portion of the first pattern on the substrate; and a control section that controls a position of the new pattern to be drawn on the substrate by the drawing beam, based on a signal output from at least one of the first light detecting section and the second light detecting section.

\* \* \* \* \*